United States Patent
Hu et al.

(10) Patent No.: US 8,573,469 B2
(45) Date of Patent: Nov. 5, 2013

(54) METHOD OF FORMING A MICRO LED STRUCTURE AND ARRAY OF MICRO LED STRUCTURES WITH AN ELECTRICALLY INSULATING LAYER

(75) Inventors: Hsin-Hua Hu, Los Altos, CA (US); Andreas Bibl, Los Altos, CA (US); John A. Higginson, Santa Clara, CA (US); Hung-Fai Stephen Law, Los Altos, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 0 days.

(21) Appl. No.: 13/436,260

(22) Filed: Mar. 30, 2012

(65) Prior Publication Data
US 2013/0126081 A1 May 23, 2013

Related U.S. Application Data

(63) Continuation-in-part of application No. 13/372,422, filed on Feb. 13, 2012, now Pat. No. 8,349,116.

(60) Provisional application No. 61/561,706, filed on Nov. 18, 2011, provisional application No. 61/594,919, filed on Feb. 3, 2012, provisional application No. 61/597,109, filed on Feb. 9, 2012, provisional application No. 61/597,658, filed on Feb. 10, 2012.

(51) Int. Cl.
*B23K 31/00* (2006.01)
*B23K 101/40* (2006.01)
*H01L 33/46* (2010.01)

(52) U.S. Cl.
USPC .......... 228/179.1; 228/225; 228/254; 438/25; 438/28; 438/455; 438/458; 438/464; 257/79; 257/88; 257/99

(58) Field of Classification Search
USPC .......... 228/254, 179.1, 225; 438/15, 25, 455, 438/464, 28, 458; 257/79, 88, 99
See application file for complete search history.

(56) References Cited

U.S. PATENT DOCUMENTS

| 3,717,743 A | 2/1973 | Costello |
| 3,935,986 A | 2/1976 | Lattari et al. |

(Continued)

FOREIGN PATENT DOCUMENTS

| JP | 07-060675 A | 3/1995 |
| JP | 3406207 | 5/1999 |

(Continued)

OTHER PUBLICATIONS

LuxVue Technology Corporation Office Action for U.S. Appl. No. 13/372,310 mailed May 1, 2012.

(Continued)

*Primary Examiner* — Devang R Patel
(74) *Attorney, Agent, or Firm* — Blakely Sokoloff Taylor & Zafman LLP

(57) ABSTRACT

A method of fabricating and transferring a micro device and an array of micro devices to a receiving substrate are described. In an embodiment, an electrically insulating layer is utilized as an etch stop layer during etching of a p-n diode layer to form a plurality of micro p-n diodes. In an embodiment, an electrically conductive intermediate bonding layer is utilized during the formation and transfer of the micro devices to the receiving substrate.

30 Claims, 52 Drawing Sheets

(56) References Cited

U.S. PATENT DOCUMENTS

| | | |
|---|---|---|
| 5,131,582 A | 7/1992 | Kaplan et al. |
| 5,378,926 A | 1/1995 | Chi et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rosoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,319,778 B1 | 11/2001 | Chen et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,586,875 B1 | 7/2003 | Chen et al. |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,762,069 B2 | 7/2004 | Huang et al. |
| 6,786,390 B2 * | 9/2004 | Yang et al. ............... 228/179.1 |
| 6,878,607 B2 | 4/2005 | Inoue et al. |
| 6,918,530 B2 | 7/2005 | Shinkai et al. |
| 7,015,513 B2 | 3/2006 | Hsieh |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,560,738 B2 | 7/2009 | Liu |
| 7,585,703 B2 | 9/2009 | Matsumura et al. |
| 7,628,309 B1 | 12/2009 | Erikssen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 * | 4/2011 | Lee et al. ............... 257/99 |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 * | 7/2007 | Tran et al. ............... 438/22 |
| 2007/0194330 A1 | 8/2007 | Ibbetson et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2008/0315236 A1 | 12/2008 | Lu et al. |
| 2009/0068774 A1 * | 3/2009 | Slater et al. ............... 438/26 |
| 2009/0072382 A1 | 3/2009 | Guzek |
| 2009/0146303 A1 | 6/2009 | Kwon |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0171094 A1 | 7/2010 | Lu et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 * | 8/2010 | Hodota ............... 438/29 |
| 2010/0213471 A1 | 8/2010 | Fukasawa et al. |
| 2010/0214777 A1 | 8/2010 | Suehiro et al. |
| 2010/0244077 A1 | 9/2010 | Yao |
| 2010/0248484 A1 | 9/2010 | Bower et al. |
| 2010/0276726 A1 | 11/2010 | Cho et al. |
| 2011/0003410 A1 * | 1/2011 | Tsay et al. ............... 438/27 |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0297914 A1 | 12/2011 | Zheng et al. |
| 2011/0312131 A1 | 12/2011 | Renavikar et al. |
| 2012/0064642 A1 * | 3/2012 | Huang et al. ............... 438/15 |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-186829 A | 8/2010 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

(56) References Cited

OTHER PUBLICATIONS

Harris, Jonathan H., "Sintered Aluminum Nitride Ceramics for High-Power Electronic Applications" Journal of the Minerals, Metals and Materials Society, vol. 50, No. 6, Jun. 1998, p. 56.
Horwitz, Chris M., "Electrostatic Chucks: Frequently Asked Questions" Electrogrip, 2006, 10 pgs, accessed at www.electrogrip.com.
Hossick-Schott, Joachim, "Prospects for the ultimate energy density of oxide-based capacitor anodes" Medtronic Energy and Components Center, 10 pgs.
Lee, San Youl, et al., "Wafer-level fabrication of GAN-based vertical light-emitting diodes using a multi-functional bonding material system" Semicond. Sci. Technol. 24, 2009, 4 pgs.
"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low_Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
LuxVue Technology Corporation Office Action for U.S. Appl. No. 13/372,422 mailed Jun. 5, 2012.
LuxVue Technology Corporation Office Action for U.S. Appl. No. 13/372,245 mailed May 9, 2012.
LuxVue Technology Corporation Notice of Allowance for U.S. Appl. No. 13/372,310 mailed Aug. 19, 2012.
LuxVue Technology Corporation Notice of Allowance for U.S. Appl. No. 13/372,245 mailed Aug. 31, 2012.
LuxVue Technology Corporation Notice of Allowance for U.S. Appl. No. 13/372,422 mailed Sep. 21, 2012.
Overstolz, et al., "A Clean Wafer-Scale Chip-Release Process without Dicing Based on Vapor Phase Etching," Presented at the 17th IEEE International Conference on Micro Electro Mechanical Systems, Jan. 25-29, 2004, Maaastricht, The Netherlands. Published in the Technical Digest, ISBN 0-7803-8265-X, pp. 717-720, 4 pgs.
Hossick-Schott, Joachim, "Prospects for the ultimate energy density of oxide-based capacitor anodes" Proceedings of CARTS Europe, Barcelona, Spain, 2007, 10 pgs.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.
Bower, C.A., et al., "Active-Matrix OLED Display Backplanes Using Transfer-Printed Microscale Integrated Circuits", IEEE, 2010 Electronic Components and Technology Conference, pp. 1339-1343.
Han, Min-Koo, "AM backplane for AMOLED" Proc. of ASID '06, Oct. 8-12, New Delhi, pp. 53-58, (ASID'06—year 2006).
PCT International Search Report and Written Opinion for International Application No. PCT/US2012/064215, mailed Mar. 29, 2013, 11 pages.
LuxVue Technology Corporation Notice of Allowance for U.S. Appl. No. 13/372,245 mailed Mar. 11, 2013.
LuxVue Technology Corporation Office Action for U.S. Appl. No. 13/708,695 mailed Feb. 13, 2013.
LuxVue Technology Corporation Office Action for U.S. Appl. No. 13/708,704 mailed Feb. 13, 2013.
Han, Min-Koo, "AM backplane for AMOLED" Proc. Of ASID '06, Oct. 8-12, New Delhi, pp. 53-58.
LuxVue Technology Corporation Office Action for U.S. Appl. No. 13/708,704 mailed Jul. 17, 2013.
LuxVue Technology Corporation Notice of Allowance for U.S. Appl. No. 13/436,314 mailed Jul. 17, 2013.
LuxVue Technology Corporation Office Action for U.S. Appl. No. 13/708,695 mailed Jul. 3, 2013.
LuxVue Technology Corporation Office Action for U.S. Appl. No. 13/372,222 mailed Jun. 27, 2013.

* cited by examiner

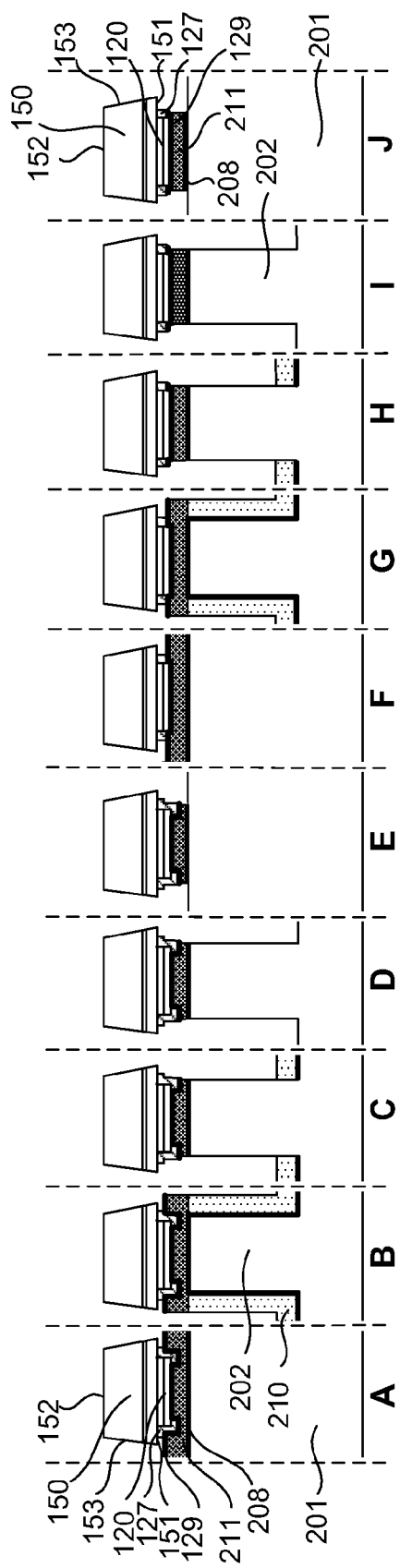
FIG. 8"

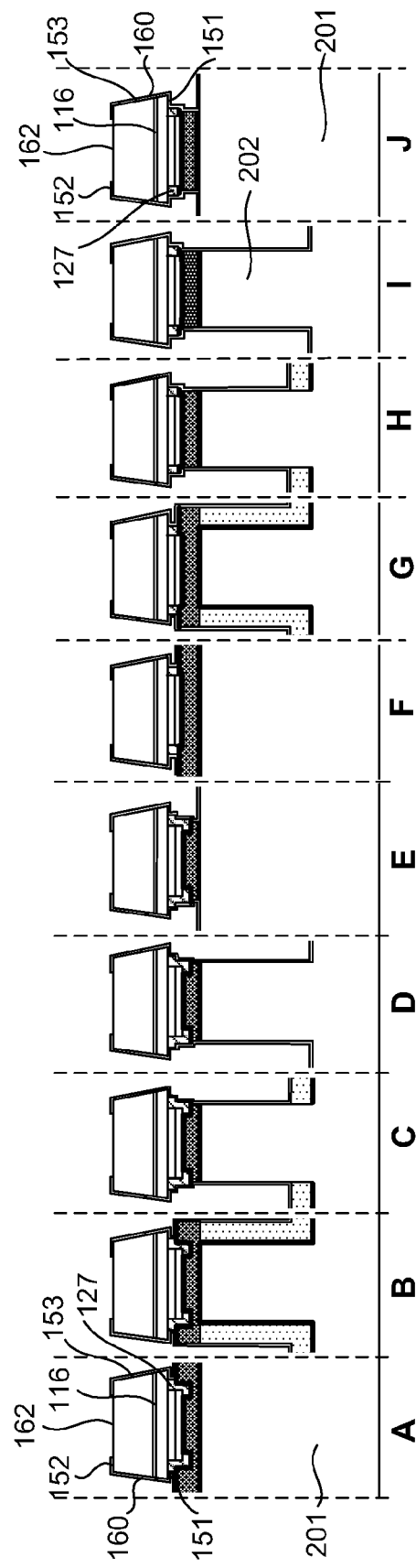

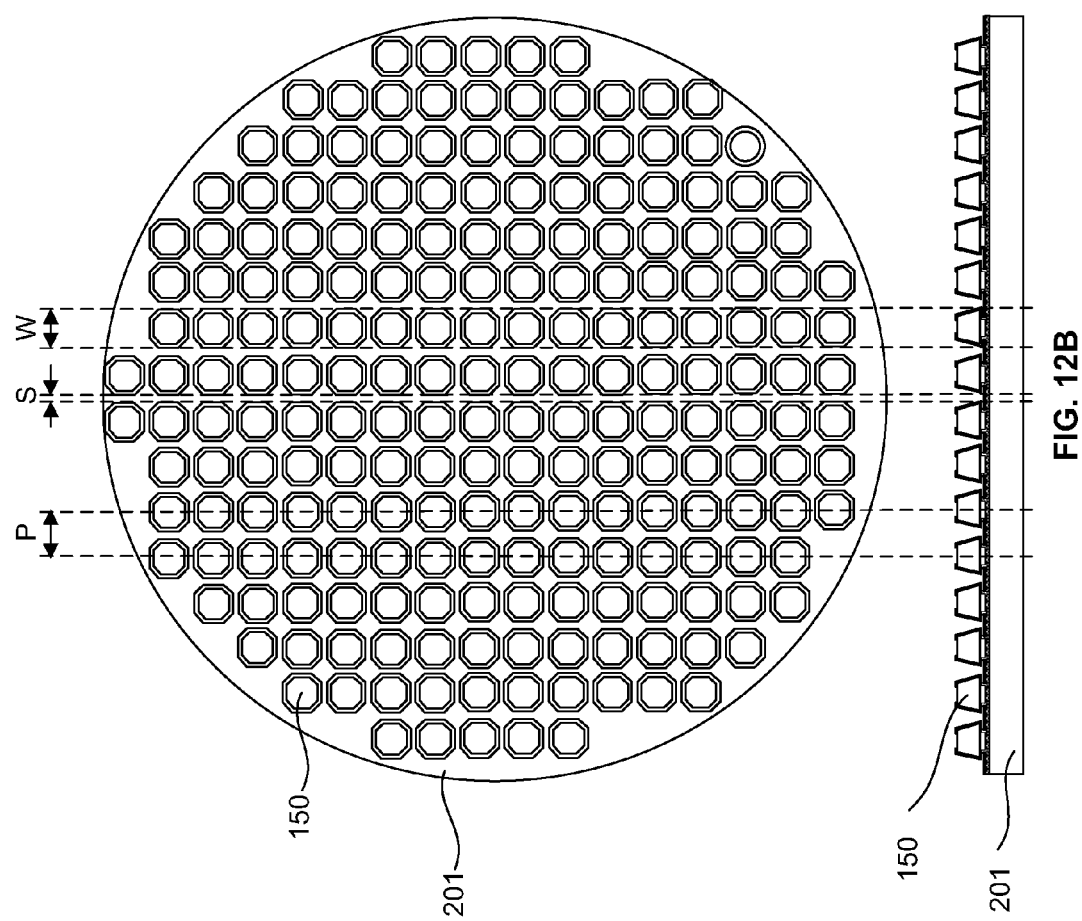

Position a transfer head over a carrier substrate having an array of micro LED structures disposed thereon, each micro LED structure including a micro p-n diode, a reflective metallization stack below a bottom surface of the micro p-n diode, and an electrically insulating spacer spanning a portion of sidewalls of the reflective metallization stack and laterally surrounding the reflective metallization stack, with the reflective metallization stack between the micro p-n diode and a bonding layer on the carrier substrate.
1300

Perform an operation to create a phase change in the bonding layer for at least one of the micro LED structures
1310

Pick up the micro p-n diode, reflective metallization stack and electrically insulating spacer for at least one of the micro LED structure with a transfer head
1320

Place the micro p-n diode, reflective metallization stack, and electrically insulating spacer for the at least one micro LED structure on a receiving substrate
1330

FIG. 13

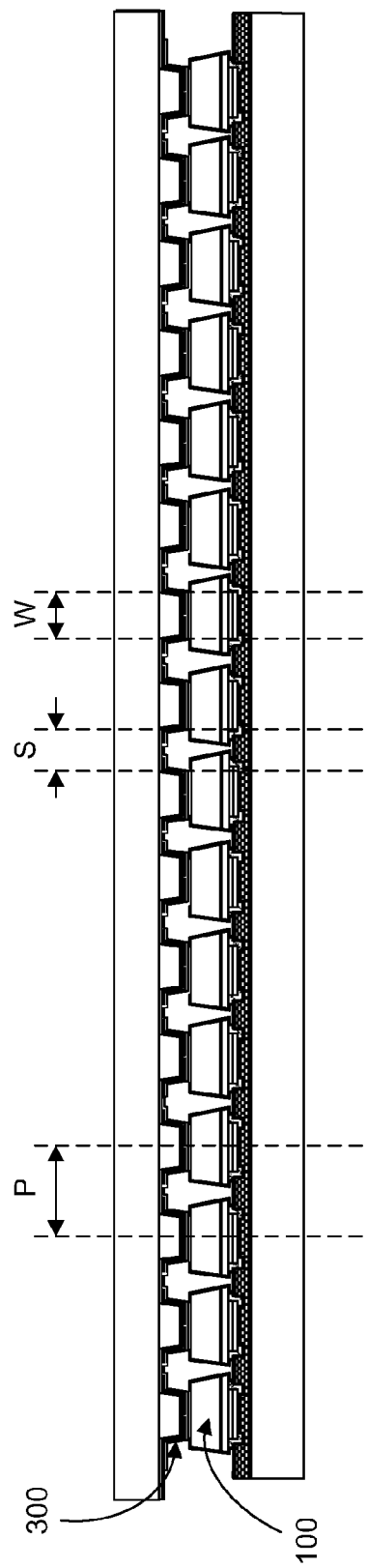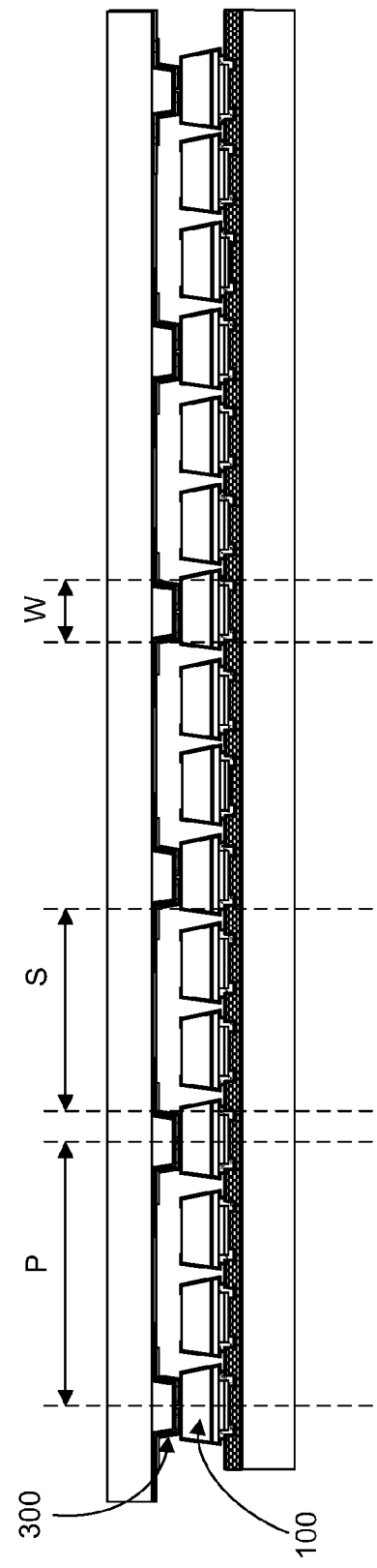

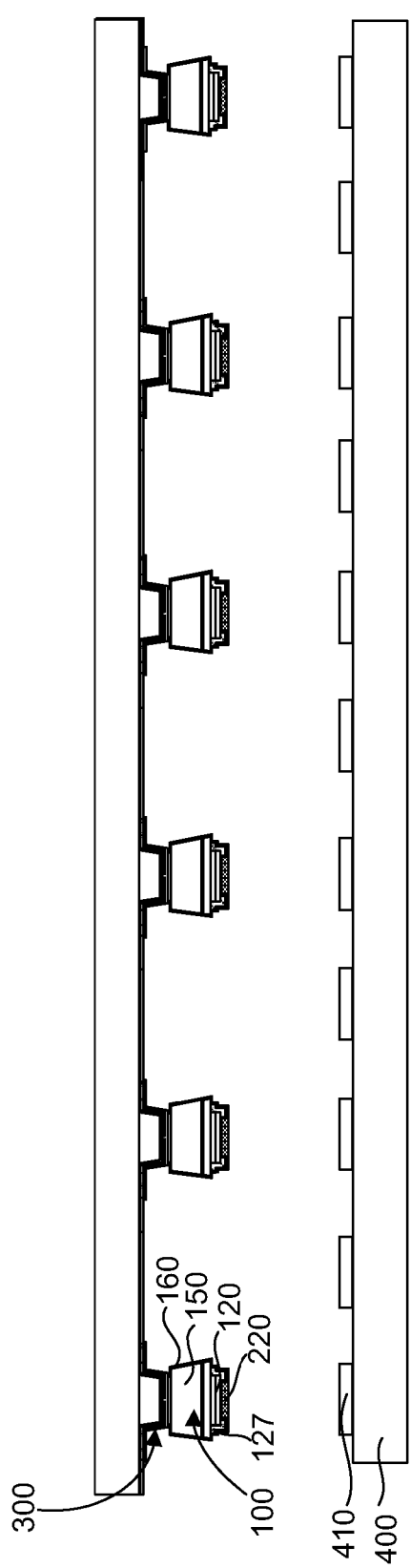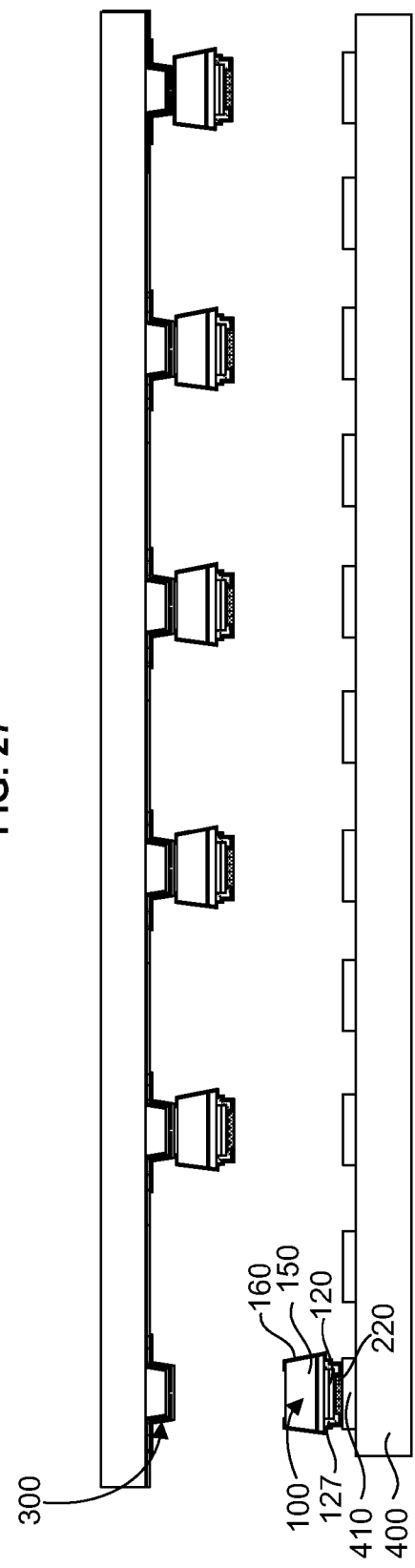

METHOD OF FORMING A MICRO LED STRUCTURE AND ARRAY OF MICRO LED STRUCTURES WITH AN ELECTRICALLY INSULATING LAYER

RELATED APPLICATIONS

This application is a continuation-in-part of U.S. patent application Ser. No. 13/372,422 filed on Feb. 13, 2012, now U.S. Pat. No. 8,349,116 which claims the benefit of priority from U.S. Provisional Patent Application Ser. No. 61/561,706 filed on Nov. 18, 2011, U.S. Provisional Patent Application Ser. No. 61/594,919 filed on Feb. 3, 2012, U.S. Provisional Patent Application Ser. No. 61/597,109 filed on Feb. 9, 2012, and U.S. Provisional Patent Application Ser. No. 61/597,658 filed on Feb. 10, 2012, the full disclosures of which are incorporated herein by reference.

BACKGROUND

1. Field

The present invention relates to micro semiconductor devices. More particularly embodiments of the present invention relate to a method of forming an array of micro devices such as light emitting diodes (LEDs) and transferring to a different substrate.

2. Background Information

Light emitting diodes (LEDs) based upon gallium nitride (GaN) are expected to be used in future high-efficiency lighting applications, replacing incandescent and fluorescent lighting lamps. Current GaN-based LED devices are prepared by heteroepitaxial growth techniques on foreign substrate materials. A typical wafer level LED device structure may include a lower n-doped GaN layer formed over a sapphire growth substrate, a single quantum well (SQW) or multiple quantum well (MWQ), and an upper p-doped GaN layer.

In one implementation, the wafer level LED device structure is patterned into an array of mesas on the sapphire growth substrate by etching through the upper p-doped GaN layer, quantum well layer, and into the n-doped GaN layer. An upper p-electrode is formed on the top p-doped GaN surfaces of the array of mesas, and an n-electrode is formed on a portion of the n-doped GaN layer which is in contact with the array of mesas. The mesa LED devices remain on the sapphire growth substrate in the final product.

In another implementation, the wafer level LED device structure is transferred from the growth substrate to an acceptor substrate such as silicon, which has the advantage of being more easily diced to form individual chips than a GaN/sapphire composite structure. In this implementation, the wafer level LED device structure is permanently bonded to the acceptor (silicon) substrate with a permanent bonding layer. For example, the p-electrode formed on the p-doped GaN surfaces of the array of mesas can be bonded to the acceptor (silicon) substrate with a permanent bonding layer. The sapphire growth substrate is then removed to expose the inverted wafer level LED device structure, which is then thinned to expose the array of mesas. N-contacts are then made with the exposed n-doped GaN, and p-contacts are made on the silicon surface which is in electrical contact with the p-electrode. The mesa LED devices remain on the acceptor substrate in the final product. The GaN/silicon composite can also be diced to form individual chips.

SUMMARY OF THE INVENTION

A micro light emitting diode (LED) and a method of forming an array of micro LEDs for transfer to a receiving substrate are described. For example, the receiving substrate may be, but is not limited to, a display substrate, a lighting substrate, a substrate with functional devices such as transistors or integrated circuits (ICs), or a substrate with metal redistribution lines. In an embodiment, a micro LED structure includes a micro p-n diode, a reflective metallization stack below a bottom surface of the micro p-n diode, and an electrically insulating spacer spanning a portion of sidewalls of the reflective metallization stack and laterally surrounding the reflective metallization stack, where the reflective metallization stack is between the micro p-n diode and a bonding layer formed on a substrate. In an embodiment, the bonding layer has a liquidus temperature of approximately 350° C. or lower, and more specifically approximately 200° C. or lower. In an embodiment, the bonding layer is an alloy bonding layer. For example, the bonding layer may be an indium-silver (InAg) alloy. Depending upon the manner of formation, the bonding layer can have a uniform concentration, or a gradient concentration.

The electrically insulating spacer may span a portion of a bottom surface of the metallization stack. The electrically insulating spacer may span a portion of the bottom surface of the micro p-n diode. A conformal dielectric barrier layer may span sidewalls of the micro p-n diode and partially span the bottom surface of the micro p-n diode.

In an embodiment, a method of forming a micro LED array includes bonding a first substrate stack to a bonding layer on a second substrate stack. The first substrate stack may include a p-n diode layer formed on a growth substrate, a plurality of separate reflective metallization stacks on the p-n diode layer, and a patterned electrically insulating layer laterally between the plurality of separate reflective metallization stacks on the p-n diode layer. In an embodiment, the plurality of separate reflective metallization stacks on the p-n diode layer can be patterned followed by depositing the electrically insulating layer prior to bonding the first substrate stack to the bonding layer on the second substrate stack. The electrically insulating layer can also be patterned to form a plurality of openings exposing the plurality of separate reflective metallization stacks, followed by depositing a first electrically conductive bonding layer over the patterned electrically insulating layer and the plurality of separate reflective metallization stacks.

The first substrate stack may include a first electrically conductive bonding layer over the patterned electrically insulating layer and the plurality of separate reflective metallization stacks. Bonding of the first substrate stack to the second substrate stack may include bonding the first electrically conductive bonding layer to the second electrically conductive bonding layer. In an embodiment, the first electrically conductive bonding layer and the second electrically conductive bonding layer are formed of the same material, and are fusion bonded together. For example, the material of the two bonding layers may have a liquidus temperature of approximately 350° C. or lower, or more specifically approximately 200° C. or lower. In an embodiment, the first and second electrically conductive bonding layers are formed of indium.

In an embodiment, bonding the first electrically conductive bonding layer and the second electrically conductive bonding layer forms an alloy bonding layer. The two bonding layers which form the alloy bonding layer may form an alloy with a liquidus temperature of approximately 350° C. or lower, or more specifically approximately 200° C. or lower. As an example, the first electrically conductive bonding layer may include silver, and the second electrically conductive bonding layer may include indium. Alternatively, the first electrically conductive bonding layer may include indium, and the second electrically conductive bonding layer may include silver.

The relative thicknesses of the bonding layers can be controlled to keep the liquidus temperature of the alloy bonding layer within a useable range. In an embodiment, one of the first and second electrically conductive bonding layers has a thickness which is 5% or less a thickness of the other one of the first and second electrically conductive bonding layers. Bonding of the two bonding layers together may result in one or both of the electrically conductive bonding layers being completely consumed in the resultant alloy bonding layer at locations where the electrically conductive bonding layers make contact with one another.

The first substrate is then removed, and the p-n diode is then etched through to form a plurality of micro p-n diodes over the plurality of separate reflective metallization stacks to expose the patterned electrically insulating layer laterally between the plurality of micro p-n diodes. In an embodiment, etching through the p-n diode layer to from the plurality of micro p-n diodes is performed utilizing a plasma etching technique. The plurality of micro p-n diodes can include a top surface, a bottom surface, and tapered sidewalls, where the bottom surface is wider than the top surface. After formation of the plurality of micro p-n diodes, the patterned electrically insulating layer can be etched to expose a bottom surface of each of the plurality of micro p-n diodes. A conformal dielectric barrier layer can then be formed on side surfaces and a portion of the bottom surface of each of the plurality of micro p-n diodes. The conformal dielectric layer may cover side surfaces of the quantum well layer in each of the plurality of micro p-n diodes.

In an embodiment, a method of transferring one or more micro LEDs to a receiving substrate includes positioning a transfer head over a carrier substrate having an array of micro LED structures disposed thereon. Each micro LED structure includes a micro p-n diode, a reflective metallization stack below a bottom surface of the micro p-n diode, and an electrically insulating spacer spanning a portion of sidewalls of the reflective metallization stack and laterally surrounding the reflective metallization stack, with the reflective metallization stack being between the micro p-n diode and a bonding layer on the carrier substrate. An operation is performed to create a phase change in the bonding layer for at least one of the micro LED structures. For example, the operation may include heating the bonding layer above a liquidus temperature of the bonding layer, with the liquidus temperature being 350° C. or lower, or more specifically 200° C. or lower. The bonding layer may also be an alloy bonding layer, such as an Ag—In alloy bonding layer, or a fusion bonded bonding layer, such as an In—In bonding layer.

The micro p-n diode, reflective metallization stack, and electrically insulating spacer for at least one of the micro LED structures is picked up with a transfer head. In some embodiments, a substantial portion, such as approximately half a thickness of the bonding layer, is also picked up. In some embodiments a conformal dielectric barrier layer spanning sidewalls, and a bottom surface of the micro p-n diode is also picked up. The micro LED structure which has been picked up with the transfer head is then placed onto a receiving substrate. The transfer head may operate in accordance with a variety of principles, including the transfer head exerting a pick up pressure on the micro LED structure in accordance with electrostatic principles. Heat may also be applied to the bonding layer to create the phase change from a variety of sources, including local heat transfer, heat transfer through the carrier substrate, and heat transfer through the transfer head, and combinations thereof.

In an embodiment, a method of fabricating a micro device such as a micro LED device includes bonding a first substrate stack to a second substrate stack with an intermediate electrically conductive bonding layer having a liquidus temperature of 350° C. or lower, or more specifically 200° C. or lower. An active device layer such as a p-n diode layer, which may contain a quantum well layer, in the first substrate stack is then patterned to form a plurality of micro devices. A region of the intermediate electrically conductive bonding layer is then heated to its liquidus temperature or higher, and at least one of the plurality of micro devices is picked up, along with a portion of the intermediate electrically conductive bonding layer, with a transfer head. The micro device and the portion of the intermediate electrically conductive bonding layer are then placed onto an electrically conductive receiving bonding layer on a receiving substrate, and the intermediate electrically conductive bonding layer and the electrically conductive receiving bonding layer are bonded together to form a permanent alloy bonding layer having a liquidus temperature above 150° C., or more specifically above 200° C. or above 250° C. For example, the intermediate electrically conductive bonding layer can be a pure metal layer, alloy bonding layer, or fusion bonded layer.

BRIEF DESCRIPTION OF THE DRAWINGS

FIG. 8" is a cross-sectional side view illustration of etching a patterned electrically insulating layer to expose a bottom surface of each of a plurality of micro p-n diodes in accordance with an embodiment of the invention.

FIGS. 12A-12B include top and cross-sectional side view illustrations of a carrier wafer and array of micro LED structures including micro p-n diodes in accordance with an embodiment of the invention.

FIG. 13 is an illustration of a method of picking up and transferring a micro LED structure from a carrier substrate to a receiving substrate in accordance with an embodiment of the invention.

FIG. 23 is a cross-sectional side view illustration of an array of micro device transfer heads in contact with an array of micro LED devices in accordance with an embodiment of the invention.

FIG. 24 is a cross-sectional side view illustration of an array of micro device transfer heads in contact with an array of micro LED devices in accordance with an embodiment of the invention.

FIG. 27 is a cross-sectional side view illustration of an array of micro device transfer heads with an array of micro LED devices positioned over a receiving substrate in accordance with an embodiment of the invention.

FIG. 28 is a cross-sectional side view illustration of a micro device selectively released onto a receiving substrate in accordance with an embodiment of the invention.

DETAILED DESCRIPTION OF THE INVENTION

Figure 1A:
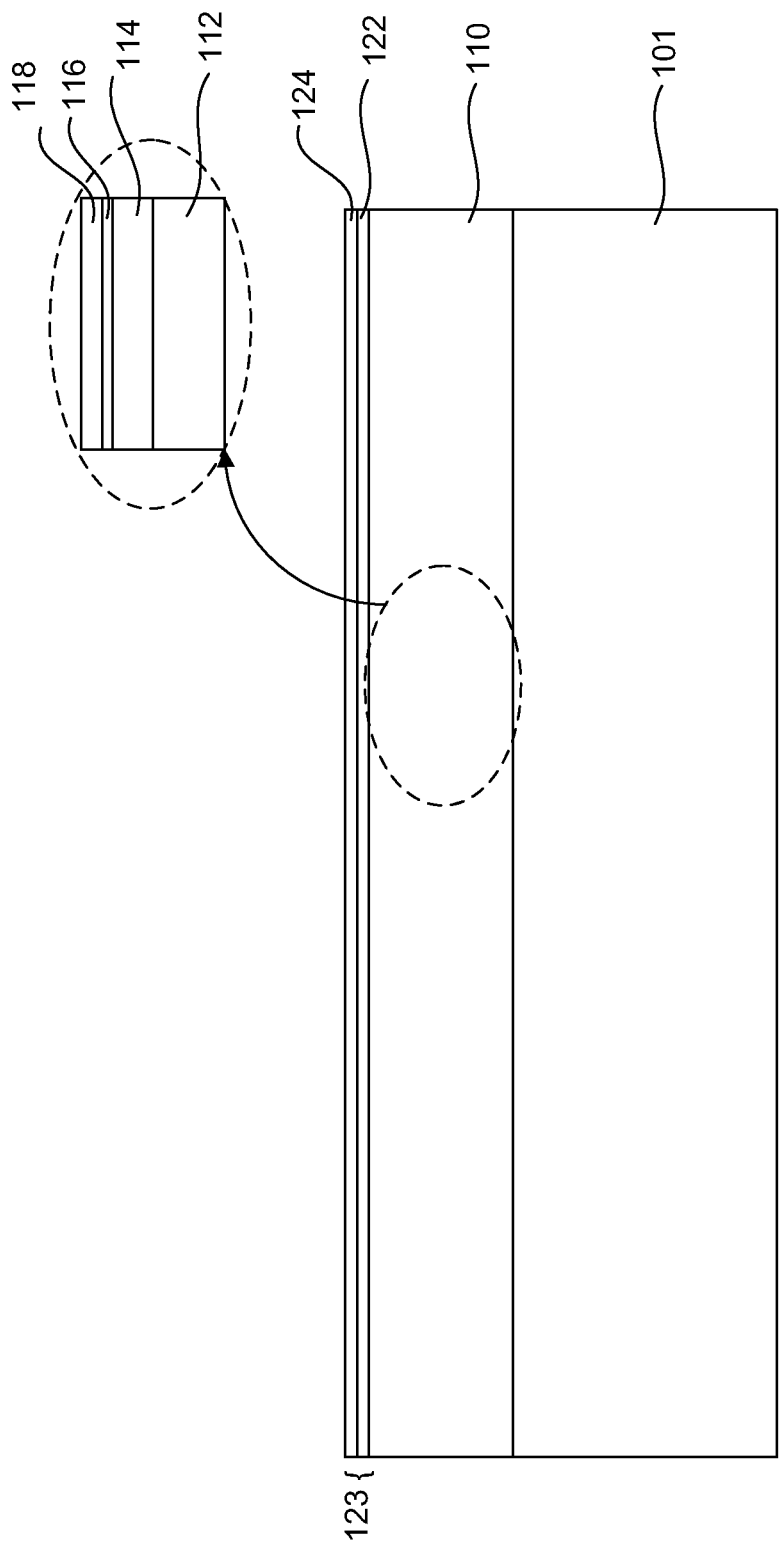
FIG. 1A is a cross-sectional side view illustration of a bulk LED substrate in accordance with an embodiment of the invention.

Embodiments of the present invention describe micro semiconductor devices and a method of forming an array of micro semiconductor devices such as micro light emitting diodes (LEDs) for transfer to a receiving substrate. For example, the receiving substrate may be, but is not limited to, a display substrate, a lighting substrate, a substrate with functional devices such as transistors or integrated circuits (ICs), or a substrate with metal redistribution lines. While embodiments of the present invention are described with specific regard to micro LEDs comprising p-n diodes, it is to be appreciated that embodiments of the invention are not so limited and that certain embodiments may also be applicable to other micro semiconductor devices which are designed in such a way so as to perform in a controlled fashion a predetermined electronic function (e.g. diode, transistor, integrated circuit) or photonic function (LED, laser).

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "spanning," "over," "to," "between" and "on" as used herein may refer to a relative position of one layer with respect to other layers. One layer "spanning," "over" or "on" another layer or bonded "to" another layer may be directly in contact with the other layer or may have one or more intervening layers. One layer "between" layers may be directly in contact with the layers or may have one or more intervening layers.

The terms "micro" device, "micro" p-n diode or "micro" LED structure as used herein may refer to the descriptive size of certain devices or structures in accordance with embodiments of the invention. As used herein, the terms "micro" devices or structures are meant to refer to the scale of 1 to 100 µm. However, it is to be appreciated that embodiments of the present invention are not necessarily so limited, and that certain aspects of the embodiments may be applicable to larger, and possibly smaller size scales.

In one aspect, embodiments of the invention describe a method of processing a bulk LED substrate into an array of micro LED structures which are poised for pick up and transfer to a receiving substrate. In this manner, it is possible to integrate and assemble micro LED structures into heterogeneously integrated systems. The micro LED structures can be picked up and transferred individually, in groups, or as the entire array. Thus, the micro LED structures in the array of micro LED structures are poised for pick up and transfer to a receiving substrate such as display substrate of any size ranging from micro displays to large area displays, and at high transfer rates. In some embodiments, arrays of micro LED structures which are poised for pick up are described as having a 10 µm by 10 µm pitch, or 5 µm by 5 µm pitch. At these densities a 6 inch substrate, for example, can accommodate approximately 165 million micro LED structures with a 10 µm by 10 µm pitch, or approximately 660 million micro LED structures with a 5 µm by 5 µm pitch. Thus, a high density of pre-fabricated micro device structures with a specific functionality may be produced in a manner in which they are poised for pick up and transfer to a receiving substrate. The techniques described herein are not limited to micro LED structures, and may also be used in the manufacture of other micro devices.

In another aspect, embodiments of the invention describe a micro LED structure and micro LED array in which each micro p-n diode is formed over a respective location of a bonding layer. The respective locations of the bonding layer may or may not be laterally separate locations. An operation may be performed on a respective location of the bonding layer corresponding to a micro LED during the micro LED pick up process in which the respective location of the bonding layer undergoes a phase change which assists in the pick up process. For example, the respective location of the bonding layer may change from solid to liquid in response to a temperature cycle. In the liquid state the respective location of the bonding layer may retain the micro p-n diode in place on a carrier substrate through surface tension forces, while also providing a medium from which the micro p-n diode is readily releasable. In addition, the liquid state may act as a cushion or shock absorber to absorb forces exerted by a transfer head if a transfer head makes contact with the micro LED structure during the pick up process. In this manner, the liquid state may compensate for non-uniformities in the topography in the micro LED array or transfer head array by smoothing out over the underlying surface in response to compressive forces exerted by a transfer head. In other embodiments, the respective location of the bonding layer may not undergo a complete phase transformation. For example, the respective location of the bonding layer may become substantially more malleable in response to a temperature cycle while partially remaining in the solid state. In another embodiment, the respective location of the bonding layer may undergo a crystal phase transformation in response to an operation, such as a temperature cycle.

In another aspect, embodiments of the invention describe a manner of forming a micro LED structure and array of micro LED structures in which an electrically insulating layer acts as an etch stop layer during etching of a p-n diode layer to form a plurality of micro p-n diodes. As a result, the electrically insulating layer can function to protect the sidewalls of the micro p-n diodes and a quantum well layer located within the micro p-n diodes from electrically conductive contamination which could degrade functionality of the micro LED devices. In an embodiment, the electrically insulating layer acts as a physical barrier to wicking of the bonding layer along the p-n diode layer during bonding of the growth substrate to the carrier substrate. In an embodiment, the electrically insulating layer acts as a physical barrier to the redistribution or re-sputtering of underlying electrically conductive layers such as an electrically conductive bonding layer during etching of the p-n diode layer to form the plurality of micro p-n diodes.

In accordance with embodiments of the invention, the electrically insulating layer is patterned after etching of the p-n diode layer to form electrically insulating spacers spanning a portion of the sidewalls of the reflective metallization stacks and laterally surrounding the reflective metallization stacks of the array of micro LED structures. The electrically insulating spacers can protect a layer within the reflective metallization stacks from oxidation. For example, a silver (Ag) layer can be utilized as a reflective mirror within the reflective metallization stacks. The electrically insulating spacers may span a portion of the sidewalls of the reflective metallization stacks which include the reflective mirror layer, and protect the reflective minor layers from oxidation which could potentially change color of the reflective mirror layers and affect the reflective properties of the reflective minor layers.

In another aspect, embodiments of the invention describe a manner of increasing adhesion between a growth substrate bonded to a carrier substrate with one or more interfacial bonding layers in which a bonding layer is formed on either or both of the growth substrate and carrier substrate prior to bonding the growth substrate and carrier substrate together. The bonding layer(s) can be formed of a variety of materials such as thermoplastic polymers, metals, and solders. Where a bonding layer is formed on each of the growth substrate and carrier substrate, the bonding layers can be formed of the same or different materials. In one embodiment, electrically conductive bonding layers of the same material are formed on the growth substrate and carrier substrate and fusion bonded together. For example, two indium (or alternatively indium alloy) bonding layers can be fusion bonded together. In another embodiment, an electrically conductive alloy bonding layer is formed by bonding a first electrically conductive bonding layer formed on the growth substrate to a second electrically conductive bonding layer formed on the carrier substrate, with the first and second bonding layers being formed of different materials. In accordance with embodiments of the invention, the resultant bonding layer, whether a single layer, fusion bonded layer, or alloy bonded layer has a melting or liquidus temperature of 350° C. or lower, or more particularly 200° C. or lower. In the liquid state, the bonding layer may retain the micro LED structure in place on a carrier substrate through surface tension forces, while also providing a medium from which the micro LED structure is readily releasable. Thus, the bonding layer, whether formed as a single layer on either of the growth substrate or carrier substrate, by fusion bonding, or alloy bonding may provide adhesion during formation of the micro LED structures, while retaining a sufficiently low liquidus or melting temperature to be employed as a temporary medium from which the micro LED structures can be removed.

Referring now to FIG. 1, a semiconductor device layer 110 may be formed on a substrate 101. In an embodiment, semiconductor device layer 110 may include one or more layers and is designed in such a way so as to perform in a controlled fashion a predetermined electronic function (e.g. diode, transistor, integrated circuit) or photonic function (LED, laser). It is to be appreciated that while semiconductor device layer 110 may be designed in such a way so as to perform in a controlled fashion in a predetermined function, that the semiconductor device layer 110 may not be fully functionalized. For example, contacts such as an anode or cathode may not yet be formed. In the interest of conciseness and to not obscure embodiments of the invention, the following description is made with regard to semiconductor device layer 110 as a p-n diode layer 110 grown on a growth substrate 101 in accordance with conventional heterogeneous growth conditions.

The p-n diode layer 110 may include a compound semiconductor having a bandgap corresponding to a specific region in the spectrum. For example, the p-n diode layer 110 may include one or more layers based on II-VI materials (e.g. ZnSe) or III-V materials including III-V nitride materials (e.g. GaN, AN, InN, InGaN, and their alloys) and III-V phosphide materials (e.g. GaP, AlGaInP, and their alloys). Growth substrate 101 may include any suitable substrate such as, but not limited to, silicon, SiC, GaAs, GaN and sapphire ($Al_2O_3$).

In a particular embodiment, growth substrate 101 is sapphire, and the p-n diode layer 110 is formed of GaN. Despite the fact that sapphire has a larger lattice constant and thermal expansion coefficient mismatch with respect to GaN, sapphire is reasonably low cost, widely available and its transparency is compatible with excimer laser-based lift-off (LLO) techniques. In another embodiment, another material such as SiC may be used as the growth substrate 101 for a GaN p-n diode layer 110. Like sapphire, SiC substrates may be transparent. Several growth techniques may be used for growth of p-n diode layer 110 such as metalorganic chemical vapor deposition (MOCVD). GaN, for example, can be grown by simultaneously introducing trimethylgallium (TMGa) and ammonia ($NH_3$) precursors into a reaction chamber with the sapphire growth substrate 101 being heated to an elevated temperature such as 800° C. to 1,000° C. In the particular embodiment illustrated in FIG. 1A, p-n diode layer 110 may include a bulk GaN layer 112, an n-doped layer 114, a quantum well 116 and p-doped layer 118. The bulk GaN layer 112 may be n-doped due to silicon or oxygen contamination, or intentionally doped with a donor such as silicon. N-doped GaN layer 114 may likewise be doped with a donor such as silicon, while p-doped layer 118 may be doped with an acceptor such as magnesium. A variety of alternative p-n diode configurations may be utilized to form p-n diode layer 110. Likewise, a variety of single quantum well (SQW) or multiple quantum well (MQW) configurations may be utilized to form quantum well 116. In addition, various buffer layers may be included as appropriate. In one embodiment, the sapphire growth substrate 101 has a thickness of approximately 200 µm, bulk GaN layer 112 has a thickness of approximately 0.5 µm-5 µm, n-doped layer 114 has a thickness of approximately 0.1 µm-3 µm, quantum well layer 116 has a thickness less than approximately 0.3 µm and p-doped layer 118 has a thickness of approximately 0.1 µm-1 µm.

A reflective metallization stack layer 123 may then be formed over the p-n diode layer 110. As illustrated in FIG. 1A, reflective metallization stack layer 123 may include an electrode layer 122 and optionally a barrier layer 124, though other layers may be included. Electrode layer 122 and barrier layer 124 may also include multiple layers. In an embodiment, reflective metallization stack layer has a thickness of approximately 0.1 µm-2 µm. Electrode layer 122 may make ohmic contact to the p-doped GaN layer 118, and may be formed of a high work-function metal such as Ni, Au, Ag, Pd and Pt. In an embodiment, electrode layer 122 may be reflective to light emission, and may function as a mirror reflecting light back toward the p-n diode layer 110. For example, an Ag or Ni layer may be included in the electrode layer 122 for its reflective properties. Electrode layers such as Ag may also be susceptible to oxidation. A barrier layer 124 may optionally be included in the reflective metallization stack layer 123 for a variety of reasons, including protecting the underlying electrode layer 122 from oxidation, and to prevent diffusion of impurities into the electrode layer 122 or p-n diode 110. For example, barrier layer 124 may include, but is not limited to, Pd, Pt, Ni, Ta, Ti and TiW. In certain embodiments, barrier layer 124 may prevent the diffusion of components from the bonding layer into the p-n diode layer 110. Barrier layer 124 may also prevent the diffusion of components, for example from bonding layers described below, into the electrode layer 122.

In accordance with certain embodiments of the invention, p-n diode layer 110 and reflective metallization stack layer 123 are grown on a growth substrate 101 and subsequently transferred to a carrier substrate 201, such as one illustrated in FIGS. 2A-2E and described in more detail in the following description. As described in more detail in the following figures and description, the reflective metallization stack layer 123 can be patterned prior to transfer to a carrier substrate 201. The carrier substrate 201 and bonding layer 210 may also be patterned prior to transfer of the p-n diode layer 110 and reflective metallization stack layer 123 to the carrier substrate 201. Accordingly, embodiments of the invention may be implemented in a multitude of variations during formation of an array of micro LEDs for subsequent transfer to a receiving substrate.

Figure 1B:
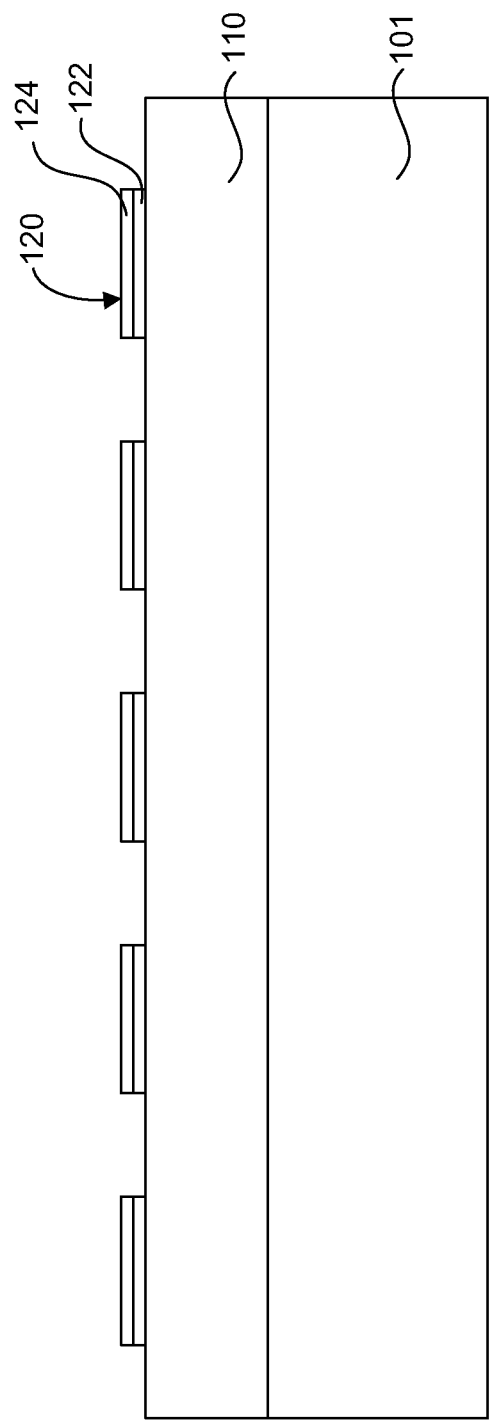
FIG. 1B is a cross-sectional side view illustration of a patterned reflective metallization stack layer in accordance with an embodiment of the invention.

Referring now to FIG. 1B reflective metallization stack layer 123 may be patterned prior to transfer to a carrier substrate 201. In an embodiment, the structure of FIG. 1B may be achieved by forming a patterned photoresist layer over the p-n diode layer 110 followed by deposition of the reflective metallization stack layer 123. The photoresist layer is then lifted off (along with the portion of the reflective metallization stack layer on the photoresist layer) leaving behind the laterally separate reflective metallization stacks 120 illustrated in FIG. 1B. In certain embodiments, the pitch of the laterally separate reflective metallization stacks 120 may be 5 µm, 10 µm, or larger corresponding to the pitch of the array of micro LEDs. For example, a 5 µm pitch may be formed of 3 µm wide laterally separate reflective metallization stack 120 separated by a 2 µm spacing. A 10 µm pitch may be formed of 8 µm wide separate reflective metallization stack 120 separated by a 2 µm spacing. Though, these dimensions are meant to be exemplary and embodiments of the invention are not so limited. In some embodiments, the width of the laterally separate reflective metallization stacks 120 is less than or equal to the width of the bottom surface of the array of micro p-n diodes 150 as discussed in further detail in the following description and figures.

Figure 1C:
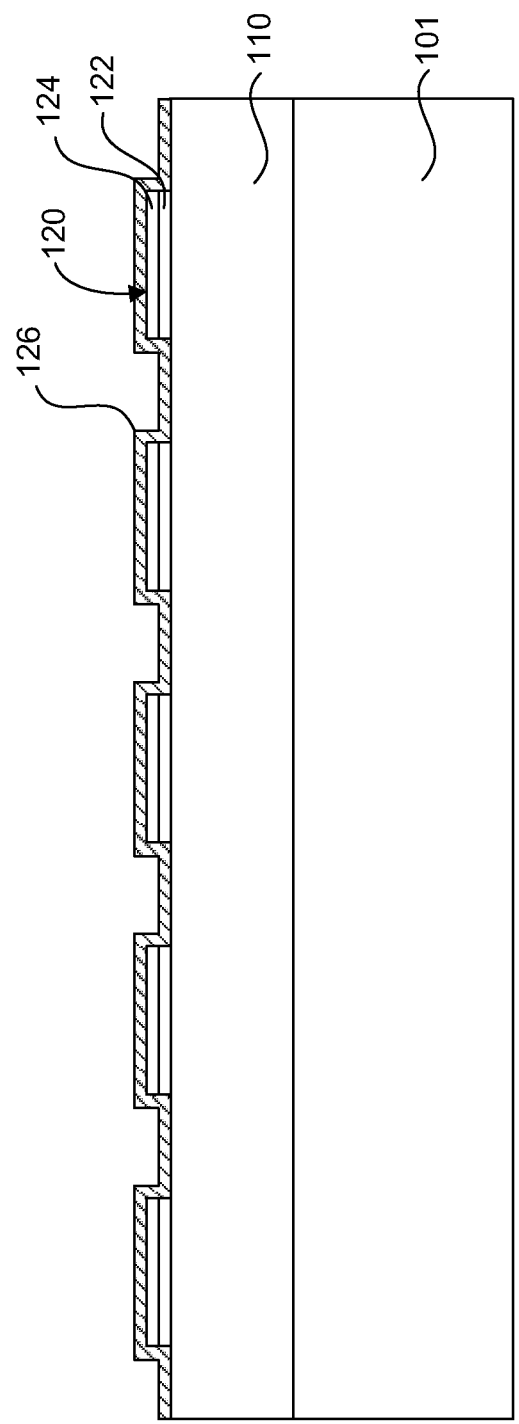
FIG. 1C is a cross-sectional side view illustration of an electrically insulating layer formed over and laterally between a plurality of separate reflective metallization stacks in accordance with an embodiment of the invention.

Referring now to FIG. 1C an electrically insulating layer 126 is deposited over and laterally between the plurality of separate reflective metallization stacks 120. In an embodiment, the electrically insulating layer 126 may be formed of a material such as silicon dioxide ($SiO_2$), aluminum oxide ($Al_2O_3$), silicon nitride, and polyimide with a thickness of 0.1 µm to 1.0 µm. The electrically insulating layer 126 may also be deposited at temperatures higher than the liquidus temperature of bonding layer or alloy bonding layer which is melted during the pickup operation. For example, electrically insulating layer 126 may be deposited at temperatures above 350° C. so that the electrically insulating layer 126 adheres to the p-n diode layer (e.g. GaN) and the barrier layer 124 (e.g. TiW) during melting of the bonding layer or alloy bonding layer.

Figure 1D:
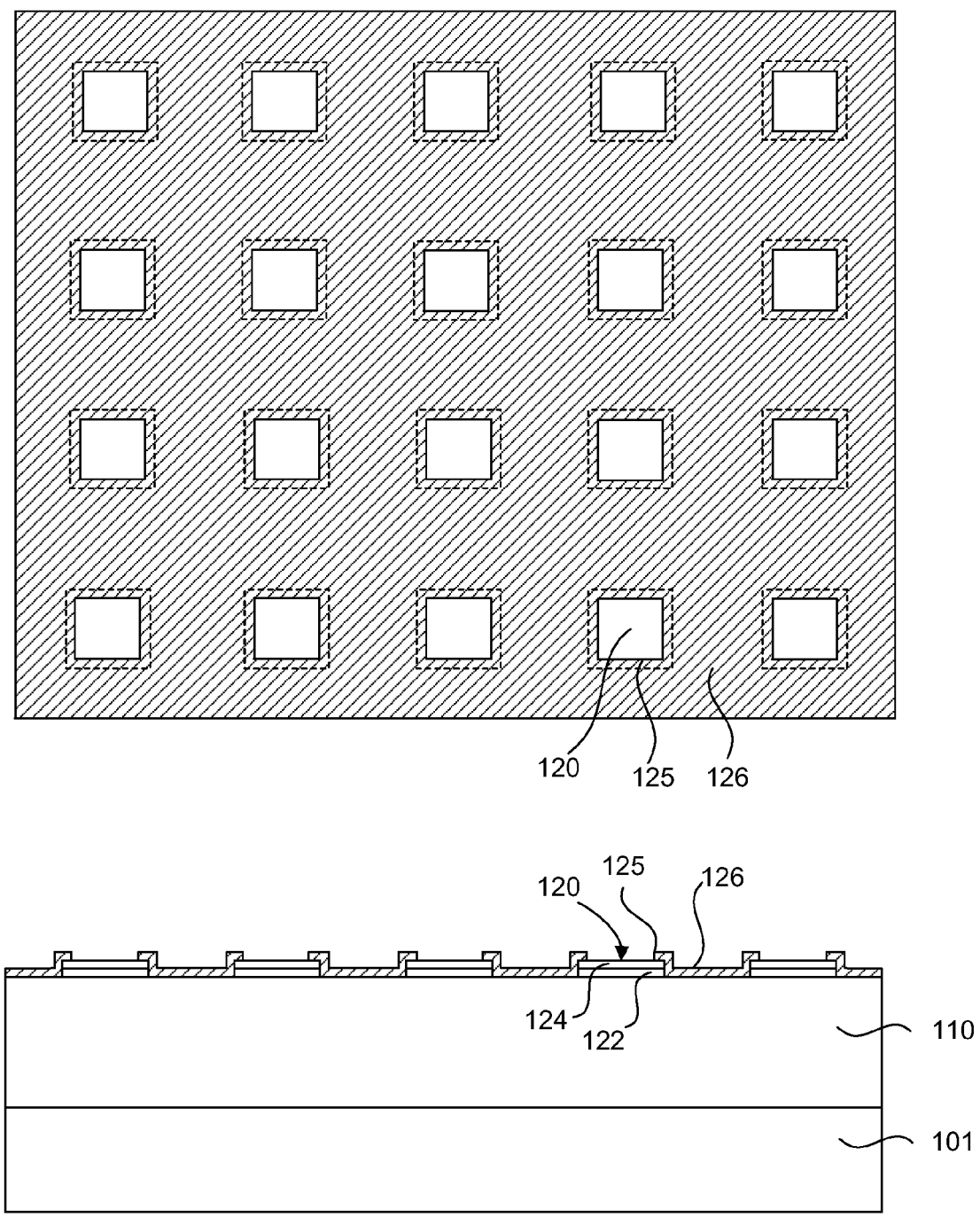
FIGS. 1D-1F include top and cross-sectional side view illustrations of a patterned electrically insulating layer laterally between a plurality of separate reflective metallization stacks in accordance with an embodiment of the invention.

The electrically insulating layer 126 is then patterned to form a plurality of openings 125 exposing the plurality of separate reflective metallization stacks 120 as illustrated in the top and cross-sectional side view illustrations of FIG. 1D. In the particular embodiment illustrated, the openings 125 have a width which is less than a width of the plurality of separate reflective metallization stacks 120 so that a portion of the electrically insulating layer 126 forms a lip on top of a respective reflective metallization stack 120.

Figure 1E:
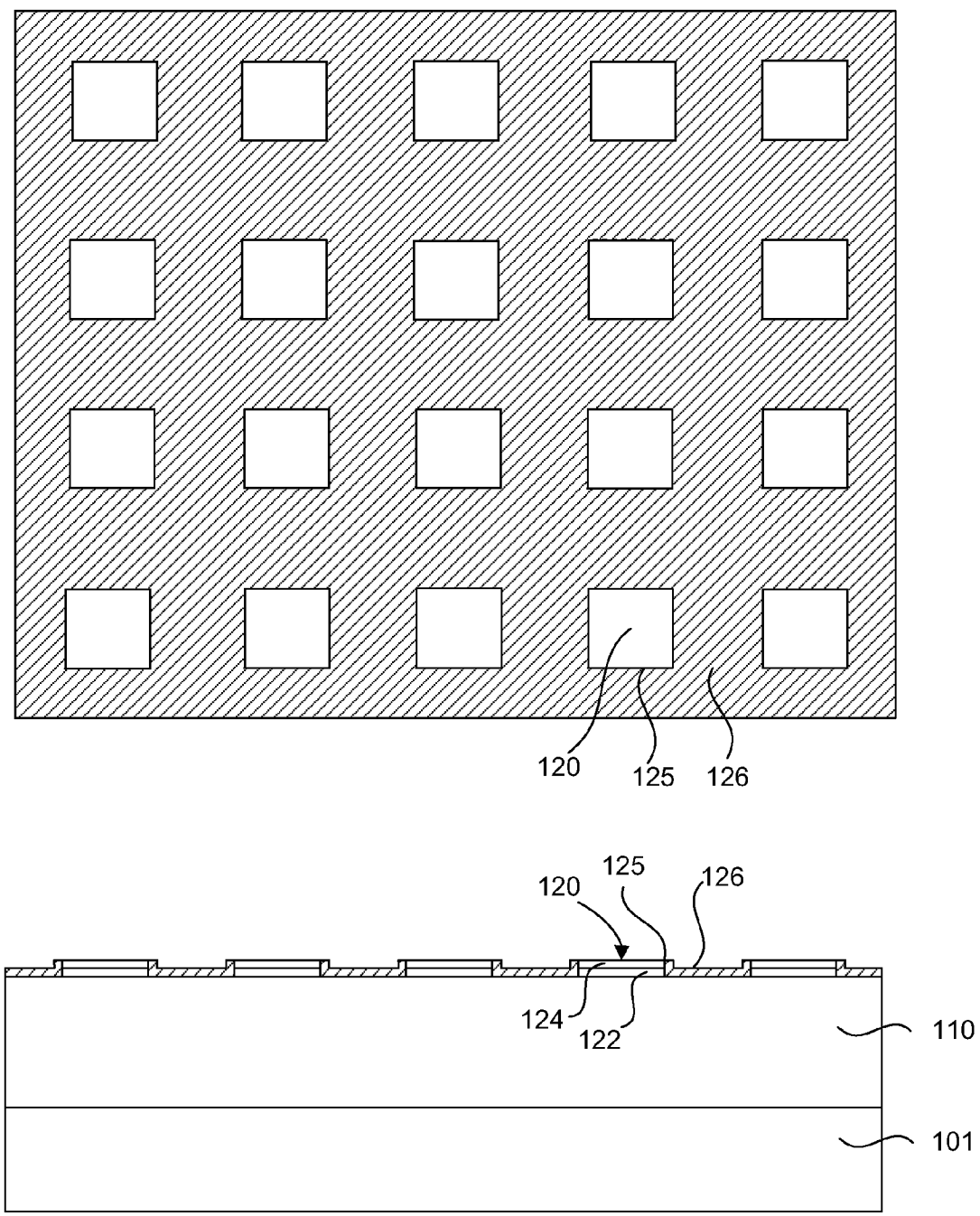

The electrically insulating layer 126 can also be patterned so that a lip does not form on top of the respective metallization stack 120 as illustrated in FIG. 1E. For example, lithographic patterning techniques or chemical mechanical polishing (CMP) can be used to pattern the openings 125 having a width which is approximately the same width as the plurality of separate reflective metallization stacks 120.

Figure 1F:
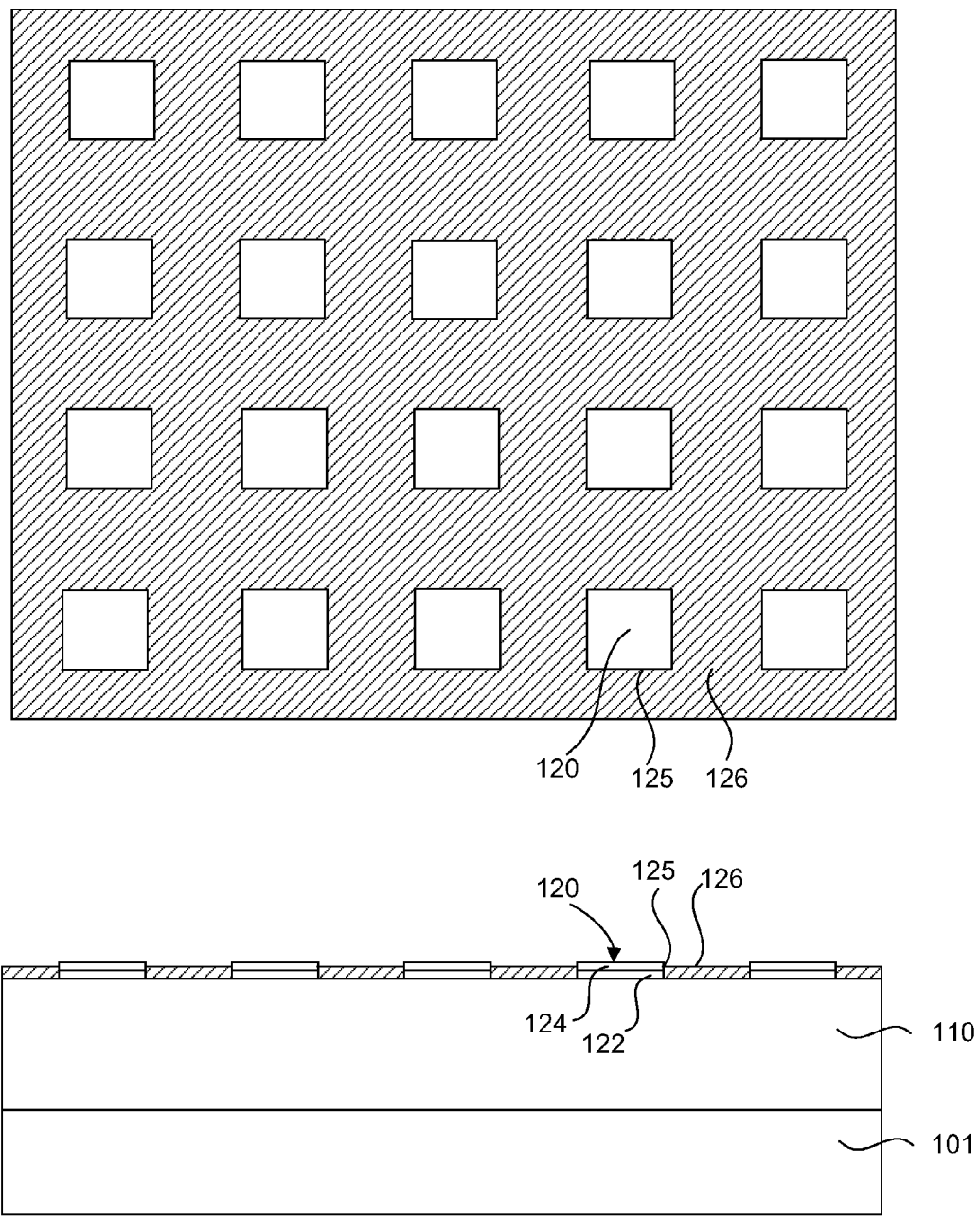

The electrically insulating layer 126 can also be patterned in a self-aligned deposition process in which the reflective metallization stacks 120 are masked while the electrically insulating layer 126 is isotropically deposited laterally between the separate reflective metallization stacks 120, as illustrated in FIG. 1F. In each of the embodiments illustrated in FIGS. 1E-1F, the patterned electrically insulating layer 126 is laterally between the plurality of separate reflective metallization stacks 120, and partially spans sidewalls of the plurality of separate reflective metallization stacks 120 including electrode layer 122.

Figure 1G:
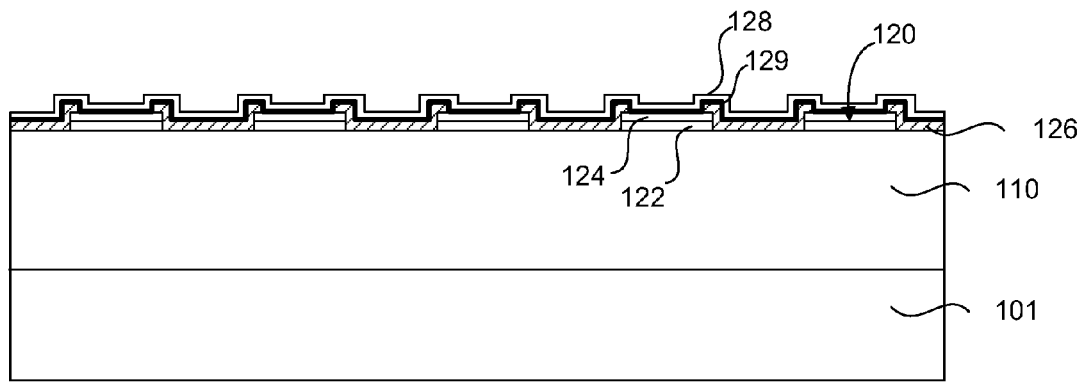
FIGS. 1G-1I are cross-sectional side view illustrations of an adhesion layer and an electrically conductive bonding layer formed over a patterned electrically insulating layer and a plurality of separate reflective metallization stacks in accordance with an embodiment of the invention.
Figure 1H:
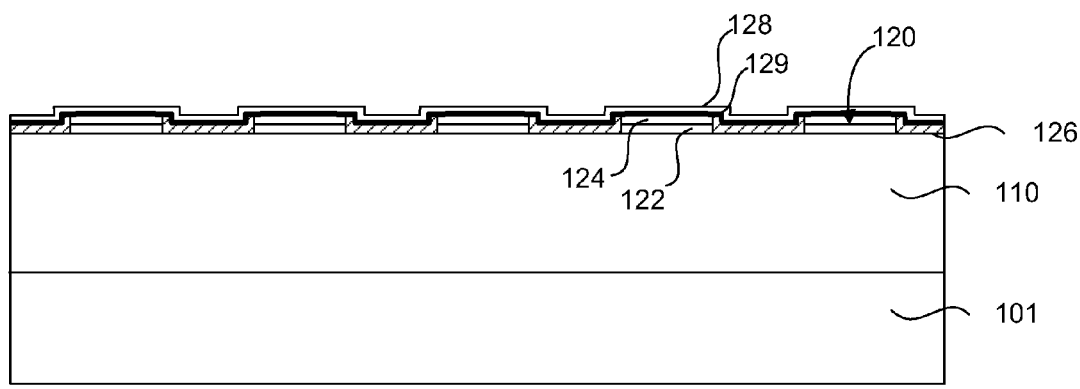
Figure 1I:
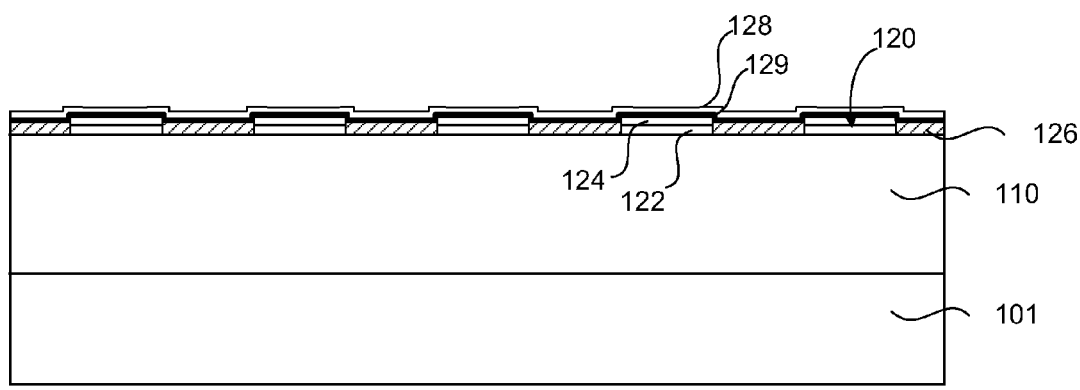

In accordance with some embodiments, the growth substrate 101 stacks illustrated in FIGS. 1E-1F are ready for bonding to a carrier substrate 201 stack. For example the growth substrate 101 stack can be bonded to a carrier substrate 201 stack including a bonding layer 210 as described below with regard to FIGS. 2A-2E. In other embodiments, an additional layer or layers may be formed over the patterned electrically insulating layer 126 and plurality of separate reflective metallization stacks 120. For example, additional layers such as an adhesion promoting layer and/or bonding layer may be formed. Referring to FIGS. 1G-1I, a bonding layer 128 is formed over the patterned electrically insulating layer 126 and plurality of separate reflective metallization stacks 120 of FIGS. 1E-1F, respectively. The bonding layer 128 may be formed of any of the materials described with regard to Table 1 and Table 2 below, some of which may be dependent upon the composition of bonding layer 210, if present, for the formation of a fusion bonded layer or alloy bonding layer. For example, where bonding layer 128 is alloyed bonded with bonding layer 210, bonding layer 128 can be a pure metal, or metal alloy contributing to the chemical compositions provided in Table 1. In an embodiment the bonding layer 128 is electrically conductive and is approximately 500 to 2,000 angstroms thick. Prior to depositing the electrically conductive bonding layer 128, an adhesion layer 129 may optionally be formed to increase adhesion of the electrically conductive bonding layer 128 to the electrically insulating layer 126 (e.g. $SiO_2$). For example, adhesion layer 129 may be formed from Ti, TiW, Cr, or Ni, with a thickness of 100 to 1,000 angstroms, and more specifically approximately 300 angstroms or less.

Figure 1J:
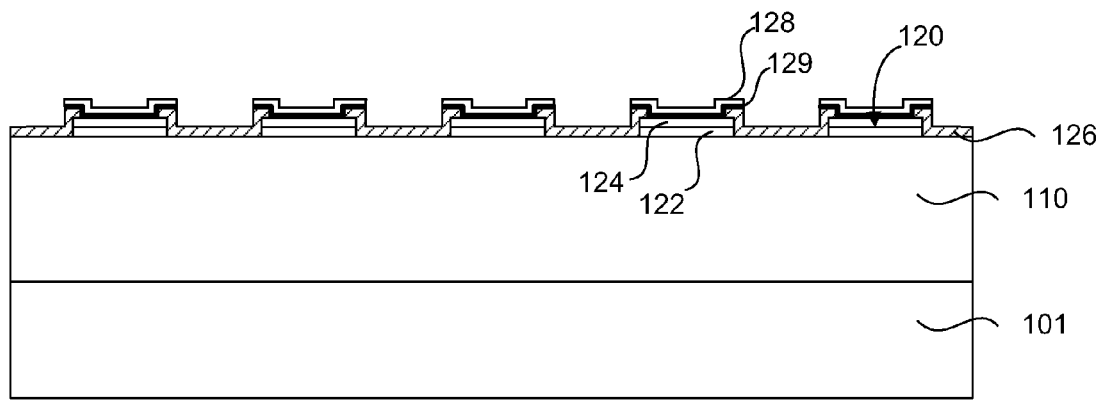
FIG. 1J-1L are cross-sectional side view illustrations of a patterned adhesion layer and an electrically conductive bonding layer in accordance with an embodiment of the invention.
Figure 1K:
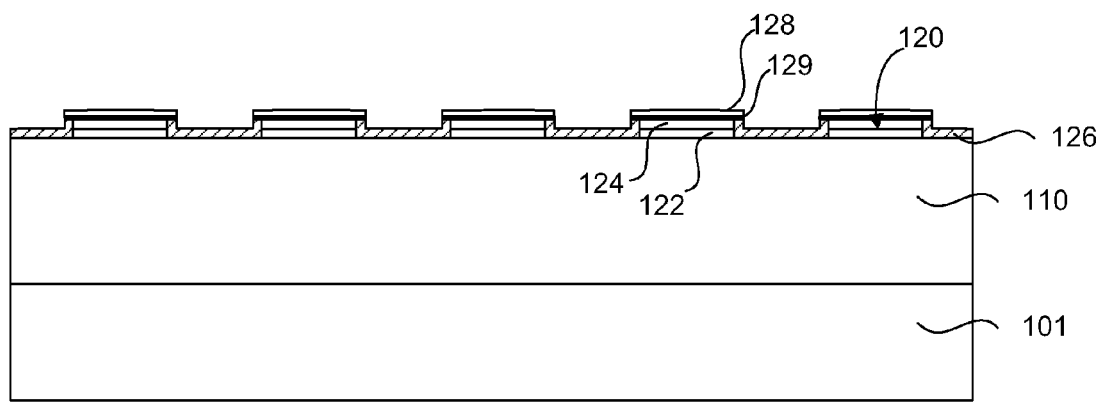
Figure 1L:
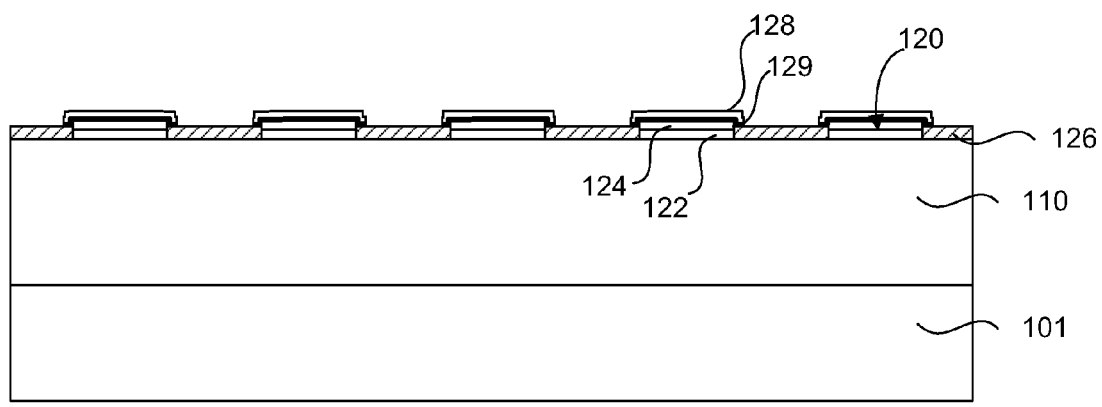

Referring now to FIGS. 1J-1L, the bonding layer 128 and adhesion layer 129 of FIGS. 1G-1I, respectively, may be patterned. In the particular embodiments illustrated, the bonding layer 128 and adhesion layer 129 are removed from over the electrically insulating layer 126 at regions where the bonding layer 128 will not make contact with a corresponding bonding layer on a carrier substrate.

Figure 2A:
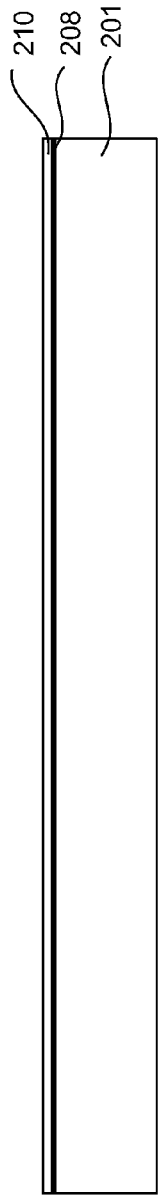
FIGS. 2A-2E are cross-sectional side view illustrations of a carrier substrate with bonding layer in accordance with an embodiment of the invention.
Figure 2B:
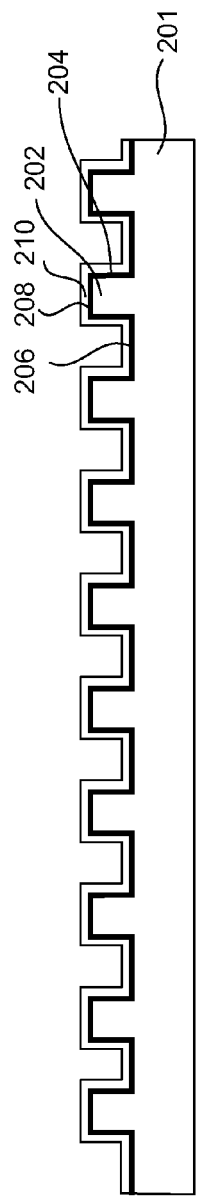
Figure 2C:
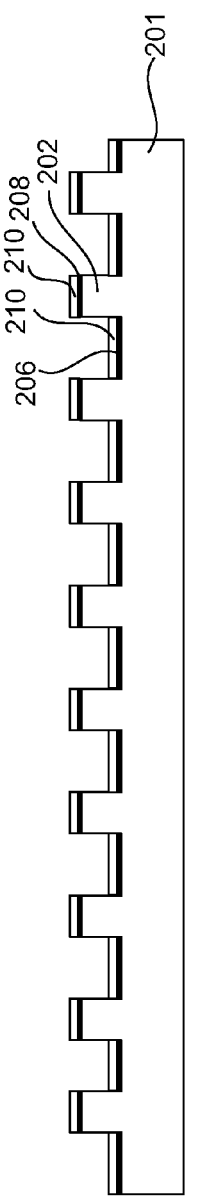
Figure 2D:
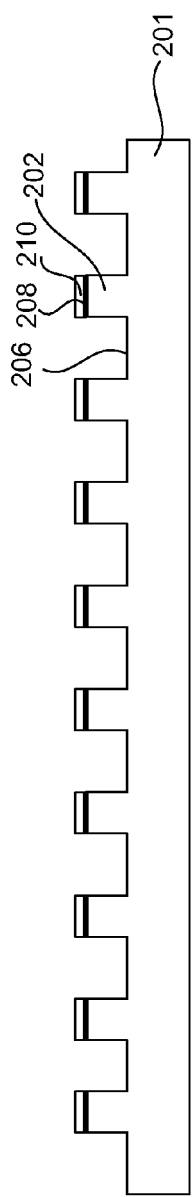

FIGS. 2A-2E are cross-sectional side view illustrations of various embodiments of a carrier substrate 201 with bonding layer 210 for bonding to the growth substrate 101 stack. The bonding layer 210 may be formed of any of the materials described with regard to Table 1 and Table 2 below, some of which may be dependent upon the composition of bonding layer 128, if present, for the formation of a fusion bonded layer or alloy bonding layer. For example, where bonding layer 210 is alloy bonded with bonding layer 128, bonding layer 210 can be a pure metal, or metal alloy contributing to the chemical compositions provided in Table 1. An adhesion layer 208 may optionally be formed prior to bonding layer 210. For example, adhesion layer 208 may be formed from Ti, TiW, Cr, or Ni, with a thickness of 100 to 1,000 angstroms, and more specifically approximately 300 angstroms or less. FIG. 2A illustrates a carrier substrate 201 and bonding layer 210 and adhesion layer 208 which are not patterned prior to bonding. FIGS. 2B-2D illustrate a carrier substrate 201 which has been patterned to form a plurality of posts 202 having sidewalls 204 and separated by trenches 206. Posts 202 may be formed from a variety of materials and techniques. In an embodiment, posts 202 may be formed integrally with carrier substrate 201 by patterning the carrier substrate 201 by an etching or embossing process. For example, carrier substrate 201 may be a silicon substrate with integrally formed posts 202. In another embodiment, posts can be formed on top of carrier substrate 201. For example, posts 202 may be formed by a plate up and photoresist lift off technique. Posts can be formed from any suitable material including semiconductors, metals, polymers, dielectrics, etc.

Posts 202 may have a maximum width which is equal to or less than a width of the micro p-n diodes 150, as will become more apparent in the following description and figures. In an embodiment, the trench posts 202 are at least twice as tall as a thickness of the bonding layer 210. In an embodiment, bonding layer 210 may have a thickness of approximately 0.1 µm-2 µm, and trench posts have a height of at least 0.2 µm-4 µm. In the particular embodiment illustrated in FIG. 2B, a conformal bonding layer 210 is formed over the posts 202, and on the sidewalls 204 and within trenches 206. In the particular embodiment illustrated in FIG. 2C, bonding layer 210 and adhesion layer 208 are anisotropically deposited so that they are formed only on the top surface of posts 202 and within the trenches 206, without a significant amount being deposited on the sidewalls 204. In the particular embodiment illustrated in FIG. 2D, bonding layer 210 and adhesion layer 208 are formed only on the top surface of posts 202. Such a configuration may be formed by patterning the posts 202, adhesion layer 208 and bonding layer 210 with the same patterned photoresist. In the particular embodiment illustrated in FIG. 2E, the laterally separate locations of the bonding layer 210 may be formed with a photoresist lift off technique in which blanket layers of the adhesion layer and bonding layer are deposited over a patterned photoresist layer, which is then lifted off (along with the portion of the adhesion layer and bonding layer on the photoresist layer) leaving behind the laterally separate locations of the bonding layer 210 illustrated in FIG. 2E, though other processing techniques may be used.

Figure 2E:
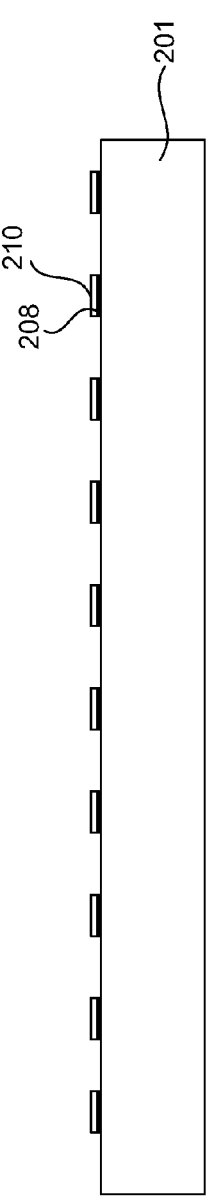

As described above with regard to FIGS. 2B-2E and FIGS. 1B-1L, certain embodiments of the invention include laterally separate reflective metallization stacks 120 and/or laterally separate locations of the bonding layers 128, 210. With regard to FIG. 2B, in which a conformal bonding layer 210 is formed over the posts 202, and on the sidewalls 204 and within trenches 206, the particular locations of the bonding layer on top of the posts 202 are laterally separated by the trenches 206. Thus, even though the conformal bonding layer 210 is continuous, the locations of the bonding layer 210 on top of the posts 202 are laterally separate locations Likewise, the individual discrete locations of the bonding layer 210 in FIG. 2E are laterally separated by the space between them. Where posts 202 exist, the relationship of the bonding layer 210 thickness to post 202 height may factor into the lateral separation of the locations of the bonding layer 210.

The bonding layers 128 and 210 described above may be formed from a variety of suitable materials such as thermoplastic polymers, metals, and solders. The bonding layers as a single bonding layer or when bonded together through fusion bonding or alloy bonding may be capable of adhering a micro LED structure to a carrier substrate. In an embodiment, the resultant bonding layer may have a liquidus temperature or melting temperature below approximately 350° C., or more specifically below approximately 200° C. At such temperatures the resultant bonding layer may undergo a phase change without substantially affecting the other components of the micro LED structure. In an embodiment, the resultant bonding layer may be electrically conductive. For example, where the resultant bonding layer undergoes a phase change from solid to liquid in response to a change in temperature a portion of the resultant bonding layer may remain on the micro LED structure during the pick up operation as described in more detail the following description. In such an embodiment, it may be beneficial that the resultant bonding layer is formed of an electrically conductive material so that it does not adversely affect the micro LED structure when it is subsequently transferred to a receiving substrate. In this case, the portion of resultant bonding layer remaining on the micro LED structure during the transfer operation may aid in bonding the micro LED structure to an electrically conductive pad on the receiving substrate.

Solders may be suitable materials for bonding layers 128, 210 since many are generally ductile materials in their solid state and exhibit favorable wetting with semiconductor and metal surfaces. A typical alloy melts not a single temperature, but over a temperature range. Thus, solder alloys are often characterized by a liquidus temperature corresponding to the lowest temperature at which the alloy remains liquid, and a solidus temperature corresponding to the highest temperature at which the alloy remains solid. An exemplary list of low melting solder materials which may be utilized with embodiments of the invention are provided in Table 1, in which the chemical compositions are listed by weight percent of the components. As described above, where bonding layers 128, 210 are bonded together to form an alloy bonding layer, the bonding layers 128, 210 can be a pure metal, or metal alloy contributing to the chemical compositions provided in Table 1.

TABLE 1

| Chemical composition (weight %) | Liquidus Temperature (° C.) | Solidus Temperature (° C.) |
|---|---|---|
| 100In | 156.7 | 156.7 |
| 66.3In33.7Bi | 72 | 72 |
| 51In32.5Bi16.5Sn | 60 | 60 |
| 57Bi26In17Sn | 79 | 79 |
| 54.02Bi29.68In16.3Sn | 81 | 81 |
| 67Bi33In | 109 | 109 |
| 90In10Sn | 151 | 143 |
| 48In52Sn | 118 | 118 |
| 50In50Sn | 125 | 118 |
| 52Sn48In | 131 | 118 |
| 58Sn42In | 145 | 118 |
| 97In3Ag | 143 | 143 |
| 94.5In5.5Ag | 200 | — |
| 99.5In0.5Au | 200 | — |
| 95In5Bi | 150 | 125 |
| 99.3In0.7Ga | 150 | 150 |
| 99.4In0.6Ga | 152 | 152 |
| 99.6In0.4Ga | 153 | 153 |
| 99.5In0.5Ga | 154 | 154 |
| 58Bi42Sn | 138 | 138 |
| 60Sn40Bi | 170 | 138 |
| 100Sn | 232 | 232 |

TABLE 1-continued

| Chemical composition (weight %) | Liquidus Temperature (° C.) | Solidus Temperature (° C.) |
|---|---|---|
| 95Sn5Sb | 240 | 235 |
| 100Ga | 30 | 30 |
| 99In1Cu | 200 | — |
| 98In2Cu | 182 | — |
| 96In4Cu | 253 | — |
| 74In26Cd | 123 | 123 |
| 70In30Pb | 175 | 165 |
| 60In40Pb | 181 | 173 |
| 50In50Pb | 210 | 184 |
| 40In60Pb | 231 | 197 |
| 55.5Bi44.5Pb | 124 | 124 |
| 58Bi42Pb | 126 | 124 |
| 45.5Bi54.5Pb | 160 | 122 |
| 60Bi40Cd | 144 | 144 |
| 67.8Sn32.2Cd | 177 | 177 |
| 45Sn55Pb | 227 | 183 |
| 63Sn37Pb | 183 | 183 |
| 62Sn38Pb | 183 | 183 |
| 65Sn35Pb | 184 | 183 |
| 70Sn30Pb | 186 | 183 |
| 60Sn40Pb | 191 | 183 |
| 75Sn25Pb | 192 | 183 |
| 80Sn20Pb | 199 | 183 |
| 85Sn15Pb | 205 | 183 |
| 90Sn10Pb | 213 | 183 |
| 91Sn9Zn | 199 | 199 |
| 90Sn10Au | 217 | 217 |
| 99Sn1Cu | 227 | 227 |
| 99.3Sn0.7Cu | 227 | 227 |

An exemplary list thermoplastic polymers which may be utilized with embodiments of the invention are provided in Table 2.

TABLE 2

| Polymer | Melting Temperature (° C.) |
|---|---|
| Acrylic (PMMA) | 130-140 |
| Polyoxymethylene (POM or Acetal) | 166 |
| Polybutylene terephthalate (PBT) | 160 |
| Polycaprolactone (PCL) | 62 |
| Polyethylene terephthalate (PET) | 260 |
| Polycarbonate (PC) | 267 |
| Polyester | 260 |
| Polyethylene (PE) | 105-130 |
| Polyetheretherketone (PEEK) | 343 |
| Polylactic acid (PLA) | 50-80 |
| Polypropylene (PP) | 160 |
| Polystyrene (PS) | 240 |
| Polyvinylidene chloride (PVDC) | 185 |

In accordance with embodiments of the invention, bonding layers 128, 210 are formed with a uniform thickness and may be deposited by a variety of suitable methods depending upon the particular composition. For example, solder compositions may be sputtered, deposited by electron beam (E-beam) evaporation, or plated with a seed layer to obtain a uniform thickness.

Figure 3A:
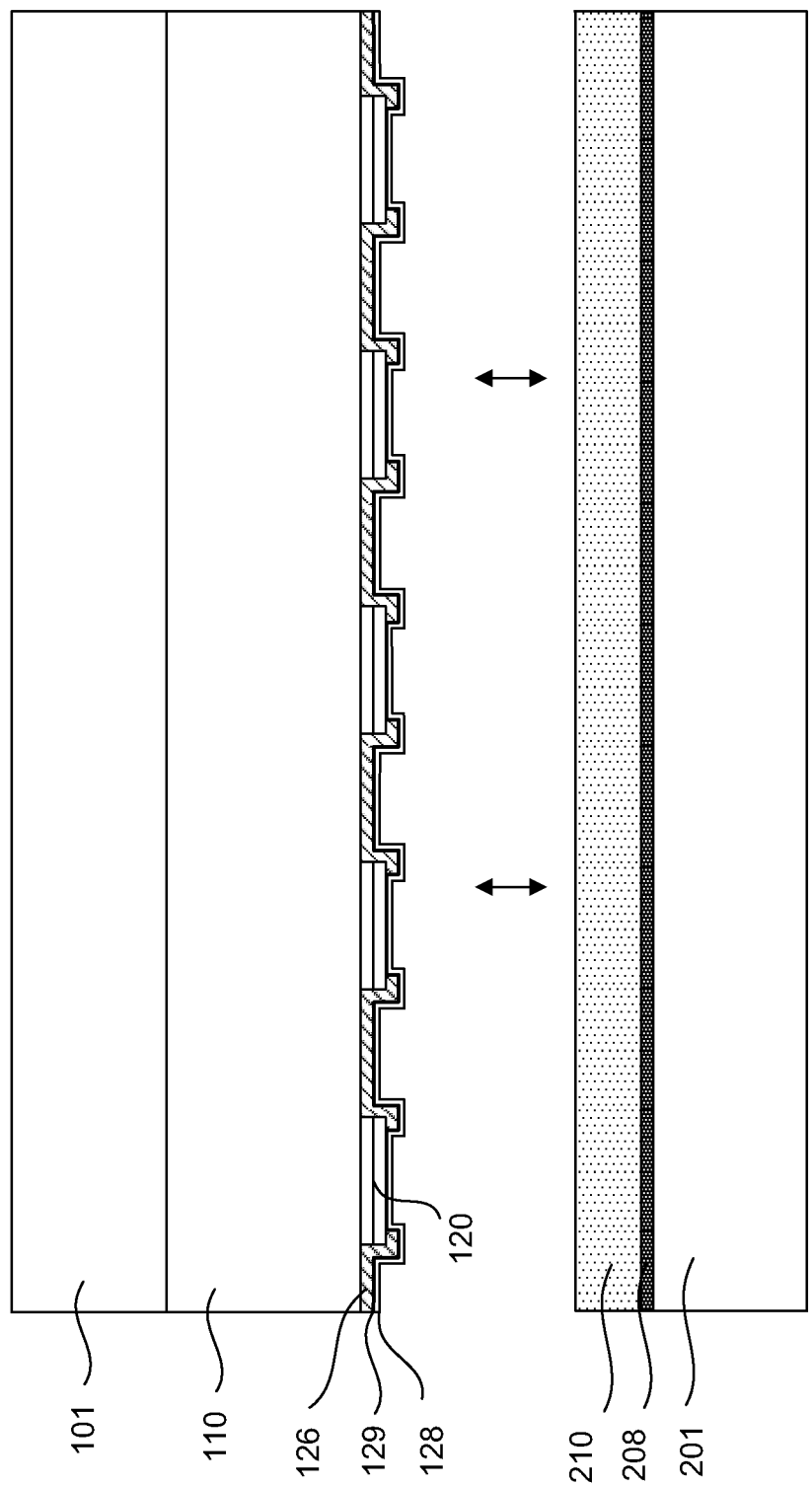
FIGS. 3A-3B are cross-sectional side view illustrations of bonding a growth substrate and carrier substrate together in accordance with an embodiment of the invention.
Figure 3B:
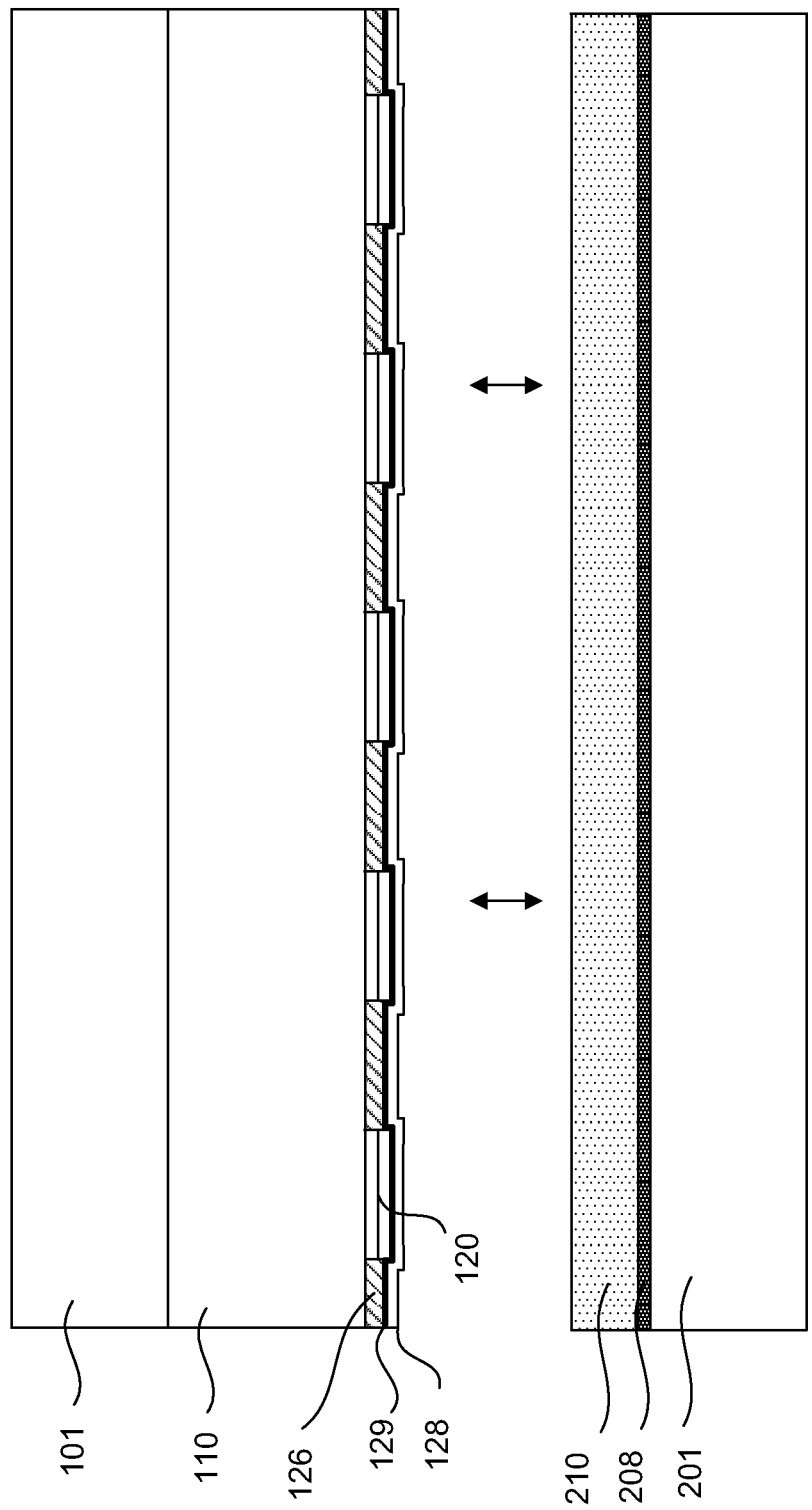

Referring now to FIGS. 3A-3B, the growth substrate 101 and carrier substrate 201 may be bonded together under heat and/or pressure. It is to be appreciated that while FIG. 3B illustrates the bonding of the patterned structure of FIG. 1I with the unpatterned structure of FIG. 2A, that these illustrations are exemplary and that any combination of FIGS. 1A-1L and FIGS. 2A-2E are contemplated in accordance with embodiments of the invention. In addition, growth substrate 101 and carrier substrate 201 may be bonded together utilizing only a single bonding layer 128 or 210.

In an embodiment, during bonding of the substrates illustrated in FIGS. 3A-3B, the electrically conductive bonding layer 128 may diffuse into the electrically conductive bonding layer 210, or vice versa, transforming layers 128, 210 into an alloy bonding layer. As described above, one function of the resultant bonding layer is to retain the micro LED structure including the micro p-n diode in place on a carrier substrate, while also providing a medium from which the micro LED structure is readily releasable. In some embodiments, one of the electrically conductive bonding layers 128, 210 is formed of a material with a melting or liquidus temperature greater than 350° C., or more particularly greater than 200° C., however the resultant alloy bonding layer is characterized by a melting or liquidus temperature of 350° C. or lower, or more particularly 200° C. or lower so as to provide a medium from which the micro LED can be picked up. Accordingly, the electrically conductive bonding layers 128, 210 are formed with specific compositions and thicknesses to achieve a desired alloy concentration upon interdiffusion of bonding layer 128 and bonding layer 210. In an embodiment, the compositions and thicknesses of the bonding layer 128 and bonding layer 210 are selected to achieve eutectic alloy bonding in which the eutectic alloy transforms directly from solid to liquid state at a specific composition and temperature without passing a two phase equilibrium of liquid and solid state.

In accordance with embodiments of the invention, the bonding interface produced with bonding layers 128, 210 may be stronger than the bonding interface using bonding layer 210 alone. The increased bonding interface strength can provide additional structural integrity for the system, for example during removal of the growth substrate 101 described in more detail below. For example, where a laser lift-off technique is used to remove the growth substrate the system is subjected to heat and mechanical shock waves which can potentially result in delamination of layers between the growth substrate 101 and carrier substrate 201 and cracking of the p-n diode layer 110. In accordance with embodiments of the invention, eutectic bonding of the bonding layers 128, 210 can create a strong bonding interface which protects against such delamination, thereby preserving the integrity of the p-n diode layer 110.

Figure 4A:
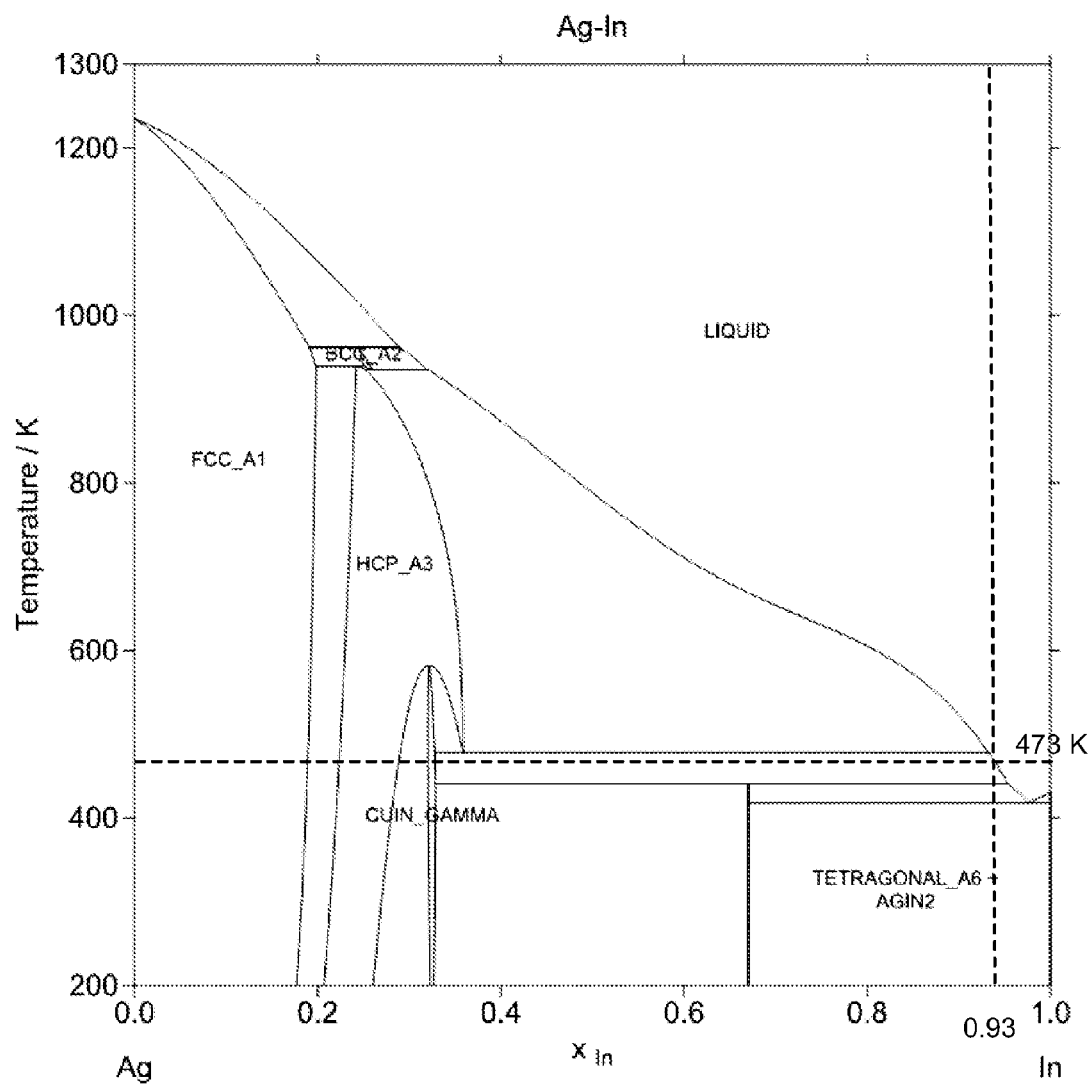
FIG. 4A is an Ag—In binary phase diagram in accordance with an embodiment of the invention.

FIG. 4A is a silver-indium (Ag—In) binary phase diagram presented in molar amounts in accordance with an embodiment of the invention. The superimposed vertical and horizontal lines indicate that for an exemplary Ag—In alloy bonding layer having a liquidus temperature of 200° C. (473° K), that the alloy contains 0.93 moles In to 0.07 moles Ag. Assuming a molecular weight of 107.8682 g/mol and density of 10.49 g/cc for Ag, and a molecular weight of 114.818 g/mol and density of 7.31 g/cc for In, the relative thicknesses of electrically conductive bonding layers 128, 210 can be determined assuming complete interdiffusion of Ag—In in the alloy bonding layer. For example, a 1.5 μm thick In electrically conductive bonding layer 210 can be interdiffused with an Ag electrically conductive bonding layer 128 up to a thickness of 740 angstroms to form an alloy bonding layer with a melting temperature of 200° C. As another example, a 2.0 μm thick In electrically conductive bonding layer 210 can be interdiffused with an Ag electrically conductive bonding layer 128 up to a thickness of 986 angstroms to form an alloy bonding layer with a melting temperature of 200° C. Thus, in this example, electrically conductive bonding layer 128 has a thickness which is 5% or less of the thickness of electrically conductive bonding layer 210. While these specific embodiments have been described with bonding layer 210 including the lower melting temperature material (In, 156.7° C.) and bonding layer 128 including the higher melting temperature material (Ag, 962° C.), an opposite arrangement is also possible with bonding layer 210 including the higher melting temperature material with bonding layer 128 including the lower melting temperature material.

Achieving a uniform diffusion profile of electrically conductive bonding layer 128 material (e.g. Ag) in electrically conductive bonding layer 210 material (e.g. In) can be achieved during the bonding operation utilizing temperature profiles between room temperature and the liquidus temperature of the resultant alloy. Due to the interdiffusion, the bonding operation can be performed at temperatures above the lower liquidus temperature of bonding layers 128, 210. For example, where electrically conductive bonding layer 128 is formed of Ag and electrically conductive bonding layer 210 is formed of In (156.7° C. liquidus temperature), a bonding temperature profile may include holding the stacked structure at approximately 160° C. for an extended period of time sufficient to produce a constant concentration eutectic concentration in the alloy bonding layer. Though a constant concentration may not be necessary, and a concentration gradient may remain in the alloy bonding layer with the top surface of the bonding layer (former location of bonding layer 128) having a higher Ag concentration than at a bottom surface of the alloy bonding layer.

Figure 4B:
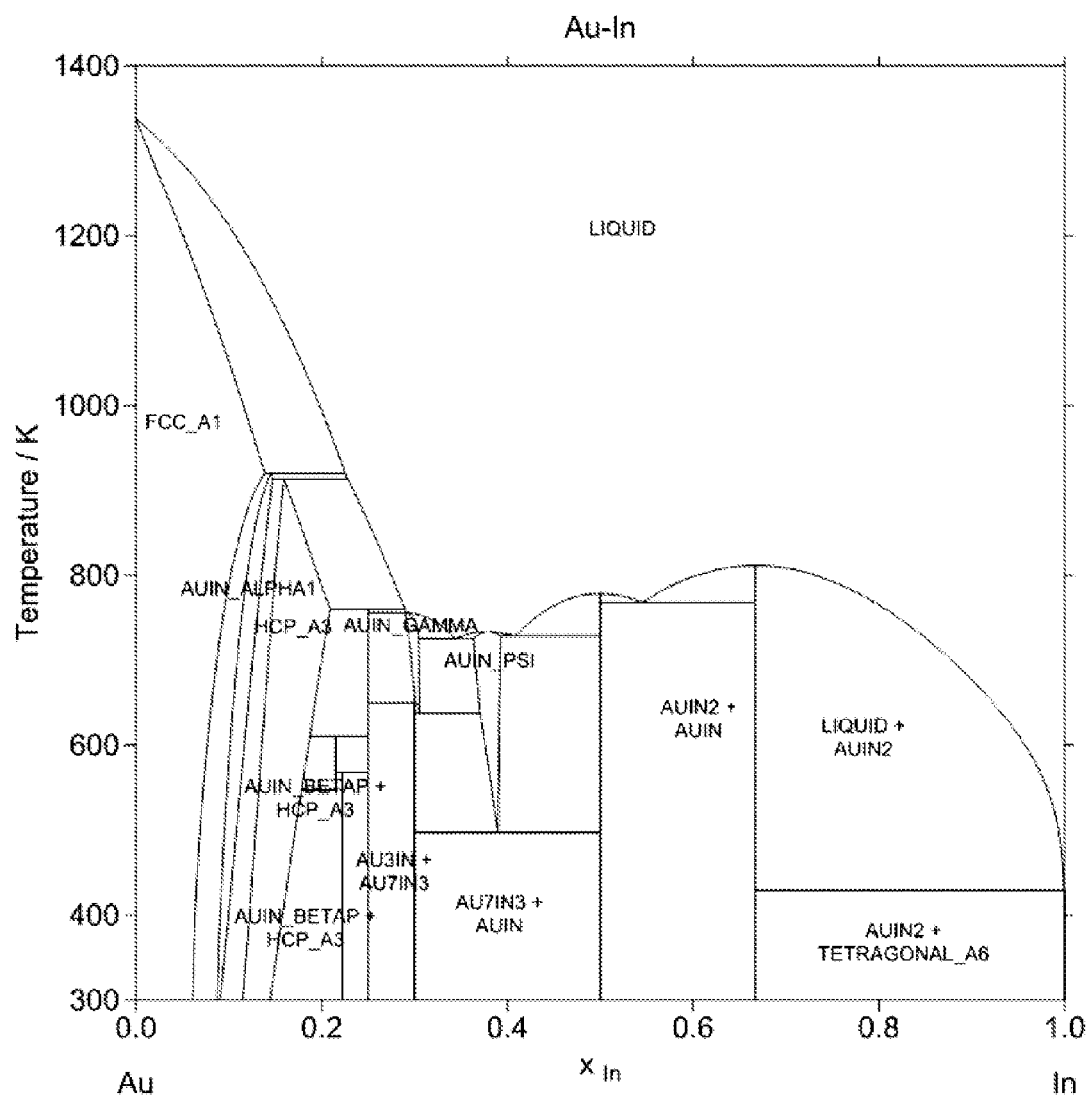
FIG. 4B is an Au—In binary phase diagram in accordance with an embodiment of the invention.
Figure 4C:
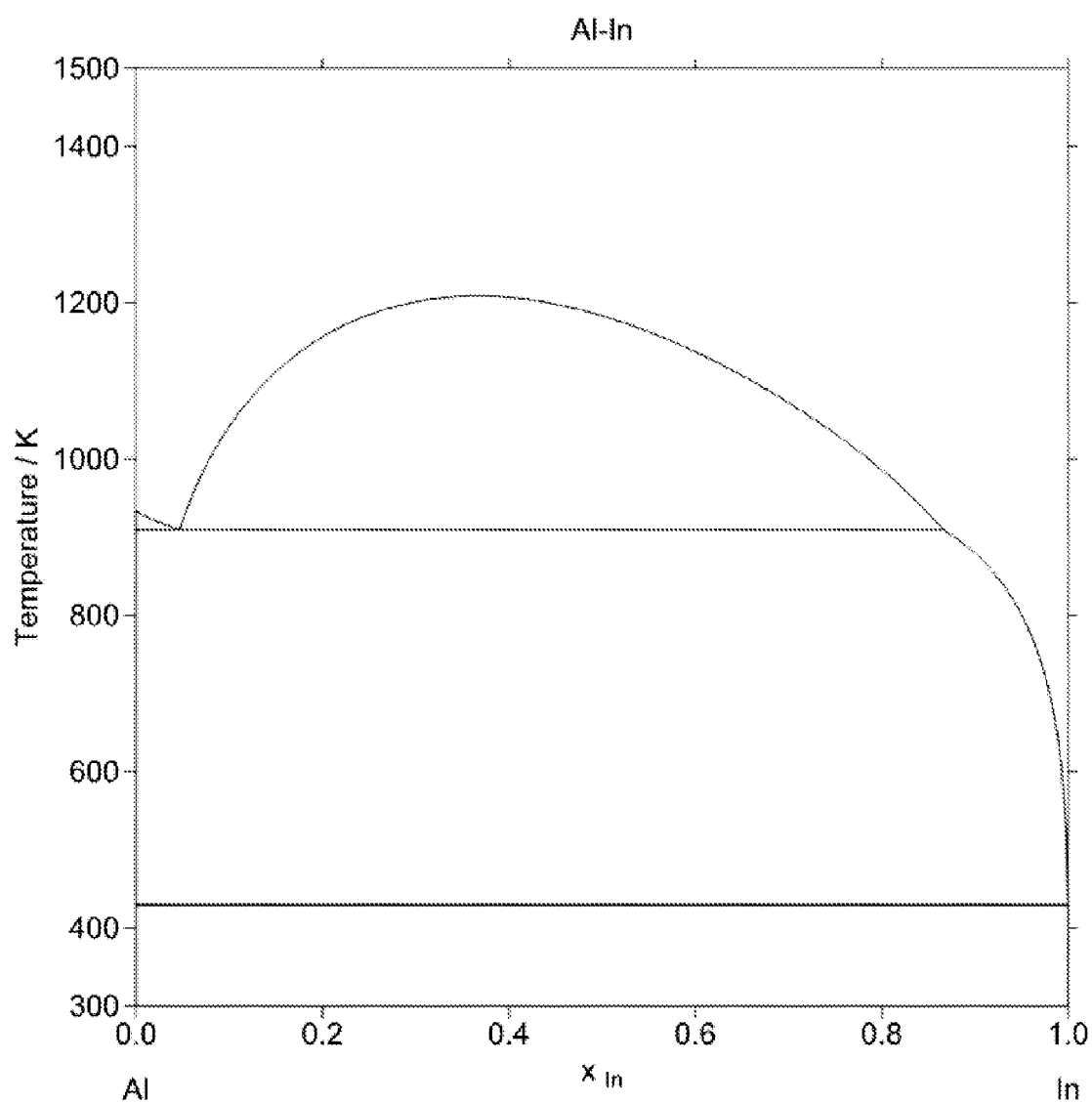
FIG. 4C is an Al—In binary phase diagram in accordance with an embodiment of the invention.

While a specific example of a binary Ag—In alloy bonding layer system has been described, it is understood that embodiments of the invention are not limited to only Ag—In alloy bonding systems and that other suitable systems can be derived, such as, but not limited to those based upon the compositions provided in Table 1. For example, in addition to the alloy bonding systems listed in Table 1, Au—In and Al—In alloy bonding systems can be derived based upon the binary phase diagrams presented in molar amounts illustrated in FIGS. 4B-4C in accordance with an embodiment of the invention.

Figure 5:
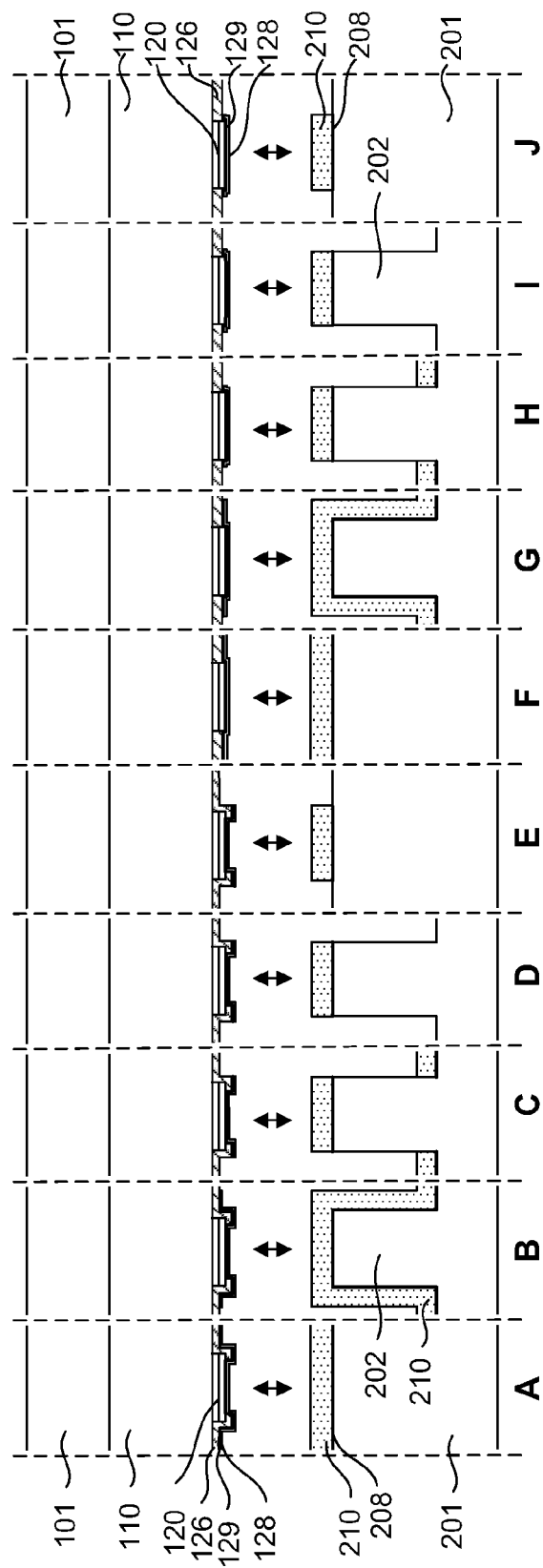
FIG. 5 is a cross-sectional side view illustration of various possible structures for the growth substrate and carrier substrate prior to bonding together in accordance with an embodiment of the invention FIG. 5' is a cross-sectional side view illustration of various possible structures after bonding the growth substrate and carrier substrate together in accordance with an embodiment of the invention.
Figure 5:
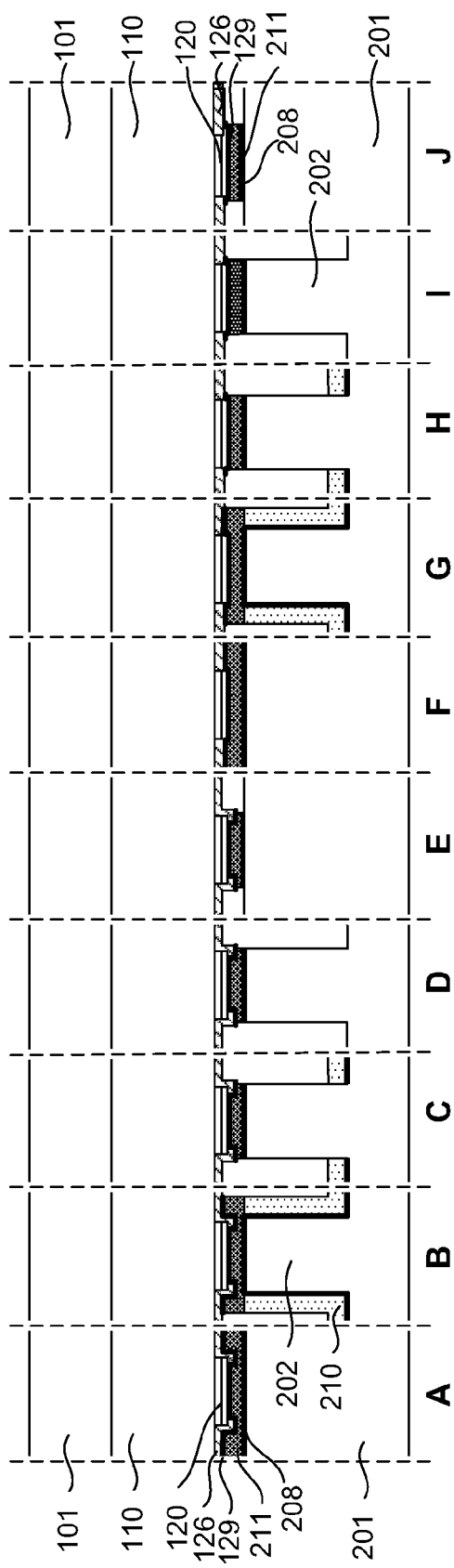

FIG. 5 is a cross-sectional side view illustration of various non-limiting possible structures of the growth substrate 101 and carrier substrate 201 presented side-by-side prior to bonding. FIG. 5' is a cross-sectional side view illustration of various non-limiting possible structures presented side-by-side after bonding the growth substrate 101 and carrier substrate 201. The particular combinations of substrates are described in Table 3. For example, the particular embodiment illustrated in FIG. 5, Example A, represents the bonding of the carrier substrate illustrated in FIG. 2A to the growth substrate illustrated in FIG. 1G. The following description is made with regard to alloy bonding of an electrically conductive bonding layer 128 and electrically conductive bonding layer 210 to form alloy bonding layer 211. It is to be appreciated however, that embodiments of the invention are not limited to alloy bonding, and that the representative bonding layer can be a fusion bonded layer, or other bonding layer as described above.

TABLE 3

|  | Ex. 4A | Ex. 4B | Ex. 4C | Ex. 4D | Ex. 4E | Ex. 4F | Ex. 4G | Ex. 4H | Ex. 4I | Ex. 4J |
|---|---|---|---|---|---|---|---|---|---|---|
| Carrier Substrate (2A-2D) | 2A | 2B | 2C | 2D | 2E | 2A | 2B | 2C | 2D | 2E |
| Growth Substrate (1G-1L) | 1G | 1J | 1J | 1J | 1J | 1I | 1L | 1L | 1L | 1L |

Still referring to FIG. 5', one feature of the illustrated embodiments is that the topography of the growth substrate 101 stack bonded to the carrier substrate 201 stack is embedded (or embossed) into the alloy bonding layer 211 during the bonding operation. For example, the topography including electrically insulating layer 126 underneath the reflective metallization stack 120 is embedded (or embossed) into the alloy bonding layer 211. This may assist in the formation of an array of micro LED structures with uniform height. However, embodiments of the invention do not require such, and it is not required that the topography is embedded (or embossed) into the alloy bonding layer 211 during the bonding process.

Another feature of the illustrated embodiments is that the electrically insulating layer 126 is a physical barrier between the p-n diode layer 110 and underlying metal layers (e.g. adhesion layer 129, alloy bonding layer 211, adhesion layer 208). Thus, electrically insulating layer 126 provides a barrier to metal contamination along the bottom surface of the micro p-n diodes subsequently formed out of p-n diode layer 110. Another notable feature, referring to FIG. 5', Examples B, C, G and H, the portions of electrically conductive bonding layer 210 which do not make contact with the electrically conductive bonding layer 128 during the bonding operation are not included in alloy bonding layer 211. Also another notable features, while not required, is that bonding layer 128 and adhesion layer 129, as well as bonding layer 210, can be patterned prior to bonding to only be present at locations where they will be bonded together.

Figure 6:
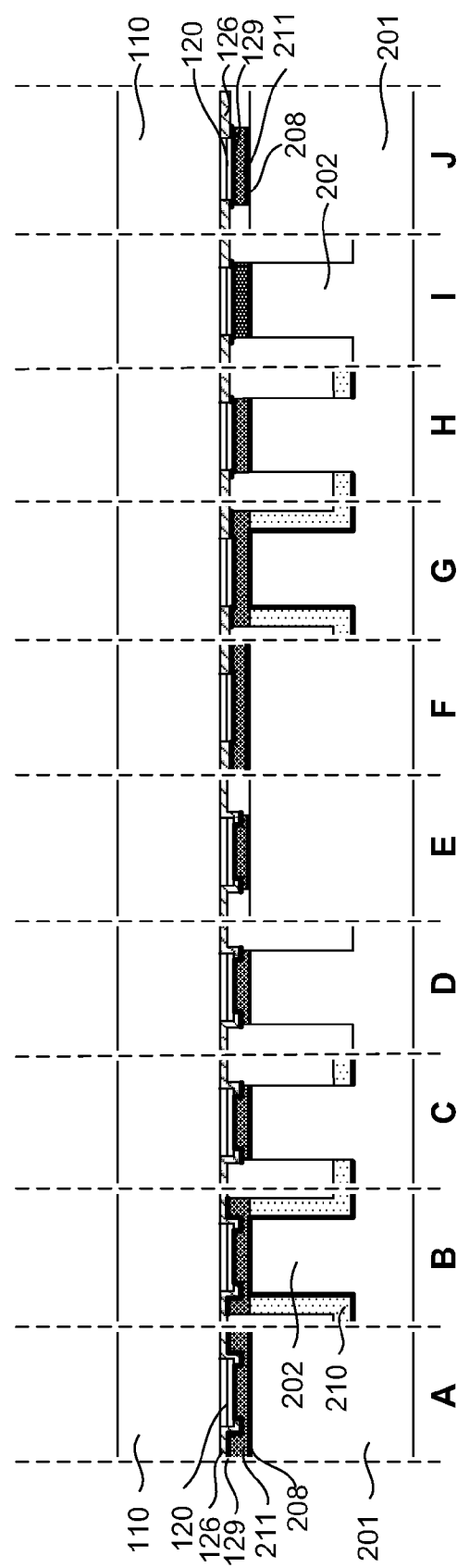
FIG. 6 is a cross-sectional side view illustration of the growth substrate removed from the bonded structure in accordance with an embodiment of the invention.

Referring now to FIG. 6, the growth substrate 101 has been removed from the bonded structure. Growth substrate 101 may be removed by a suitable method such as chemical etching or an excimer laser-based lift-off (LLO) if the growth substrate is transparent. In an embodiment, LLO of a GaN p-n diode layer 110 from a transparent sapphire growth substrate 101 is accomplished by irradiating the 101/110 layer interface through the transparent sapphire growth substrate 101 with a short pulse (e.g. tens of nanoseconds) from an ultraviolet laser such as a Nd-YAG laser or KrF excimer laser. Absorption in the GaN p-n diode layer 110 at the interface results in localized heating of the interface resulting in decomposition at the interfacial GaN to liquid Ga metal and nitrogen gas. Once the desired area has been irradiated, the transparent sapphire growth substrate 101 can be removed by remelting the Ga on a hotplate.

In accordance with embodiments of the invention, eutectic alloy bonding of bonding layer 128 and bonding layer 210 can achieve an increased bonding interface strength which provides additional structural integrity for the system during removal of the growth substrate 101, for example during a laser lift-off technique in which the growth substrate is subjected to heat and mechanical shock waves. The increased bonding interface strength may protect against delamination during removal of the growth substrate thereby preserving the integrity of the p-n diode layer 110.

Figure 7:
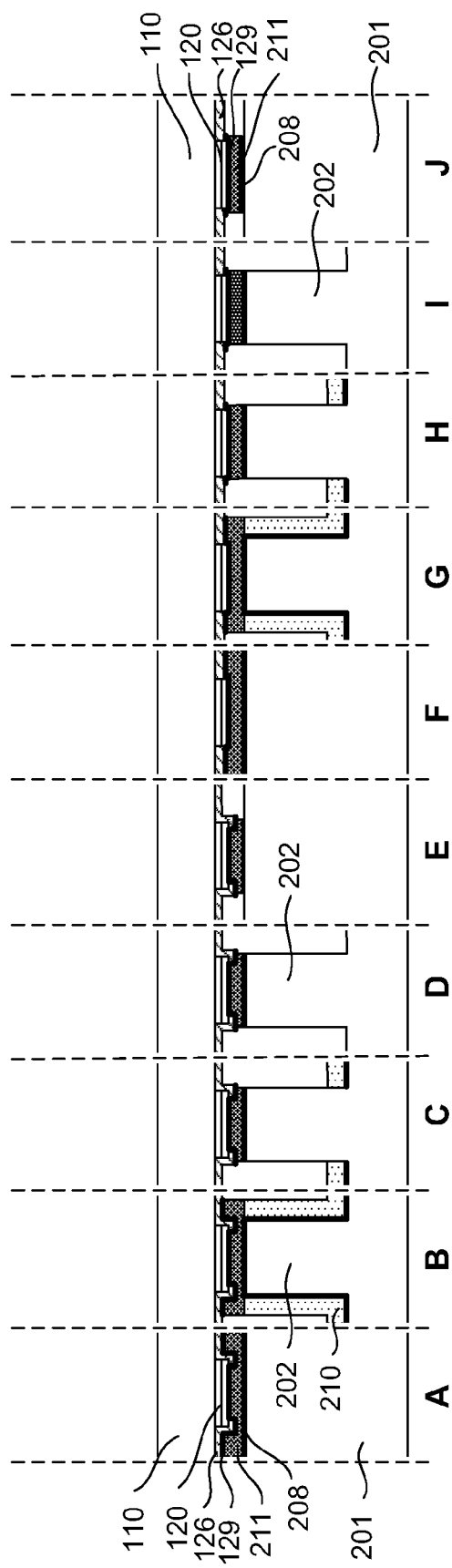
FIG. 7 is a cross-sectional side view illustration of a thinned-down p-n diode layer in accordance with an embodiment of the invention.

Referring now to FIG. 7, the p-n diode layer 110 is thinned down to a desirable thickness. Referring back to the enlarged p-n diode layer 110 in FIG. 1A, a predetermined amount of the bulk GaN layer 112 (which may be n-type) or a portion of the n-type GaN layer 114 are removed so that an operable p-n diode remains after thinning. Depending upon the underlying structure, the thinning process may be performed utilizing suitable techniques such as polishing, wet etching or dry etching. For example, a combination of polish and/or timed etch to a desired thickness may be performed. In circumstances where there are underlying patterned structures such as pillars, a timed etch to a desired thickness may be performed in order to avoid damaging the patterned structures.

Figure 8:
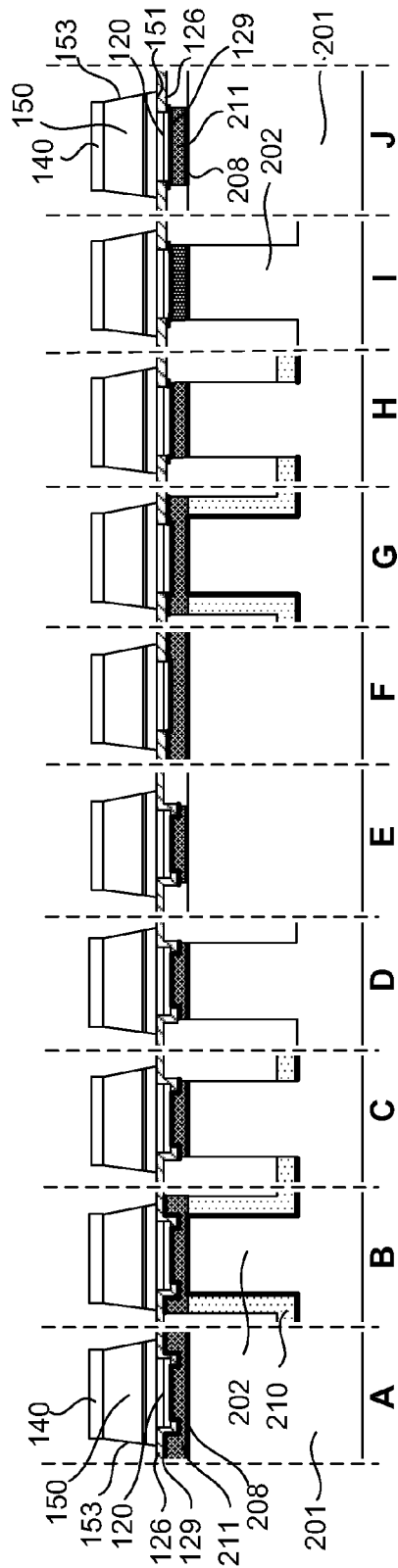
FIGS. 8-8' are cross-sectional side view illustrations of etching p-n diode layer to form micro p-n diodes in accordance with an embodiment of the invention.
Figure 8:
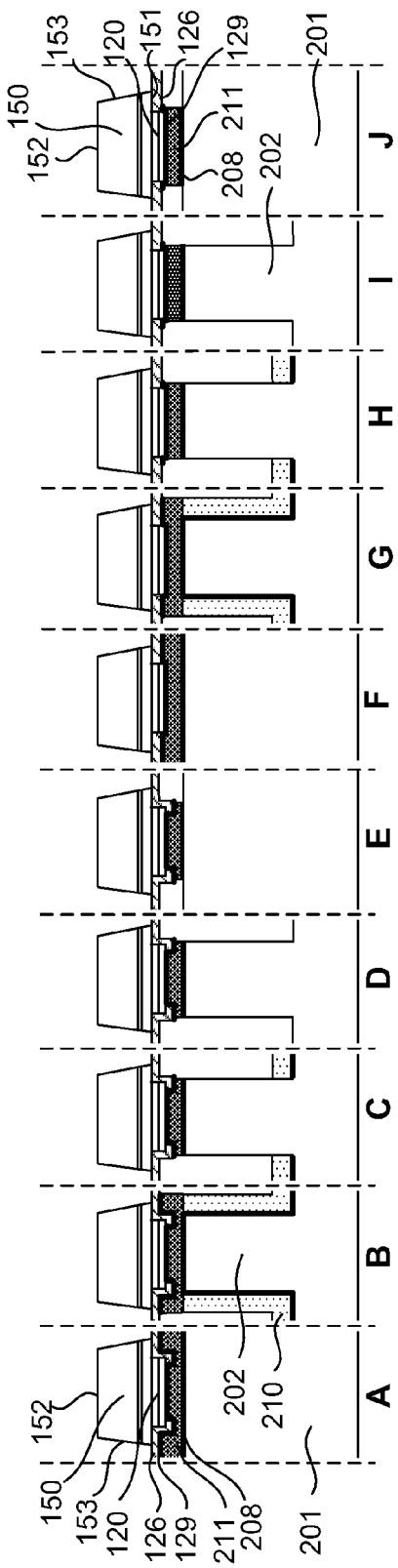

Referring now to FIG. 8, a patterned mask layer 140 may be formed over the thinned down p-n diode layer 110 for etching of p-n diode layer 110 to form a plurality of separate micro p-n diodes 150. Mask layer 140 may be formed from photoresist or a variety of materials such as metal (e.g. chromium, nickel) or dielectric (silicon nitride, silicon oxide) which are more resistant to the GaN etching conditions than is photoresist. Etching of the GaN p-n diode layer 110 can be performed utilizing dry plasma etching techniques such as reactive ion etching (RIE), electro-cyclotron resonance (ECR), inductively coupled plasma reactive ion etching (ICP-RIE), and chemically assisted ion-beam etching (CAME). The etch chemistries may be halogen-based, containing species such as $Cl_2$, $BCl_3$ or $SiCl_4$.

As illustrated, the electrically insulating layer 126 acts as an etch stop layer during etching of the GaN p-n diode layer 110. As a result, the electrically insulating layer protects the sidewalls 153 of the micro p-n diodes 150, and the quantum well structure located within from contamination by the underlying electrically conductive alloy bonding layer 211, and adhesion layers 129 and 208 if present. For example, since the dry plasma etching chemistry sees an electrically insulating layer 126 (e.g $SiO_2$) instead of metal from the covered electrically conductive alloy bonding layer 211 or adhesion layers 129 and 208, metal resputtering onto the p-n diode 150 sidewalls is eliminated.

In the particular embodiment illustrated in FIG. 8, micro p-n diodes 150 may have outwardly tapered sidewalls 153 (from top to bottom of the micro p-n diodes 150) up to 15 degrees. For example, RIE with a chlorine-based etch chemistry may be utilized. Alternatively, the sidewalls 153 may be vertical. For example, ICP-RIE which a chlorine-based etch chemistry may be utilized to obtain vertical sidewalls. As will become apparent in the description of FIG. 15, outwardly tapered sidewalls may be advantageous in some embodiments when forming a common contact over a series of micro LED structures which have been picked up and transferred to a receiving substrate. In certain embodiments, the pitch between the micro p-n diodes 150 may be 5 µm, 10 µm, or larger. For example, a micro p-n diode 150 array with a 5 µm pitch may be formed of 3 µm wide micro p-n diodes separated by a 2 µm spacing. A micro p-n diode 150 array with a 10 µm pitch may be formed of 8 µm wide micro p-n diodes separated by a 2 µm spacing. Upon completion of etching p-n diode layer 110 to form the plurality of separate micro p-n diodes 150, the patterned mask layer 140 may be removed exposing top surfaces 152 of the plurality of micro p-n diodes 150 as illustrated in FIG. 8'. Alternatively, the patterned mask layer 140 may be removed at a later time.

Referring now to FIG. 8", the electrically insulating layer 126 is patterned to form electrically insulating spacers 127 laterally surrounding the reflective metallization stacks 120 of the array of micro LED structures. Electrically insulating spacers 127 may also span a portion of the sidewalls of the separate reflective metallization stacks 120, protecting a reflective mirror layer within the separate reflective metallization stacks from oxidation which could potentially change color of the reflective mirror layers and affect the reflective properties of the reflective mirror layers. For example, a silver (Ag) layer can be utilized as a reflective mirror layer within the reflective metallization stacks.

In an embodiment, if not already removed the patterned mask layer 140 can be removed in the same operation of etching back the electrically insulating layer 126 to form the laterally separate electrically insulating spacers 127. Alternatively, where the etching solution has different selectivity to electrically insulating layer 126 and patterned mask layer 140, the patterned mask layer 140 can remain on the p-n diode 150 and be utilized to form a contact opening in a conformal dielectric barrier layer as described with regard to FIGS. 9-9'.

Still referring to FIG. 8" the micro LED array includes a carrier substrate 201, a plurality of locations of an alloy bonding layer 211 (which may or may not be laterally separate) on the carrier substrate, and a respective plurality of separate micro p-n diodes 150 over the plurality of locations of the alloy bonding layer 211. A plurality of separate reflective metallization stacks 120 are formed between the respective plurality of separate micro p-n diodes 150 and the plurality of locations of the alloy bonding layer 211. A plurality of electrically insulating spacers 127 laterally surround and span sidewalls of the plurality of separate reflective metallization stacks 120. The plurality of electrically insulating spacers 127 may also span a portion of a bottom surface of the respective plurality of reflective metallization stacks 120. The plurality of electrically insulating spacers 127 may also span a portion of a bottom surface of the respective plurality of micro p-n diodes 150. In some embodiments, the carrier substrate includes a respective plurality of pillars 202 on which the plurality of laterally separate locations of the alloy bonding layer 211 are formed, as illustrated in Examples B-D and G-I.

In some embodiments, the micro p-n diodes 150 include a top surface 152 and a bottom surface 151, and the reflective metallization stack 120 includes a top surface and a bottom surface, and the bottom surface 151 of the micro p-n diode 150 is wider than the top surface of the reflective metallization stack 120. In some embodiments, the plurality of micro p-n diodes 150 each include a bottom surface 151 which has approximately the same width as a top surface of each of the respective plurality of pillars 202. In other embodiments, the plurality of micro p-n diodes 150 each include a bottom surface 151 which is wider than a top surface of each of the respective plurality of pillars 202. The relationship of the micro p-n diode 150 bottom width and underlying pillar 202 top surface may affect the pick up process. For example, if the alloy bonding layer 211 exhibits a phase change from solid to liquid during the pick up process then the micro p-n diode 150 is essentially floating on a liquid layer. Surface tension forces in the liquid alloy bonding layer 211 may retain the micro p-n diode 150 in place on top of the pillar 202. In particular, surface tension forces associated with the edges of the top surface of the pillar 202 may further assist in maintaining the micro p-n diode 150 in place where the pillar 202 top surface width is less than or approximately equal to the p-n diode 150 bottom width.

In some embodiments, the plurality of micro p-n diodes 150 are positioned over an unpatterned alloy bonding layer 211. For example, as illustrated in Examples A and F, the alloy bonding layer 211 may be a uniform layer on the carrier substrate and the corresponding plurality of locations of the alloy bonding layer 211 are not laterally separate from each other. In other embodiments, the plurality of micro p-n diodes 150 are positioned over a pattered alloy bonding layer 211. For example, as illustrated in Examples B-E and G-J, the patterned alloy bonding layer may include a plurality of laterally separate locations of the alloy bonding layer 211. In an embodiment, the plurality of micro p-n diodes 150 each include a bottom surface 151 which has approximately the same or greater width than a corresponding top surface for a plurality of laterally separate locations of the alloy bonding layer 211.

As previously described the alloy bonding layer may absorb compression forces associated with contacting the micro LED structure with a transfer head during the pick up process. As a result, the alloy bonding layer may absorb the compressive forces and bulge out laterally. Where each micro LED structure is patterned to have a small separation distance, of 2 µm for example, the amount of alloy bonding layer laterally protruding from each micro LED structure should be minimized so as to not interfere with an adjacent micro LED structure during the pick up process. In certain embodiments where trenches 206 are present between posts 202, the trenches may act as (alloy) bonding layer reservoirs into which molten (alloy) bonding layer may flow without interfering with an adjacent micro LED structure.

Figure 9:
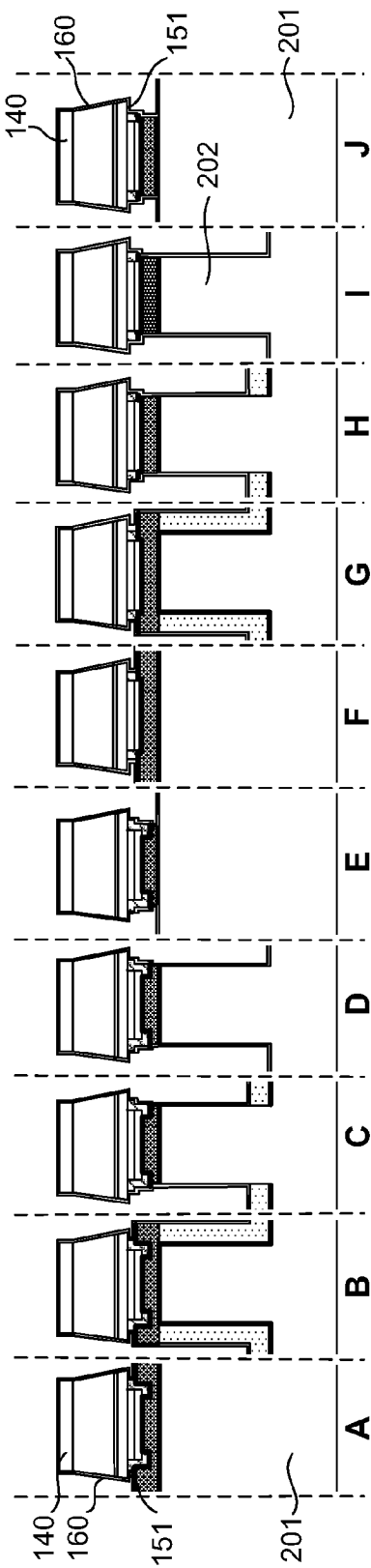
FIGS. 9-9' are cross-sectional side view illustrations of the formation of contact openings in a micro LED array in accordance with an embodiment of the invention.
Figure 9:
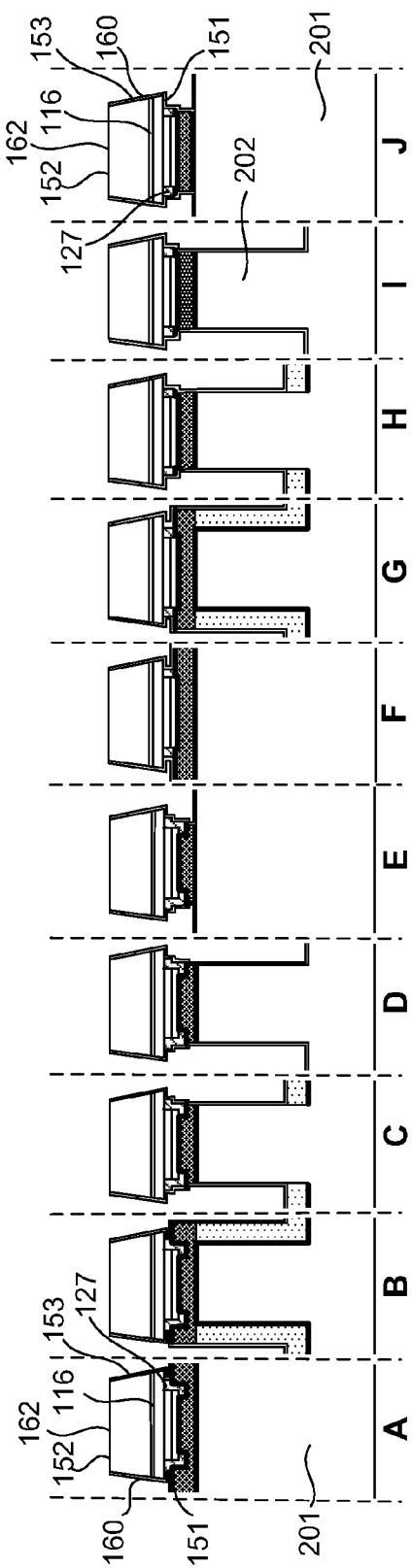
Figure 10:
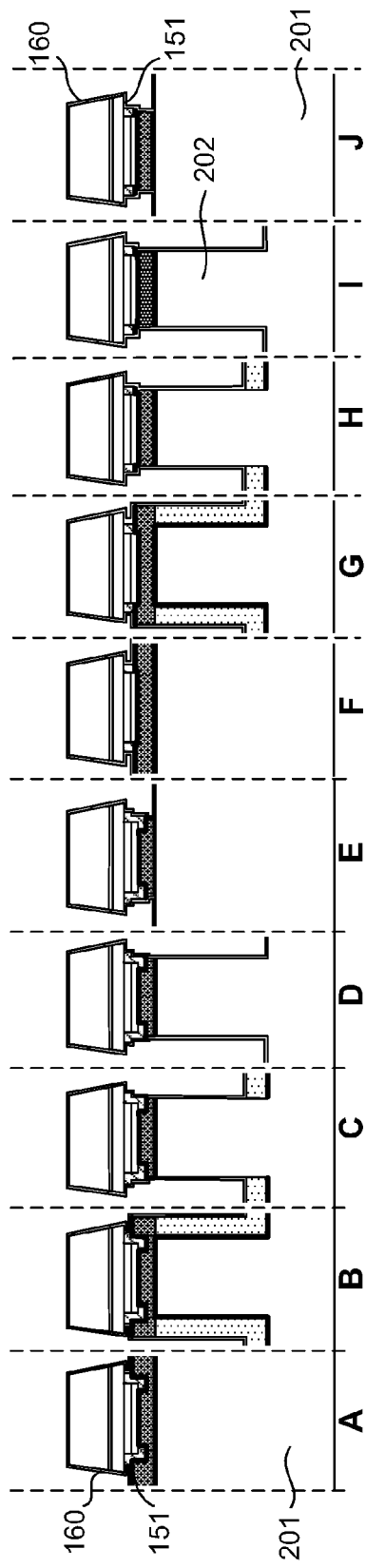
FIGS. 10-10" are cross-sectional side view illustrations of the formation of contact openings in a micro LED array in accordance with an embodiment of the invention.
Figure 10:
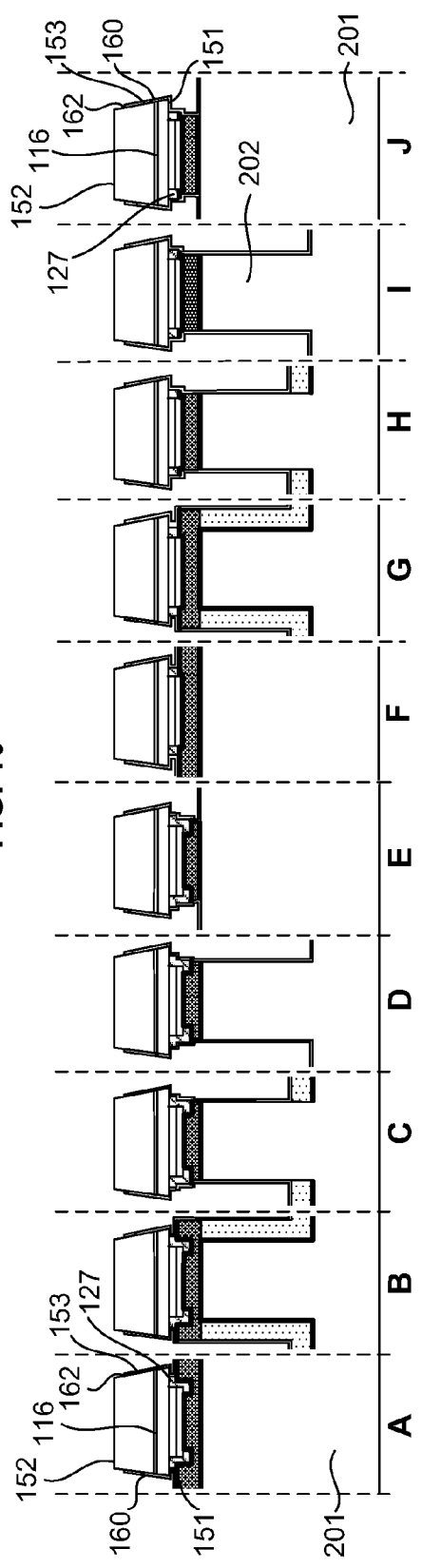
Figure 20:
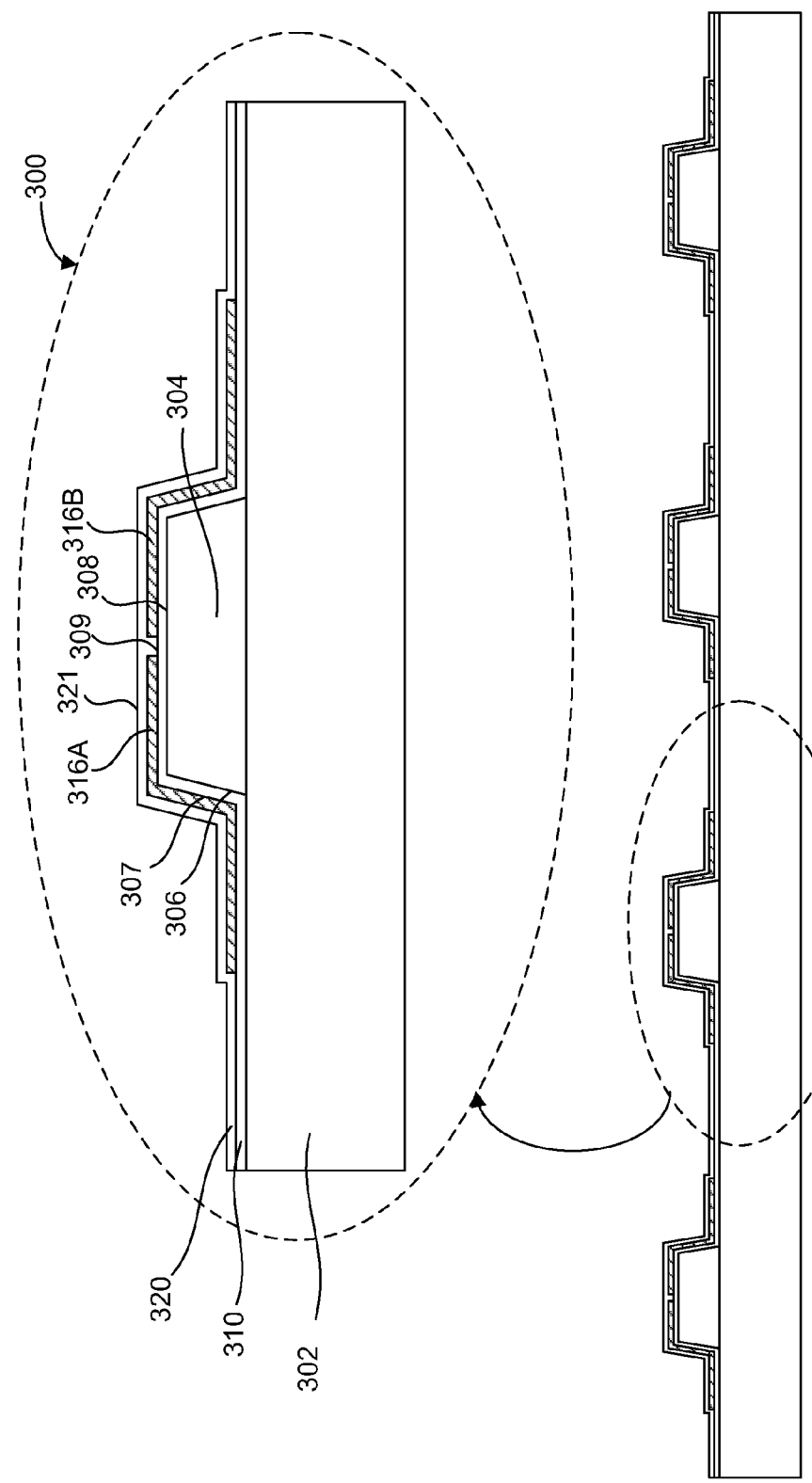
FIG. 20 is a cross-sectional side view illustration of a bipolar micro device transfer head in accordance with an embodiment of the invention.

In some embodiments, the micro LED structures of FIG. 8" are poised for pick up and transfer to a receiving substrate, for example with a transfer head 300 described in more detail with regard to FIG. 20. In other embodiments, a thin conformal dielectric barrier layer may be formed of an array of any of the micro p-n diodes 150 prior to pick up and transfer to a receiving substrate. Referring now to FIGS. 9-10", a thin conformal dielectric barrier layer 160 may be formed over an array of any of the micro p-n diodes 150 of FIG. 8". In one embodiment, the thin conformal dielectric barrier layer 160 may protect against charge arcing between adjacent micro p-n diodes 150 during the pick up process, and thereby protect against adjacent micro p-n diodes 150 from sticking together during the pick up process. The thin conformal dielectric barrier layer 160 may also protect the sidewalls 153, quantum well layer 116 and bottom surface 151, of the micro p-n diodes 150 from contamination which could affect the integrity of the micro p-n diodes 150. For example, the thin conformal dielectric barrier layer 160 can function as a physical barrier to wicking of the bonding layer material 210 (or alloy bonding layer 211) up the sidewalls and quantum layer 116 of the micro p-n diodes 150 during subsequent temperature cycles (particularly at temperatures above the liquidus or melting temperature of the bonding layer material 210/211) such as during picking up the micro device from the carrier substrate, and releasing the micro device onto the receiving substrate. The thin conformal dielectric barrier layer 160 may also insulate the micro p-n diodes 150 once placed on a receiving substrate. In an embodiment, the thin conformal dielectric barrier layer 160 is approximately 50-600 angstroms thick aluminum oxide ($Al_2O_3$). Conformal dielectric barrier layer 160 may be deposited by a variety of suitable techniques such as, but not limited to, atomic layer deposition (ALD).

Referring now to FIGS. 9-9', a thin conformal dielectric barrier layer 160 may be formed over an array of any of the micro p-n diodes 150 of FIG. 8" in which the patterned mask layer 140 has not yet been removed. The thin conformal dielectric barrier layer 160 may be formed over an array of any of the micro p-n diodes 150 and is conformal to and spans across exposed surfaces of the mask layer 140, and sidewalls 153 and the bottom surface 151 of the p-n diode 150. The conformal dielectric barrier layer 160 may also span across exposed surfaces of electrically insulating spacers 127, alloy bonding layer 211, as well as adhesion layer 129, if present. The mask layer 140 is then removed with a lift off technique, lifting off the portion of the thin conformal dielectric barrier layer 160 formed thereon resulting in the structure illustrated in FIG. 9' including contact openings 162. In the particular embodiment illustrated in FIG. 9', the conformal dielectric barrier layer 160 is not formed on the top surface 152 of the micro p-n diodes 150.

Figure 11:
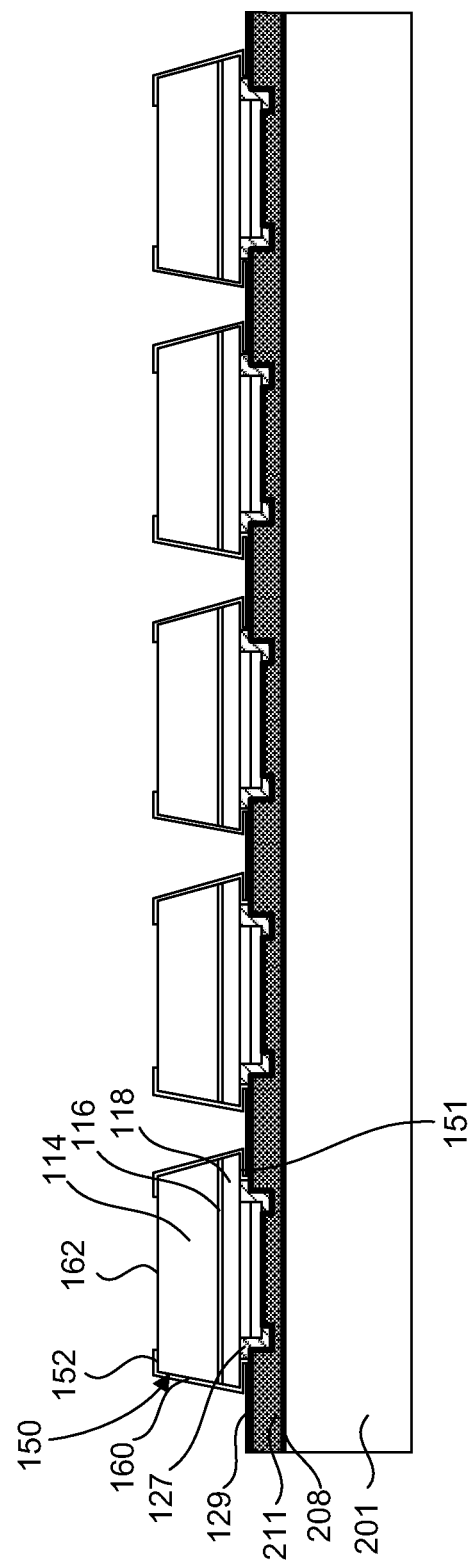
FIG. 11 is a cross-sectional side view of an array of micro LED structures on a carrier substrate in accordance with an embodiment of the invention.

Referring to FIGS. 10-10" the thin conformal dielectric layer can also be formed over the array of micro p-n diodes 150 of FIG. 8" followed by patterning to create contact openings 162. As illustrated in FIG. 10, the thin conformal dielectric barrier layer 160 may be formed over an array of any of the micro p-n diodes 150 and is conformal to and spans across the exposed top surface and sidewalls of the p-n diodes 150. The dielectric barrier layer 160 may also span across the exposed bottom surface 151 of the p-n diodes 150 and exposed surfaces of electrically insulating spacers 127, alloy bonding layer 211, as well as adhesion layer 129, if present. A blanket photoresist layer may then be formed over the p-n diode array and carrier substrate 201, and then patterned to form openings over each micro p-n diode 150. The thin conformal dielectric barrier layer 160 may then be etched to form contact openings 162 on the top surface of each micro p-n diode 150. Contact openings 162 are illustrated in FIGS. 10'-10" after removal of the patterned photoresist. As illustrated in FIG. 10', contact openings 162 may have a slightly larger width than the top surface of the micro p-n diodes 150. In the embodiment illustrated in FIG. 10' the contact openings 162 expose the top surfaces of the micro p-n diodes 150 and an upper portion of the sidewalls of the micro p-n diodes 150, while the dielectric barrier layer 160 covers and insulates the quantum well layers 116. As illustrated in FIG. 10", contact openings 162 may have a slightly smaller width than the top surface of the micro p-n diodes 150. The difference in width may be a result of adjusting for an alignment tolerance in patterning the photoresist. As a result, the conformal dielectric barrier layer 160 may form a lip around the top surface and sidewalls of the micro p-n diodes 150. An exemplary array of micro LED structures from FIG. 10" Example A are illustrated in FIG. 11.

Figure 12A:
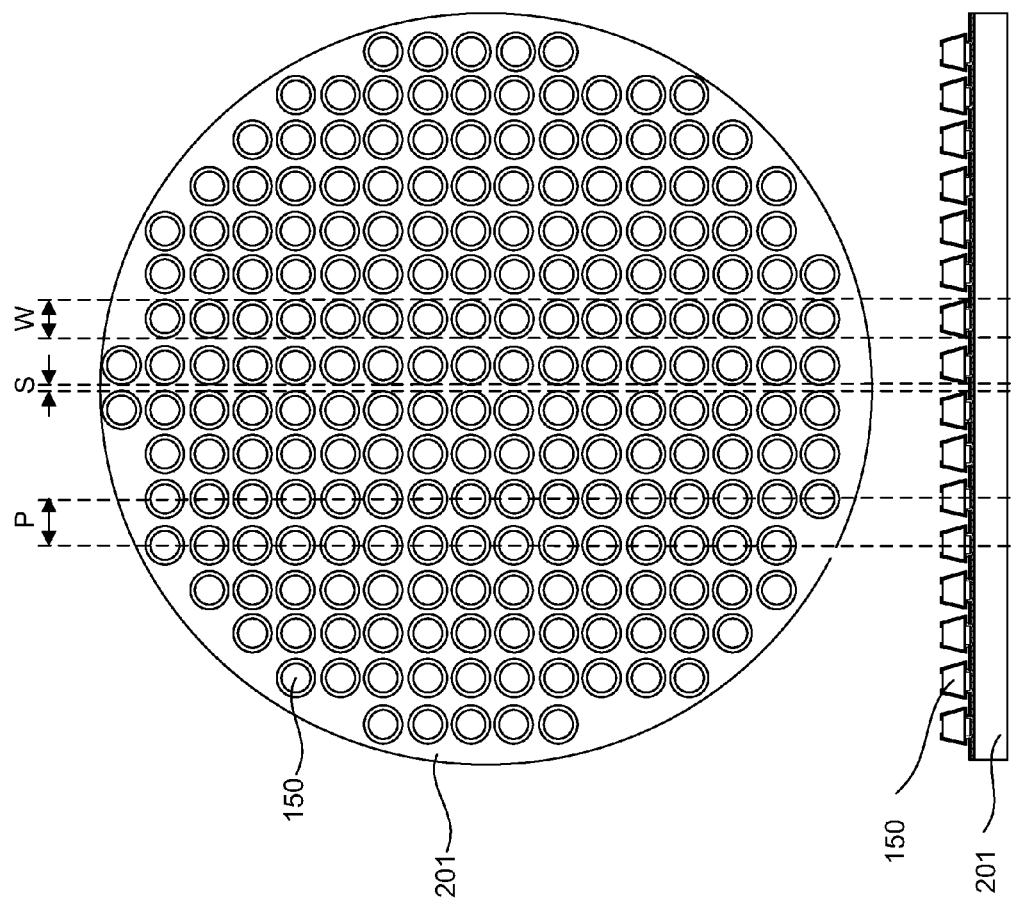

FIGS. 12A-12B include top and cross-sectional side view illustrations of a carrier substrate 201 and array of micro LED structures in accordance with an embodiment of the invention. In the particular embodiments illustrated, the arrays are produced from micro LED structures in FIG. 11. However, it is to be appreciated that FIGS. 12A-12B are meant to be exemplary, and that the array of micro LED structures can be formed from any of the micro LED structures previously described. In the embodiment illustrated in FIG. 12A, each individual micro p-n diode 150 is illustrated as a pair of concentric circles having different diameters or widths corresponding the different widths of the top and bottom surfaces of the micro p-n diode 150, and the corresponding tapered sidewalls spanning between the top and bottom surfaces. In the embodiment illustrated in FIG. 12B, each individual micro p-n diode 150 is illustrated as a pair of concentric squares with tapered or rounded corners, with each square having a different width corresponding to the different widths of the top and bottom surfaces of the micro p-n diode 150, and the corresponding tapered sidewalls spanning from the top and bottom surfaces. However, embodiments of the invention do not require tapered sidewalls, and the top and bottom surfaces of the micro p-n diode 150 may have the same diameter, or width, and vertical sidewalls. As illustrated in FIGS. 12A-12B the array of micro LED structures is described as having a pitch (P), spacing (S) between each micro LED structure and maximum width (W) of each micro LED structure. In order for clarity and conciseness, only x-dimensions are illustrated by the dotted lines in the top view illustration, though it is understood that similar y-dimensions may exist, and may have the same or different dimensional values. In the particular embodiments illustrated in FIGS. 12A-12B, the x- and y-dimensional values are identical in the top view illustration. In one embodiment, the array of micro LED structures may have a pitch (P) of 10 µm, with each micro LED structure having a spacing (S) of 2 µm and maximum width (W) of 8 µm. In another embodiment, the array of micro LED structures may have a pitch (P) of 5 µm, with each micro LED structure having a spacing (S) of 2 µm and maximum width (W) of 3 µm. However, embodiments of the invention are not limited to these specific dimensions, and any suitable dimension may be utilized.

An embodiment of a method of transferring a micro LED structure to a receiving substrate is described in FIG. 13. In such an embodiment a carrier substrate is provided having an array of micro LED structures disposed thereon. As described above, each micro LED structure may include a micro p-n diode, a reflective metallization stack below a bottom surface of the micro p-n diode, and an electrically insulating spacer laterally surrounding and spanning a portion of the sidewalls of the reflective metallization stack, with the reflective metallization stack being between the micro p-n diode and a bonding layer on the carrier substrate. As described above, the bonding layer may be a single bonding layer, an alloy bonding layer, or a fusion bonded bonding layer. The electrically insulating spacer may optionally span a portion of the bottom surface of the reflective metallization stack and/or a portion of the bottom surface of the micro p-n diode. A conformal dielectric barrier layer may optionally span sidewalls of the micro p-n diode. The conformal dielectric barrier layer may additionally span a portion of the bottom surface of the micro p-n diode. At operation 1310 a phase change is created in the bonding layer for at least one of the micro LED structures. For example, the phase change may be associated with heating the bonding layer above a melting temperature or liquidus temperature of a material forming the bonding layer. The micro p-n diode, reflective metallization stack, and electrically insulating spacer, and optionally a portion of the conformal dielectric barrier layer for at least one of the micro LED structures, and optionally a portion of bonding layer may then be picked up with a transfer head at operation 1320 and then placed on a receiving substrate at operation 1330.

Figure 14:
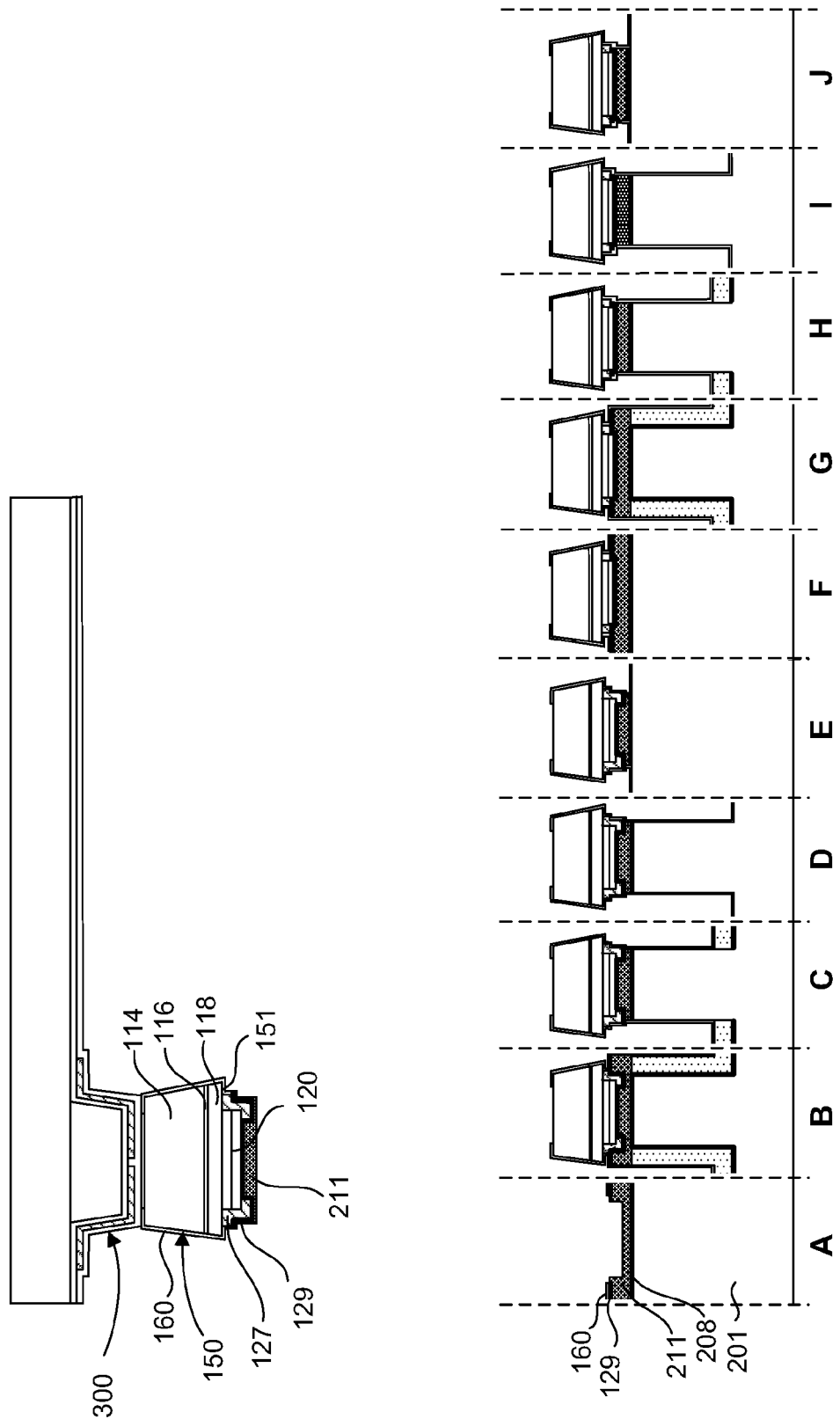
FIG. 14 is a cross-sectional side view illustration of a transfer head picking up a micro LED structure from a carrier substrate in accordance with an embodiment of the invention.

A general illustration of operation 1320 in accordance with an embodiment is provided in FIG. 14 in which a transfer head 300 picks up a micro p-n diode 150, reflective metallization stack 120, electrically insulating spacer 127, a portion of the conformal dielectric barrier layer 160 for at least one of the micro LED structures, and a portion of alloy bonding layer 211. The micro LED structure of Example A which has been picked up is slightly enlarged in comparison to the other exemplary micro LED structures in the illustration. In the particular embodiment illustrated a conformal dielectric barrier layer 260 has been formed, however, in other embodiments a conformal dielectric barrier layer may not be present. In some embodiments a portion of alloy bonding layer 211, such as approximately half, may be lifted off with the micro LED structure. While a specific micro LED structure including micro p-n diode 150 of Example A is illustrated, it is understood than any of the micro LED structures including any of the micro p-n diodes 150 described herein may be picked up. In addition, while the embodiment illustrated in FIG. 14 shows a transfer head 300 picking up a single micro LED structure, transfer head 300 or a plurality of transfer heads 300 may pick up a group of micro LED structures in other embodiments.

Still referring to FIG. 14, in the particular embodiment illustrated the bottom surface of the micro p-n diode 150 is wider than the top surface of the reflective metallization stack 120, and the conformal dielectric barrier layer 160 spans the sidewalls of the micro p-n diode 150, a portion of the bottom surface of the micro p-n diode 150. In one aspect, the portion of the conformal dielectric barrier layer 160 wrapping underneath the micro p-n diode 150 protects the conformal dielectric barrier layer 160 on the sidewalls of the micro p-n diode 150 from chipping or breaking during the pick up operation with the transfer head 300. Stress points may be created in the conformal dielectric barrier layer 160 adjacent the electrically insulating spacers 127 or alloy bonding layer 211, particularly at corners and locations with sharp angles. Upon contacting the micro LED structure with the transfer head 300 and/or creating the phase change in the alloy bonding layer, these stress points become natural break points in the conformal dielectric barrier layer 160 at which the conformal dielectric layer can be cleaved. In an embodiment, the conformal dielectric barrier layer 160 is cleaved at the natural break points after contacting the micro LED structure with the transfer head and/or creating the phase change in the alloy bonding layer, which may be prior to or during picking up the micro p-n diode and the reflective metallization stack. As previously described, in the liquid state the alloy bonding layer may smooth out over the underlying structure in response to compressive forces associated with contacting the micro LED structure with the transfer head. In an embodiment, after contacting the micro LED structure with the transfer head, the transfer head is rubbed across a top surface of the micro LED structure prior to creating the phase change in the alloy bonding layer. Rubbing may dislodge any particles which may be present on the contacting surface of either of the transfer head or micro LED structure. Rubbing may also transfer pressure to the conformal dielectric barrier layer. Thus, both transferring a pressure from the transfer head 300 to the conformal dielectric barrier layer 160 and heating the alloy bonding layer above a liquidus temperature of the alloy bonding layer can contribute to cleaving the conformal dielectric barrier layer 160 at a location underneath the micro p-n diode 150 and may preserve the integrity of the micro LED structure and quantum well layer 116.

In an embodiment, the bottom surface of the micro p-n diode 150 is wider than the top surface of the reflective metallization stack 120, and the electrically insulating spacers 127 have been etched back underneath the bottom surface of the micro p-n diode to the extent that there is room for the conformal dielectric barrier layer 160 to be formed on the bottom surface of the micro p-n diode 150 and create break points, though this distance may also be determined by lithographic tolerances. In an embodiment, a 0.25 μm to 1 μm distance on each side of the micro p-n diode 150 accommodates a 50 angstrom to 600 angstrom thick conformal dielectric barrier layer 160.

In the particular embodiment illustrated in FIG. 14, Example A, the unpatterned thin adhesion layer 129 is also cleaved, with a portion of the adhesion layer 129 being picked up with the micro LED structure. Stress points may also be created in the adhesion layer 129 adjacent the electrically insulating spacers 129 or alloy bonding layer 211. Upon contacting the micro LED structure with the transfer head 300 and/or creating the phase change in the alloy bonding layer, these stress points become natural break points in the adhesion layer 129 at which the adhesion layer can be cleaved. In an embodiment, the adhesion layer 129 is cleaved at the natural break points after contacting the micro LED structure with the transfer head and/or creating the phase change in the alloy bonding layer, which may be prior to or during picking up the micro p-n diode and the reflective metallization stack. In other embodiments, such as Examples C-E and H-J, the patterned adhesion layers 129 may be picked up with the micro LED structures without being cleaved.

A variety of suitable transfer heads can be utilized to aid in the pick up and placement operations 1320, 1330 in accordance with embodiments of the invention. For example, the transfer head 300 may exert a pick up pressure on the micro LED structure in accordance with vacuum, magnetic, adhesive, or electrostatic principles in order to pick up the micro LED structure.

Figure 15:
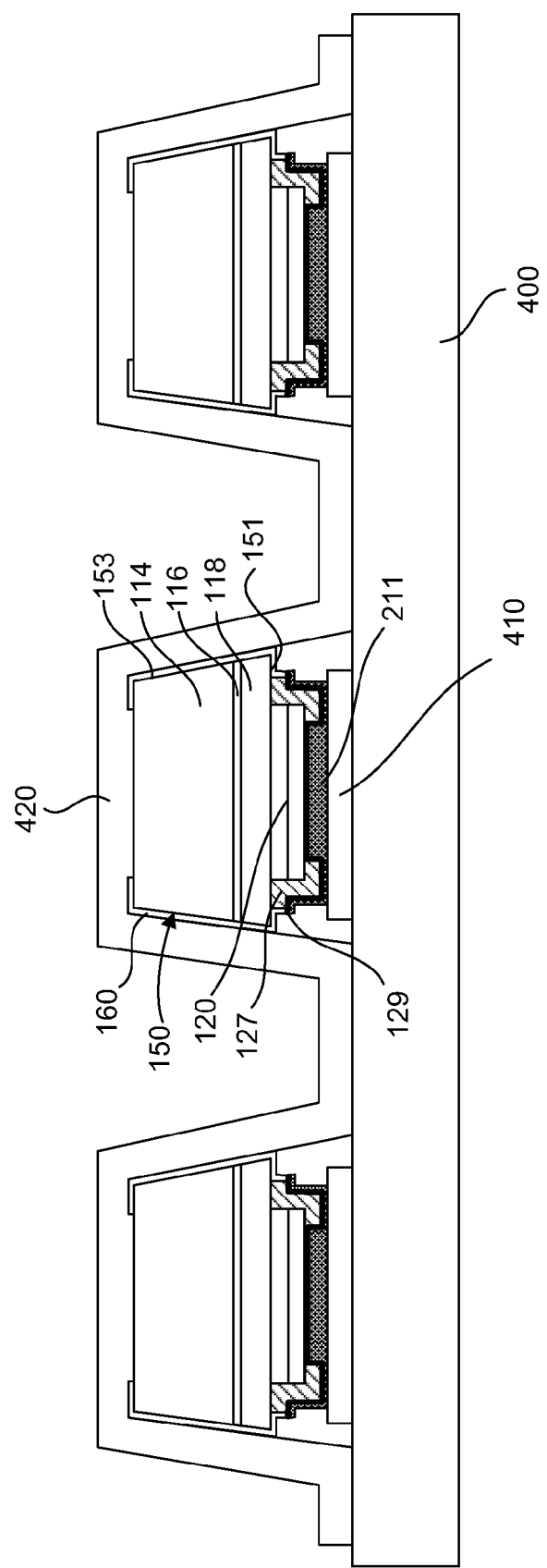
FIG. 15 is a cross-sectional side view illustration of a receiving substrate with a micro LED structure in accordance with an embodiment of the invention.

FIG. 15 is an illustration of a receiving substrate 400 onto which a plurality of micro LED structures have been placed in accordance with an embodiment of the invention. For example, the receiving substrate may be, but is not limited to, a display substrate, a lighting substrate, a substrate with functional devices such as transistors, or a substrate with metal redistribution lines. In the particular embodiment illustrated, each micro LED structure may be placed over a driver contact 410. A common contact line 420 may then be formed over the series of micro p-n diodes 150. As illustrated, the tapered sidewalls of the micro p-n diodes 150 may provide a topography which facilitates the formation of a continuous contact line. In an embodiment, the common contact line 420 can be formed over a series of red-emitting, green-emitting or blue-emitting micro LEDs. In certain embodiments, the common contact line 420 will be formed from a transparent contact material such as indium tin oxide (ITO). In one embodiment, the plurality of micro LEDs may be arranged into pixel groups of three including a red-emitting micro LED, green-emitting micro LED, and a blue-emitting micro LED.

In one embodiment, the p-n diode 150 may include a top n-doped layer 114 with a thickness of approximately 0.1 μm-3 μm, quantum well layer 116 (which may be SQW or MQW) with a thickness less than approximately 0.3 μm, and lower p-doped layer 118 with thickness of approximately 0.1 μm-1 μm. In an embodiment, top n-doped layer 114 may be 0.1 μm-6 μm thick (which may include or replace bulk layer 112 previously described). In a specific embodiment, p-n diodes 150 may be less than 3 μm thick, and less than 10 μm wide.

Figure 16:
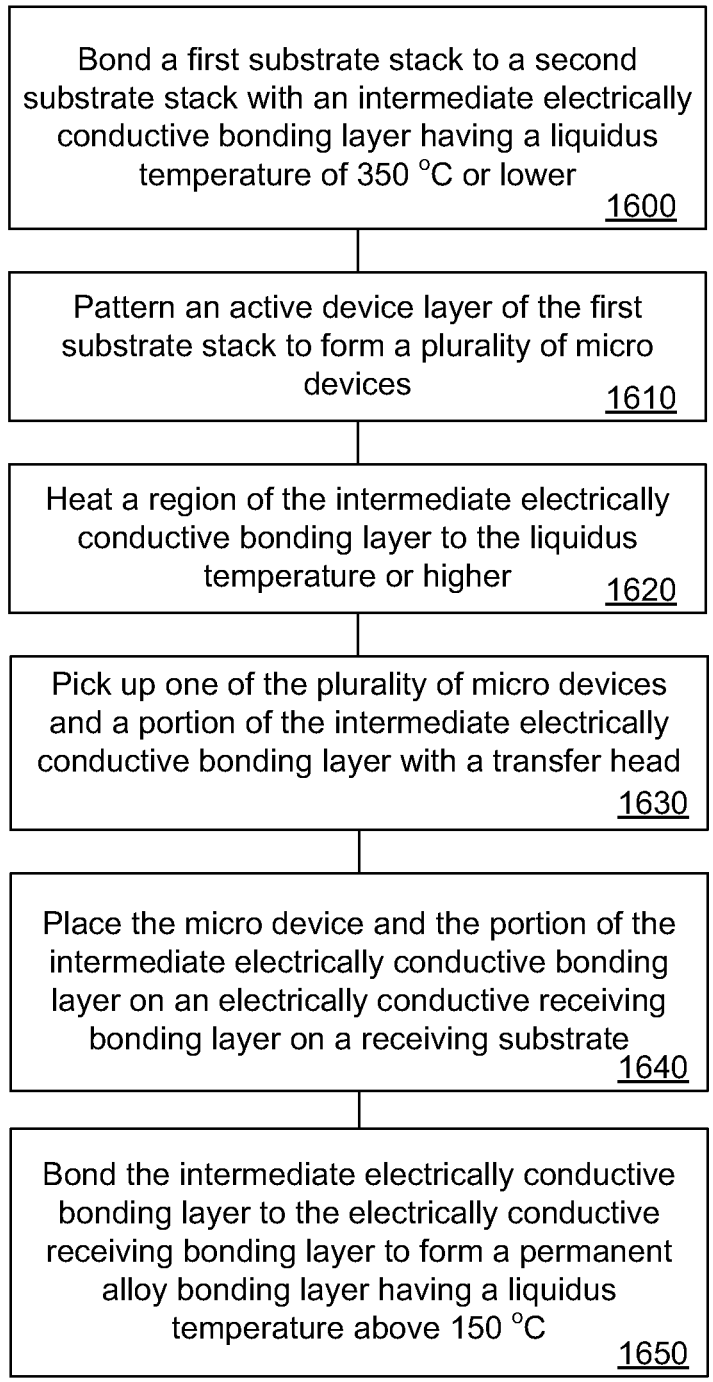
FIG. 16 is a flow chart illustrating a method of fabricating an array of micro devices in accordance with an embodiment of the invention.

FIG. 16 is a flow chart illustrating a method of fabricating an array of micro devices in accordance with an embodiment of the invention. At operation 1600 a first substrate stack is bonded to a second substrate stack with an intermediate electrically conductive bonding layer having a liquidus temperature of 350° C. or lower, or more specifically 200° C. or lower. The intermediate bonding layer can be formed from any of the materials listed in Table 1 above, as well as aluminum as related to FIG. 4C. For example, the intermediate bonding layer can be a pure metal layer or alloy metal layer. In an embodiment, the intermediate bonding layer includes indium or tin, and may be an indium-based or tin-based solder material. The intermediate electrically conductive bonding layer can additionally include a component such as bismuth, silver, gold, gallium, zinc, copper, aluminum, lead, and cadmium.

In an embodiment, the intermediate electrically conductive bonding layer is formed by bonding a first electrically conductive bonding layer of the first substrate stack to a second electrically conductive bonding layer of the second substrate stack. For example, this can be accomplished by fusion bonding the first and second electrically conductive bonding layers when formed of the same material. The intermediate electrically conductive bonding layer can also be formed by alloy bonding the first electrically conductive bonding layer to a second electrically conductive bonding layer formed of a different material. In such a case, the compositions and thicknesses of the bonding layers can be controlled to achieve the desired liquidus temperature of the intermediate electrically conductive bonding layer. Bonding the first electrically conductive bonding layer to the second electrically conductive bonding layer can including maintaining the two electrically conductive bonding layers at an elevated temperature above a liquidus temperature of one of the two electrically conductive bonding layers.

At operation 1610 an active device layer of the first substrate stack is then patterned to form a plurality of micro devices. The active device layer may include a p-n diode layer, as well as a quantum well layer for the formation of micro LED devices as described with regard to FIGS. 1A-12B. Following the formation of the plurality of micro devices, a region of the intermediate electrically conductive bonding layer is heated to its liquidus temperature or higher at operation 1620. For example, heating can include transferring heat from an underlying substrate and/or a transfer head. At least one of the plurality of the micro devices is then picked up, along with a portion of the intermediate electrically conductive bonding layer, with the transfer head. In an embodiment, a substantial portion of the intermediate electrically conductive bonding layer is picked up.

Figure 17:
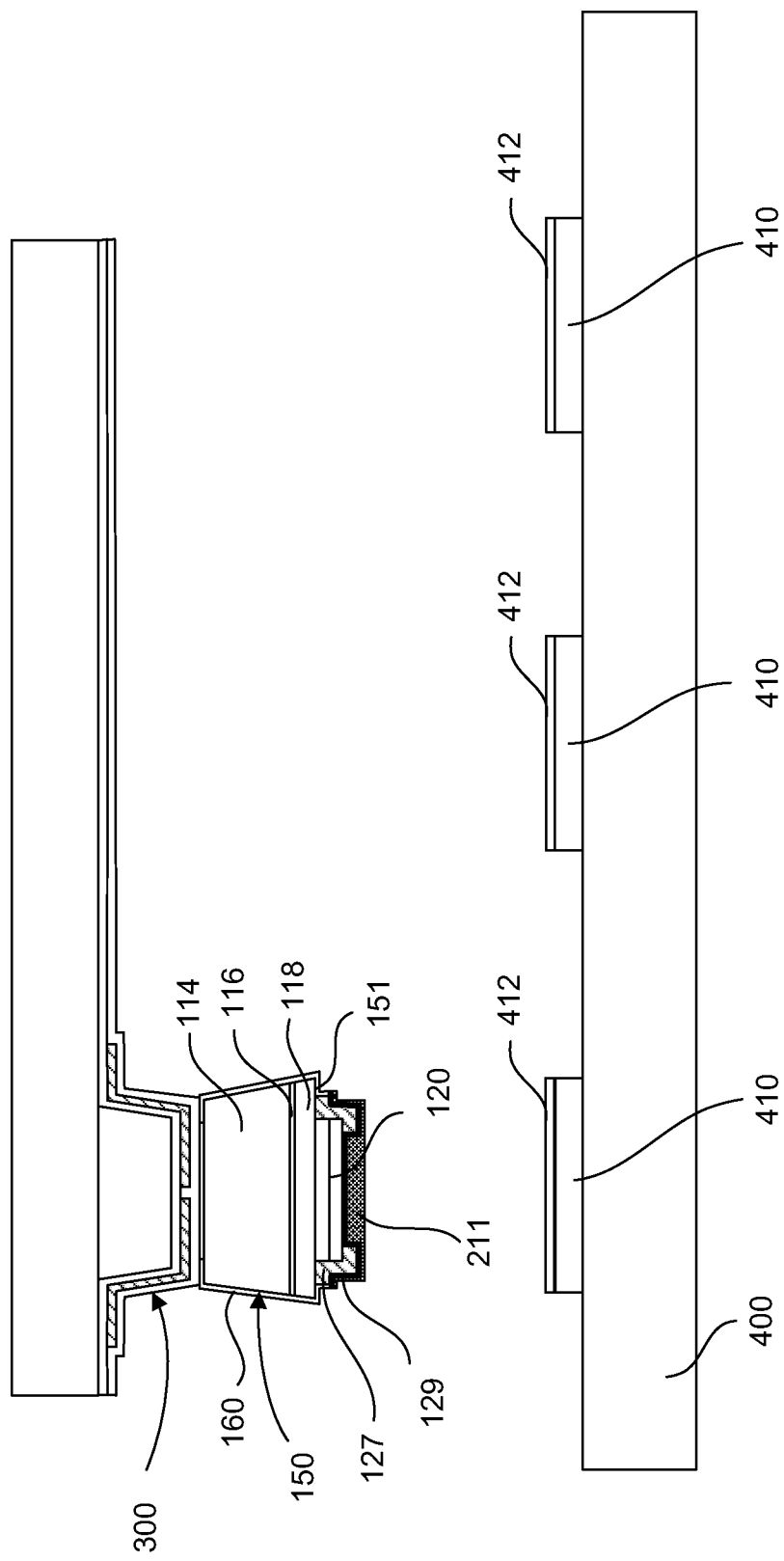
FIG. 17 is a cross-sectional side view illustration of a receiving substrate with an electrically conductive bonding layer in accordance with an embodiment of the invention.
Figure 18:
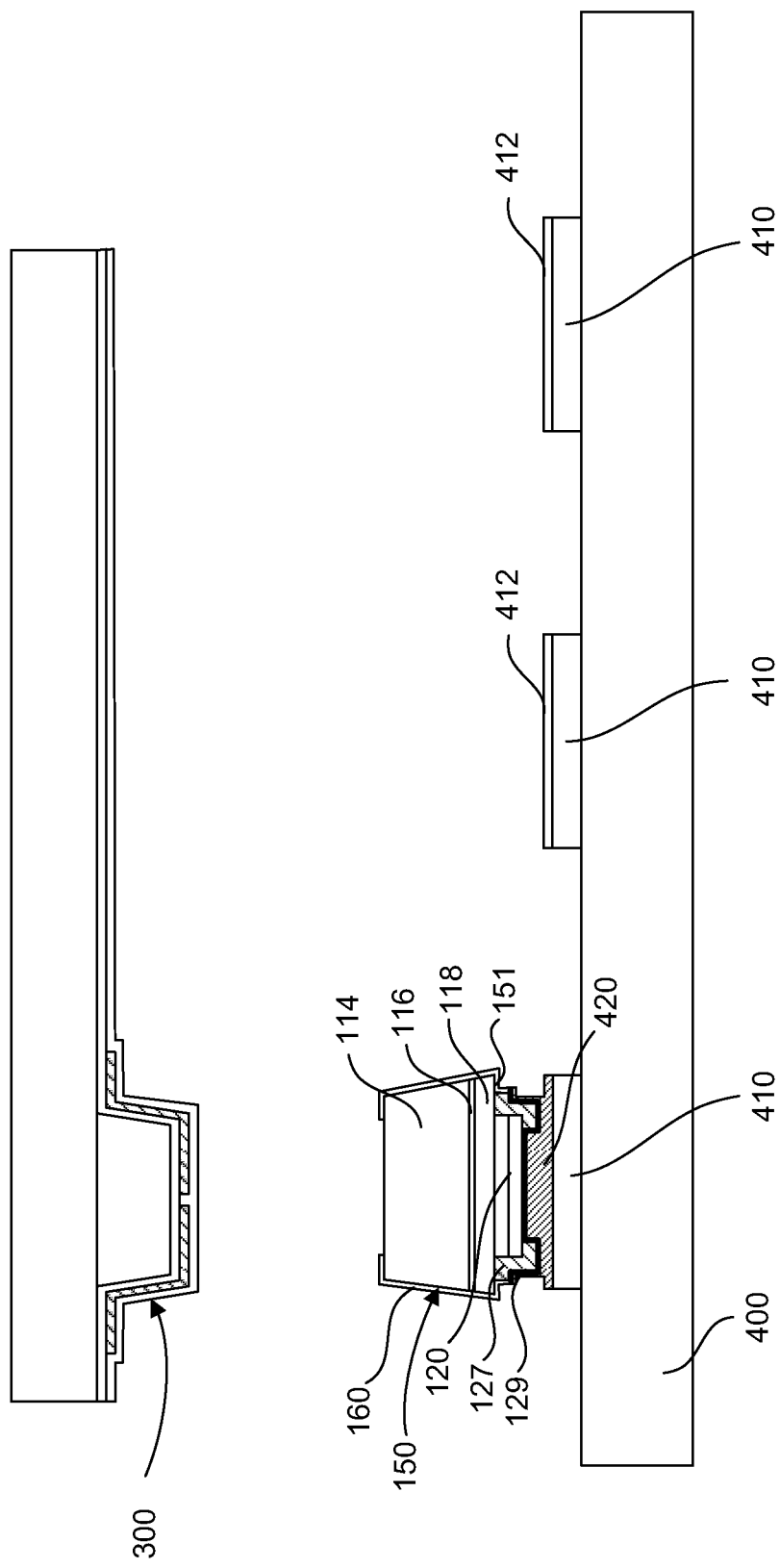
FIG. 18 is a cross-sectional side view illustration of a micro LED structure bonded to a receiving substrate in accordance with an embodiment of the invention.

FIG. 17 is a cross-sectional side view illustration of a receiving substrate 400 with an electrically conductive receiving bonding layer 412 and a contact pad 410 in accordance with an embodiment of the invention. As illustrated, the transfer head 300 has picked up a micro device and a substantial portion of an intermediate electrically conductive bonding layer, illustrated as alloy bonding layer 211. The micro device and the portion of the intermediate electrically conductive bonding layer 211 are then placed on an electrically conductive receiving bonding layer 412 on a receiving substrate at operation 1640. Referring now to FIG. 18, at operation 1650 the intermediate electrically conductive bonding layer is bonded to the electrically conductive receiving bonding layer to form a permanent alloy bonding layer 420 having a liquidus temperature above 150° C. The micro device may then be released by the transfer head 300 as illustrated. In accordance with embodiments of the invention, the liquidus temperature of the permanent alloy bonding layer 420 is sufficient to withstand post-processing packaging operations such as flip chip bonding of controller circuitry or protective sealing. Such processes may be performed at temperatures, of up to 200° C., or even 250° C. Accordingly, in an embodiment the liquidus temperature of the permanent alloy bonding layer 420 is greater than 200° C., or even 250° C.

The electrically conductive receiving bonding layer 412 may have a higher liquidus temperature than the intermediate electrically conductive bonding layer 211. In an embodiment, the intermediate electrically conductive bonding layer 211 is an indium or tin based material and the electrically conductive receiving bonding layer 412 a material of a higher liquidus temperature such as silver or gold. In an embodiment, the permanent alloy bonding layer 420 has a higher liquidus temperature than the intermediate electrically conductive bonding layer 211 in order to withstand post-processing packaging operations and to provide device durability.

The thicknesses and compositions of the electrically conductive receiving bonding layer 412 and the portion of the intermediate electrically conductive bonding layer 211 which is picked up with the micro device are controlled to achieve a desired alloy concentration in the permanent alloy bonding layer 420. In accordance with embodiments of the invention, the bonding interface produced with bonding layers 211, 412 may be stronger than the bonding interface using a single bonding layer. The increased bonding interface strength can provide additional structural integrity to the micro device during post-process and during desired use.

While embodiments of the invention describe forming a permanent alloy bonding layer 420 from a separate electrically conductive receiving bonding layer 412, embodiments are not limited to such. In an embodiment, the intermediate electrically conductive bonding layer 211 forms a permanent alloy bonding layer 420 with a portion of contact 410, which may be metallic. In another embodiment, contact 410 is an electrically conductive non-metallic material such as indium-tin oxide. For example, an indium or indium alloy intermediate electrically conductive bonding layer 211 may form an adhesion bond with the indium-tin oxide contact 410 and diffuse into the indium-tin oxide.

In an embodiment, bonding the intermediate electrically conductive bonding layer 211 to the electrically conductive receiving bonding layer 412 can include maintaining the intermediate electrically conductive bonding layer 211 and the electrically conductive receiving bonding layer 412 at an elevated temperature above a liquidus temperature of the intermediate electrically conductive bonding layer 211. Bonding of the intermediate electrically conductive bonding layer 211 to the electrically conductive receiving bonding layer 412 can also include transferring heat to the intermediate electrically conductive bonding layer with the transfer head 300.

In certain embodiments, a substantial portion of the intermediate electrically conductive bonding layer is released onto the receiving substrate with a corresponding micro device. In such embodiments, a substantial portion may corresponding to a sufficient amount of intermediate electrically conductive bonding layer to alter the liquidus temperature of the electrically conductive receiving bonding layer when forming the permanent alloy bonding layer. In other embodiments, a substantial portion may correspond to a significant quantity which can affect bonding to the receiving substrate.

While FIGS. 16-18 describe the transfer of a single micro device, the method is also applicable to the transfer of an array of micro devices. For example, operation 1620 may include heating a plurality of regions of the intermediate electrically conductive bonding layer to its liquidus temperature or higher. Operation 1630 may include picking up a corresponding plurality of the micro devices and a corresponding plurality of portions of the intermediate electrically conductive bonding layer with a corresponding plurality of transfer heads. Operation 1640 may include placing the plurality of micro devices and plurality of portions of the intermediate bonding layer on a corresponding plurality of locations of the electrically conductive receiving bonding layer on the receiving substrate. Operation 1650 may include bonding the plurality of portion of the intermediate electrically conductive bonding layer to the corresponding plurality of locations of the electrically conductive receiving bonding layer to form a corresponding plurality of permanent alloy bonding layers having a liquidus temperature above 150° C., or more specifically above 200° C. or above 250° C.

In another aspect, embodiments of the invention describe a manner for mass transfer of an array of pre-fabricated micro devices with an array of transfer heads. A transfer tool including an array of transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices. Each transfer head in the array of transfer heads may also be independently controllable, which enables selective pick up and release of the micro devices.

Without being limited to a particular theory, embodiments of the invention describe micro device transfer heads and head arrays which operate in accordance with principles of electrostatic grippers, using the attraction of opposite charges to pick up micro devices. In accordance with embodiments of the present invention, a pull-in voltage is applied to a micro device transfer head in order to generate a grip force on a micro device and pick up the micro device. Grip force is proportional to charged plate area so is calculated as a pressure. According to ideal electrostatic theory, a non-electrically conductive dielectric layer between a monopolar electrode and an electrically conductive substrate yields a grip pressure in Pascal (Pa) in equation (1) of:

$$P=[\epsilon_o/2][V\epsilon_r/d]^2 \qquad (1)$$

where $\epsilon_o=8.85 \cdot 10^{-12}$, V=electrode-substrate voltage in volts (V), $\epsilon_r$=dielectric constant, and d=dielectric thickness in meters (m). With a bipolar gripper using two grip electrodes the voltage (V) in the above equation is half of the voltage between electrodes A and B, $[V_A-V_B]/2$. The substrate potential is centered at the average potential, $[V_A=V_B]/2$. This average is generally zero with $V_A=[-V_B]$.

In another aspect, embodiments of the invention describe a bonding layer which can maintain a micro device on a carrier substrate during certain processing and handling operations, and upon undergoing a phase change provides a medium on which the micro device can be retained yet is also readily releasable from during a pick up operation. For example, the bonding layer may be remeltable or reflowable such that the bonding layer undergoes a phase change from solid to liquid state prior to or during the pick up operation. In the liquid state the bonding layer may retain the micro device in place on a carrier substrate while also providing a medium from which the micro device is readily releasable. Without being limited to a particular theory, in determining the grip pressure which is necessary to pick up the micro device from the carrier substrate the grip pressure should exceed the forces holding the micro device to the carrier substrate, which may include but are not limited to, surface tension forces, capillary forces, viscous effects, elastic restoration forces, van-der-Waals forces, stiction and gravity.

Figure 19A:
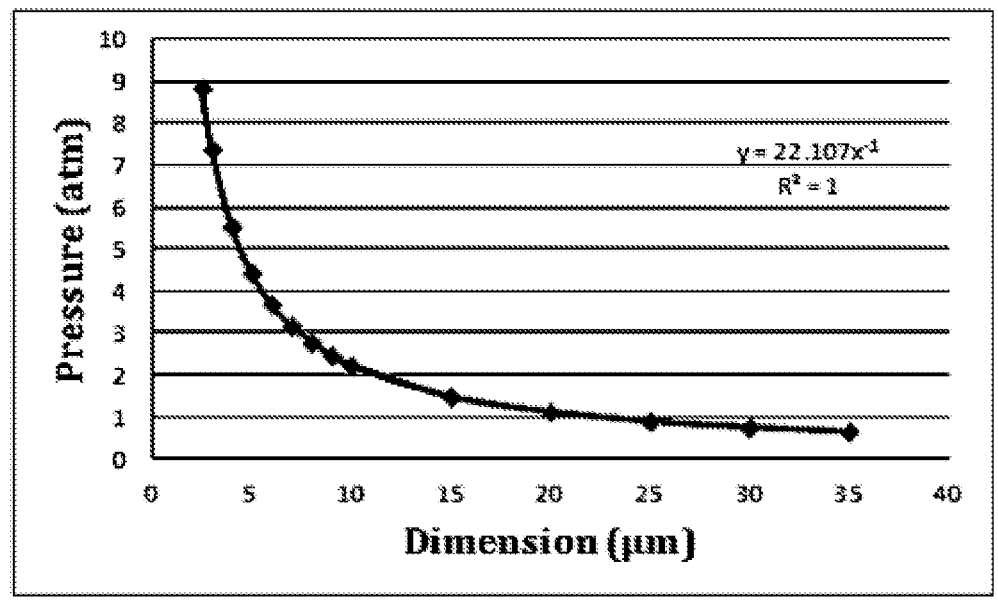
FIG. 19A is a graphical illustration showing the pressure required to overcome the force of surface tension to pick up a micro device of various dimensions in accordance with an embodiment of the invention.

In accordance with embodiments of the invention, when the dimensions of a micro device are reduced below a certain range, the surface tension forces of the liquid bonding layer holding the micro device to the carrier substrate may become dominant over other forces holding the micro device. FIG. 19A is a graphical illustration of one embodiment obtained by modeling analysis showing the pressure required to overcome the force of surface tension to pick up a micro device of various dimensions, assuming a liquid indium (In) bonding layer with a surface tension of 560 mN/m at the melting temperature of 156.7° C. For example, referring to FIG. 19A an exemplary 10 μm by 10 μm wide micro device is retained on a carrier substrate with a surface tension pressure of approximately 2.2 atmospheres (atm) with an indium bonding layer having a liquid surface tension of 560 mN/m at its melting temperature of 156.7° C. This is significantly larger than the pressure due to gravity, which is approximately 1.8×$10^{-6}$ atm for an exemplary 10 μm×10 μm wide×3 μm tall piece of gallium nitride (GaN).

Figure 19B:
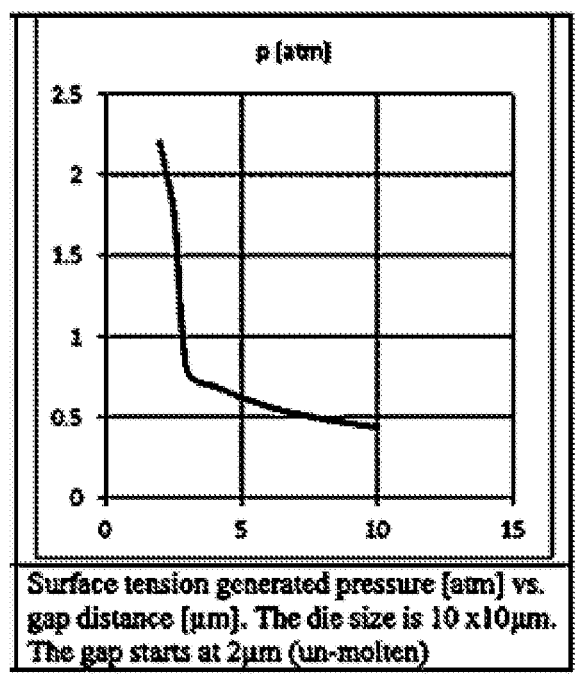
FIG. 19B is a graphical illustration of the relationship between surface tension and increasing gap distance created during a pick up operation in accordance with an embodiment of the invention.

Surface tension pressures and viscous effects may also be dynamic during the pick up operation. FIG. 19B is a graphical illustration of one embodiment obtained by modeling analysis showing the relationship of surface tension and increasing gap distance created during the pick up operation of an exemplary 10 μm by 10 μm wide micro device retained on a carrier substrate with a molten indium (In) bonding layer. The gap distance along the x-axis referred to in FIG. 19B is the distance between the bottom of the micro device and the carrier substrate, and starts at 2 μm corresponding to an un-molten thickness of the In bonding layer. As illustrated in FIG. 19B, a surface tension pressure of 2.2 atm along the y-axis is initially overcome by the grip pressure at the beginning of the pick up operation. As the micro device is then lifted from the carrier substrate, the surface tension rapidly falls, with the pressure leveling out as the micro device is lifted further away from the carrier substrate.

Figure 19C:
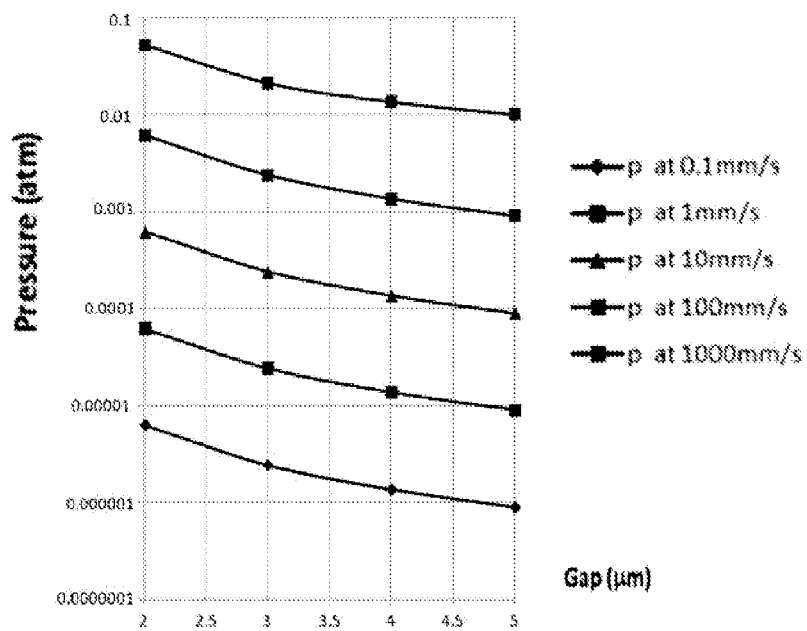
FIG. 19C is a graphical illustration of the relationship between viscous force pressures and increasing gap distance created during a pick up operation at various pull rates in accordance with an embodiment of the invention.

FIG. 19C is a graphical illustration of one embodiment obtained by modeling analysis showing the relationship of viscous force pressures (atm) and increasing gap distance (μm) created during a pick up operation at various pull rates for an exemplary 10 μm by 10 μm micro device retained on a carrier substrate with a molten indium (In) bonding layer. The gap distance referred to in FIG. 19C is the distance between the bottom of the micro device and the carrier substrate, and starts at 2 μm corresponding to an un-molten thickness of the In bonding layer. As illustrated, viscous force pressures are more apparent during faster lift speeds such as 1,000 mm/s than for slower lift speeds such as 0.1 mm/s. Yet, the pressures generated from the viscous effects using the exemplary lift speeds illustrated in FIG. 19C are significantly less than the surface tension pressure generated and illustrated in FIG. 19B which suggests that surface tension pressure is the dominant pressure which must be overcome by the grip pressure during the pick up operation.

If an air gap of size (g) is present between the dielectric layer of the micro device transfer head and a top electrically conductive surface of the micro device then the grip pressure in equation (2) is:

$$P=[\epsilon_o/2][V\epsilon_r/(d+\epsilon_r g)]^2 \quad (2)$$

It is contemplated that an air gap can be present due to a variety of sources including, but not limited to, particulate contamination, warpage, and misalignment of either surface of the transfer head or micro device, or the presence of an additional layer on the transfer head or micro device, such as a lip of a conformal dielectric barrier layer around the top electrically conductive surface of a micro device. In a embodiment, a lip of a conformal dielectric barrier layer may create both an air gap where a contact opening is formed and increase the effective thickness of the dielectric layer of the transfer head where the lip is present.

As seen from equations (1) and (2) above, lower voltages may be utilized where no air gap is present between the micro device transfer head and micro device to be picked up. However, when an air gap is present this presents a series capacitance in which the air capacitance may compete with the dielectric layer capacitance. In order to compensate for the possibility of an air capacitance between any of an array of micro device transfer heads over a corresponding array of micro devices to be picked up, a higher operating voltage, higher dielectric constant for the dielectric material, or thinner dielectric material may be used to maximize the electric field. However, use of a higher electric field has limitations due to possible dielectric breakdown and arcing.

Figure 19D:
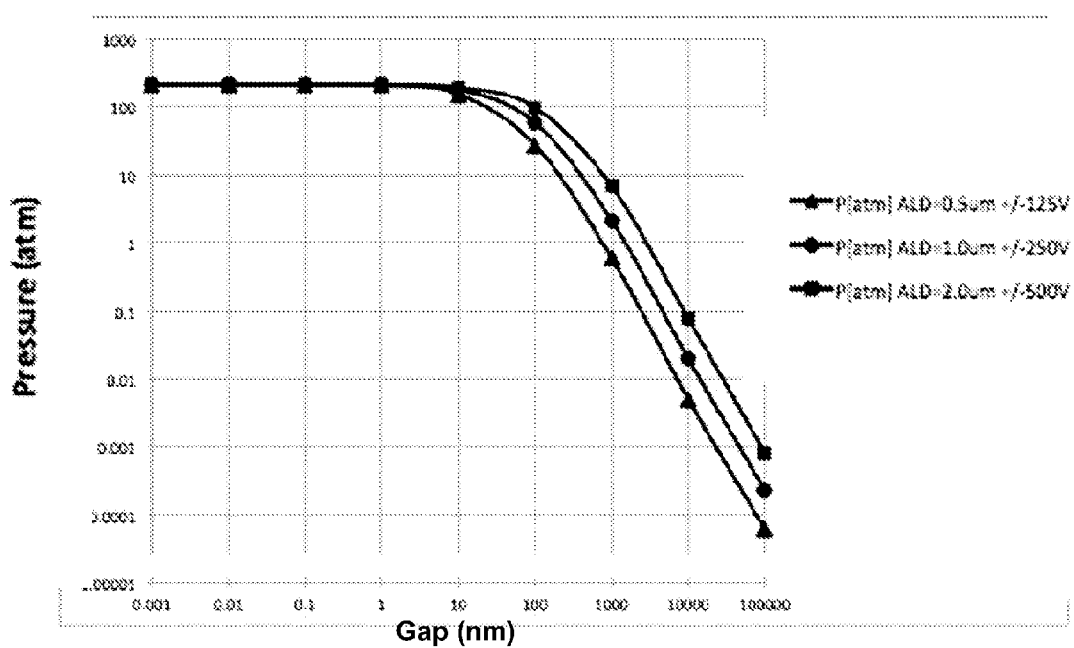
FIG. 19D is a graphical illustration obtained by modeling analysis showing the grip pressure exerted by a transfer head on a micro device as the transfer head is withdrawn from the micro device in accordance with an embodiment of the invention.

FIG. 19D is a graphical illustration of one embodiment obtained by modeling analysis showing the grip pressure exerted by a transfer head on a micro device as the transfer head is withdrawn from the top electrically conductive surface of the micro device, corresponding to an increasing air gap size. The different lines correspond to different $Ta_2O_5$ dielectric layer thicknesses between 0.5 μm and 2.0 μm on the transfer head, with the electric field being kept constant. As illustrated, no appreciable effect on grip pressure is observed at these conditions below air gap sizes of approximately 1 nm (0.001 μm), and even as high as 10 nm (0.01 μm) for some conditions. However, it is to be appreciated that the tolerable air gap can be increased or decreased by changing the conditions. Thus, in accordance with some embodiments of the invention a certain amount of air gap tolerance is possible during the pick up operation and actual contact with the micro device transfer head and the top electrically conductive surface of the micro device may not be necessary.

Now assuming that the grip pressure required to pick up the micro device from the carrier substrate should exceed the sum of pressures retaining the micro device on the carrier substrate (as well as any pressure reduction due to air gap) it is possible to derive the interrelationship of operating voltage, dielectric constant and dielectric thickness of the dielectric material in the micro device transfer head by solving the grip pressure equations. For purposes of clarity, assuming that the air gap distance is zero, for a monopolar electrode this becomes:

$$sqrt(P*2/\epsilon_o)=V\epsilon_r/d \quad (3)$$

Exemplary ranges of calculated dielectric thickness values are provided in Table 4 for desired grip pressures of 2 atm (202650 Pa) and 20 atm (2026500 Pa) for $Al_2O_3$ and $Ta_2O_5$ dielectric materials between operating voltages between 25 V and 300 V in order to illustrate the interdependence of grip pressure, voltage, dielectric constant and dielectric thickness in accordance with an embodiment of the invention. The dielectric constants provided are approximate, and it is understood that the values can vary depending upon manner of formation.

TABLE 4

| Dielectric Material | Voltage (V) | Dielectric constant, $\epsilon_r$ (Hz-MHz range) | Dielectric thickness, d (microns) |
|---|---|---|---|
| Grip pressure = 2 atm | | | |
| $Al_2O_3$ | 25 | 9.8 | 1.1 |
| $Al_2O_3$ | 100 | 9.8 | 4.6 |
| $Al_2O_3$ | 300 | 9.8 | 13.7 |
| $Ta_2O_5$ | 25 | 25 | 2.9 |
| $Ta_2O_5$ | 100 | 25 | 11.7 |
| $Ta_2O_5$ | 300 | 25 | 35.0 |
| Grip pressure = 20 atm | | | |
| $Al_2O_3$ | 25 | 9.8 | 0.4 |
| $Al_2O_3$ | 100 | 9.8 | 1.4 |
| $Al_2O_3$ | 300 | 9.8 | 4.3 |
| $Ta_2O_5$ | 25 | 25 | 0.9 |
| $Ta_2O_5$ | 100 | 25 | 3.7 |
| $Ta_2O_5$ | 300 | 25 | 11.1 |

Since the grip pressure is proportional to the inverse square of the dielectric thickness, the calculated dielectric thicknesses in Table 4 represents the maximum thicknesses which can be formed to achieve the necessary grip pressure with the set operating voltage. Thicknesses lower than those provided in Table 4 may result in higher grip pressures at the set operating voltage, however lower thicknesses increase the applied electric field across the dielectric layer which requires that the dielectric material possess a dielectric strength sufficient to withstand the applied electric field without shorting. It is to be appreciated that the grip pressure, voltage, dielectric constant and dielectric thickness values provided in Table 4 are exemplary in nature, and provided in order to provide a foundation for working ranges of the micro device transfer head in accordance with embodiments of the invention. The relationship between grip pressure, voltage, dielectric constant and dielectric thickness values provided in Table 4 has been illustrated in accordance with ideal electrostatic theory, and embodiments of the invention are not limited by such.

FIG. 20 is a cross-sectional side view illustration of a bipolar micro device transfer head and head array which operates according to electrostatic principles in order to pick up the micro LED structure in accordance with an embodiment of the invention. As illustrated, the micro device transfer head 300 may include a base substrate 302, a mesa structure 304 including a top surface 308 and sidewalls 306, an optional passivation layer 310 formed over the mesa structure 304 and including a top surface 309 and sidewalls 307, a pair of electrodes 316A, 316B formed over the mesa structure 304 (and optional passivation layer 310) and a dielectric layer 320 with a top surface 321 covering the electrodes 316A, 316B. Base substrate 302 may be formed from a variety of materials such as silicon, ceramics and polymers which are capable of providing structural support. In an embodiment, base substrate has a conductivity between $10^3$ and $10^{18}$ ohm-cm. Base substrate 302 may additionally include wiring (not shown) to connect the micro device transfer heads 300 to the working electronics of an electrostatic gripper assembly.

The mesa structures 304 generate a profile which protrudes away from the base substrate so as to provide a localized contact point to pick up a specific micro device during a pick up operation. In an embodiment, mesa structures 304 have a height of approximately 1 μm to 5 μm, or more specifically approximately 2 μm. Specific dimensions of the mesa structures 304 may depend upon the specific dimensions of the micro devices to be picked up, as well as the thickness of any layers formed over the mesa structures. In an embodiment, the height, width, and planarity of the array of mesa structures 304 on the base substrate 302 are uniform across the base substrate so that each micro device transfer head 300 is capable of making contact with each corresponding micro device during the pick up operation. In an embodiment, the width across the top surface 321 of each micro device transfer head is slightly larger, approximately the same, or less than the width of the top surface of the each micro device in the corresponding micro device array so that a transfer head does not inadvertently make contact with a micro device adjacent to the intended corresponding micro device during the pick up operation.

Mesa structure 304 has a top surface 308, which may be planar, and sidewalls 306. In an embodiment, sidewalls 306 may be tapered up to 10 degrees, for example. Tapering the sidewalls 306 may be beneficial in forming the electrodes 316 and electrode leads 314. Passivation layer 310 can be deposited by a variety of suitable techniques such as chemical vapor deposition (CVD), sputtering, or atomic layer deposition (ALD). In an embodiment, passivation layer 310 may be 0.5 μm-2.0 μm thick oxide such as, but not limited to, silicon oxide ($SiO_2$), aluminum oxide ($Al_2O_3$) or tantalum oxide ($Ta_2O_5$). Electrodes 316A, 316B may be a single layer or multiple layers. A variety of electrically conductive materials including metals, metal alloys, refractory metals, and refractory metal alloys may be employed to form electrodes 316A, 316B. In an embodiment, the electrodes 316A, 316B have a thickness up to 5,000 angstroms (0.5 μm). In an embodiment, the electrodes 316A, 316B include a high melting temperature metal such as platinum or a refractory metal or refractory metal alloy. For example, electrodes 316A, 316B may include platinum, titanium, vanadium, chromium, zirconium, niobium, molybdenum, ruthenium, rhodium, hafnium, tantalum, tungsten, rhenium, osmium, iridium and alloys thereof. Refractory metals and refractory metal alloys generally exhibit higher resistance to heat and wear than other metals. In an embodiment, electrodes 316A, 316B are approximately 500 angstrom (0.05 μm) thick titanium tungsten (TiW) refractory metal alloy.

Dielectric layer 320 has a suitable thickness and dielectric constant for achieving the required grip pressure of the micro device transfer head 300, and sufficient dielectric strength to not break down at the operating voltage. The dielectric layer may be a single layer or multiple layers. In an embodiment, the dielectric layer is 0.5 μm-2.0 μm thick, though thickness may be more or less depending upon the specific topography of the transfer head 300 and underlying mesa structure 304. Suitable dielectric materials may include, but are not limited to, aluminum oxide ($Al_2O_3$) and tantalum oxide ($Ta_2O_5$). Referring back to Table 4 above, embodiments of $Al_2O_3$ dielectric layers with applied electric fields (determined by dividing the voltage by dielectric thickness) of 22 V/μm to 71 V/μm and $Ta_2O_5$ dielectric layers with applied electric fields of 9 V/μm to 28 V/μm were provided. In accordance with embodiments of the invention, the dielectric layer 320 possesses a dielectric strength greater than the applied electric field so as to avoid shorting of the transfer head during operation. Dielectric layer 320 can be deposited by a variety of suitable techniques such as chemical vapor deposition (CVD), atomic layer deposition (ALD) and physical vapor deposition (PVD) such as sputtering. Dielectric layer 320 may additionally be annealed following deposition. In one embodiment, the dielectric layer 320 possesses a dielectric strength of at least 400 V/μm. Such a high dielectric strength can allow for the use of a thinner dielectric layer than the calculated thicknesses provided in exemplary Table 4. Techniques such as ALD can be utilized to deposit uniform, conformal, dense, and/or pin-hole free dielectric layers with good dielectric strength. Multiple layers can also be utilized to achieve such a pin-hole free dielectric layer 320. Multiple layers of different dielectric materials may also be utilized to form dielectric layer 320. In an embodiment, the underlying electrodes 316A, 316B include platinum or a refractory metal or refractory metal alloy possessing a melting temperature above the deposition temperature of the dielectric layer material(s) so as to not be a limiting factor in selecting the deposition temperature of the dielectric layer.

The following description corresponding to FIGS. 21-37 describes various manners for picking up a micro LED device and array of micro LED devices. It is be appreciated that while certain micro LED devices are described and illustrated in FIGS. 21-37, that the micro LED devices can be any of the micro LED device structures previously illustrated and described above with regard to FIGS. 1-15. Furthermore, reference to bonding layer 220 is made in the following description corresponding to FIGS. 21-37. It is to be appreciated that bonding layer 220 in the following description and FIGS. 21-37 can refer to bonding layer 210, a fusion bonded bonding layer, an alloy bonding layer 211, and an intermediate bonding layer as described above with regard to FIGS. 1-18.

Figure 21:
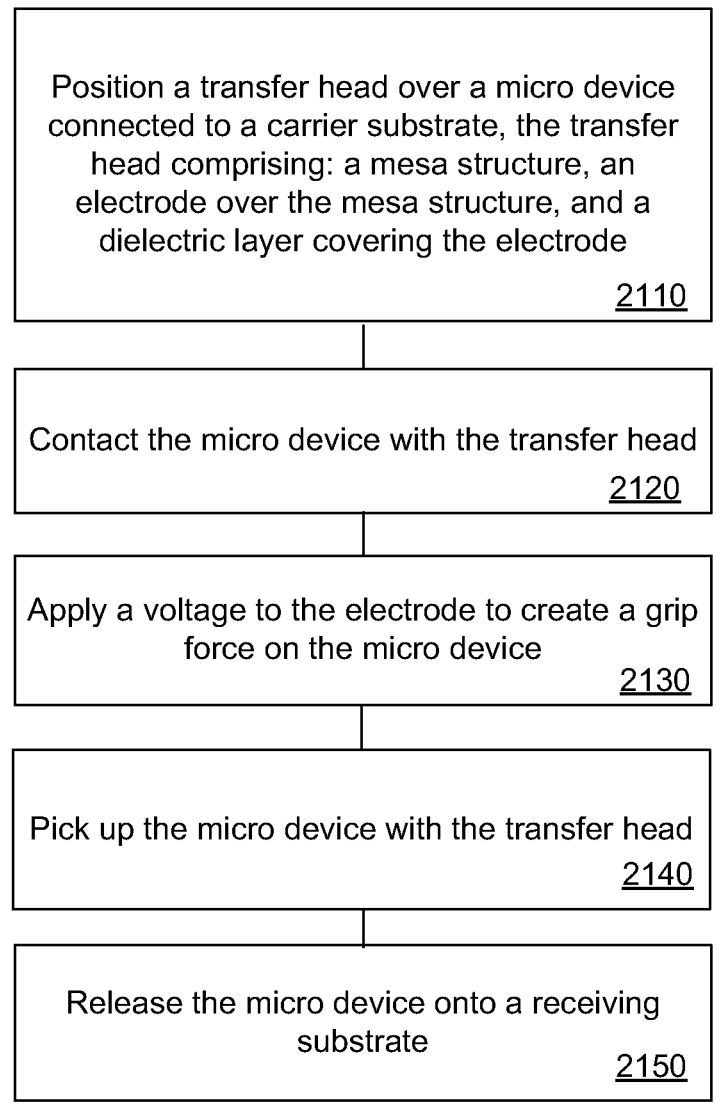
FIG. 21 is a flow chart illustrating a method of picking up and transferring a micro device from a carrier substrate to a receiving substrate in accordance with an embodiment of the invention.

FIG. 21 is a flow chart illustrating a method of picking up and transferring a micro device from a carrier substrate to a receiving substrate in accordance with an embodiment of the invention. At operation 2110 a transfer head is positioned over a micro device connected to a carrier substrate. The transfer head may comprise a mesa structure, an electrode over the mesa structure, and a dielectric layer covering the electrode as described in the above embodiments. The micro device is then contacted with the transfer head at operation 2120. In an embodiment, the micro device is contacted with the dielectric layer 320 of the transfer head. In an alternative embodiment, the transfer head is positioned over the micro device with a suitable air gap separating them which does not significantly affect the grip pressure, for example, 1 nm (0.001 μm) or 10 nm (0.01 μm). At operation 2130 a voltage is applied to the electrode to create a grip pressure on the micro device, and the micro device is picked up with the transfer head at operation 2140. The micro device is then released onto a receiving substrate at operation 2150.

While operations 2110-2150 have been illustrated sequentially in FIG. 21, it is to be appreciated that embodiments are not so limited and that additional operations may be performed and certain operations may be performed in a different sequence. For example, in one embodiment, after contacting the micro device with the transfer head, the transfer head is rubbed across a top surface of the micro device in order to dislodge any particles which may be present on the contacting surface of either of the transfer head or micro device. In another embodiment, an operation is performed to create a phase change in the bonding layer connecting the micro device to the carrier substrate prior to or while picking up the micro device. If a portion of the bonding layer is picked up with the micro device, additional operations can be performed to control the phase of the portion of the bonding layer during subsequent processing.

Operation 2130 of applying the voltage to the electrode to create a grip pressure on the micro device can be performed in various orders. For example, the voltage can be applied prior to contacting the micro device with the transfer head, while contacting the micro device with the transfer head, or after contacting the micro device with the transfer head. The voltage may also be applied prior to, while, or after creating the phase change in the bonding layer.

Where the transfer head includes a bipolar electrode, an alternating voltage is applied across the pair of electrodes 316A, 316B so that at a particular point in time when a negative voltage is applied to electrode 316A, a positive voltage is applied to electrode 316B, and vice versa in order to create the pick up pressure. Releasing the micro device from the transfer head may be accomplished with a variety of methods including turning off the voltage sources, lowering the voltage across the pair of electrodes, changing a waveform of the AC voltage, and grounding the voltage source.

Figure 22:
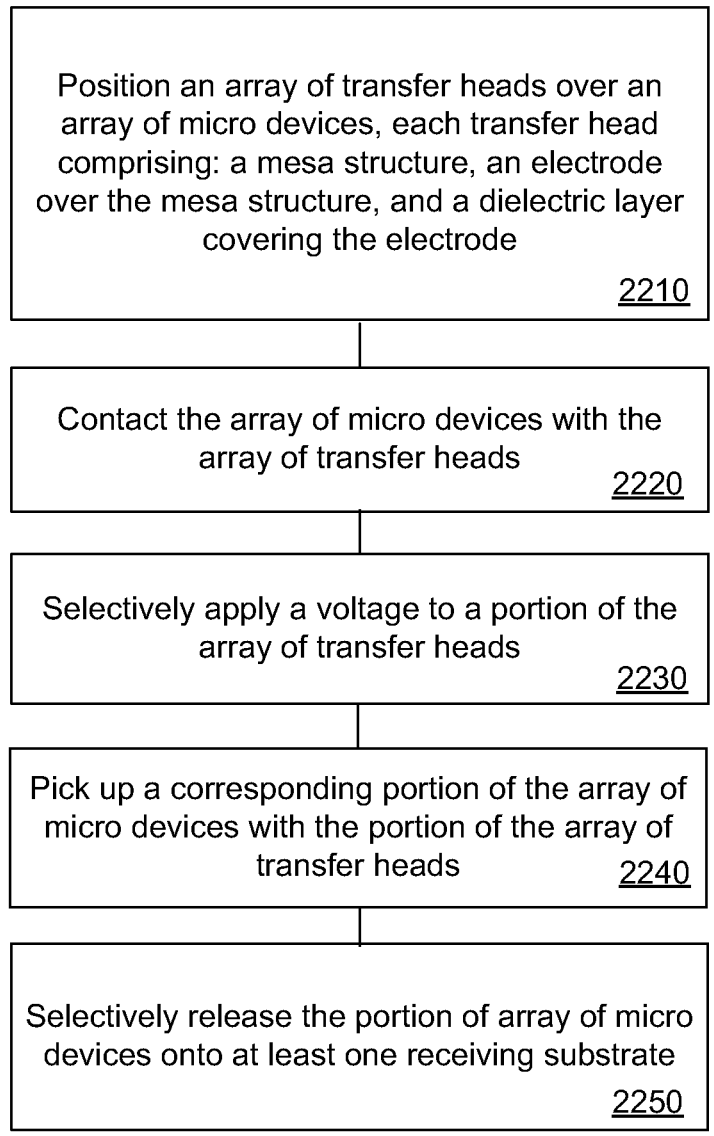
FIG. 22 is a flow chart illustrating a method of picking up and transferring an array of micro devices from a carrier substrate to at least one receiving substrate in accordance with an embodiment of the invention.

FIG. 22 is a flow chart illustrating a method of picking up and transferring an array of micro devices from a carrier substrate to at least one receiving substrate in accordance with an embodiment of the invention. At operation 2210 an array of transfer heads is positioned over an array of micro devices, with each transfer head having a mesa structure, an electrode over the mesa structure, and a dielectric layer covering the electrode. At operation 2220 the array of micro devices are contacted with the array of transfer heads. In an alternative embodiment, the array of transfer heads is positioned over the array of micro devices with a suitable air gap separating them which does not significantly affect the grip pressure, for example, 1 nm (0.001 µm) or 10 nm (0.01 µm). FIG. 23 is a side view illustration of an array of micro device transfer heads 300 in contact with an array of micro LED devices 100 in accordance with an embodiment of the invention. As illustrated in FIG. 23, the pitch (P) of the array of transfer heads 300 matches the pitch of the micro LED devices 100, with the pitch (P) of the array of transfer heads being the sum of the spacing (S) between transfer heads and width (W) of a transfer head.

In one embodiment, the array of micro LED devices 100 have a pitch of 10 µm, with each micro LED device having a spacing of 2 µm and a maximum width of 8 µm. In an exemplary embodiment, assuming a micro p-n diode 150 with straight sidewalls the top surface of the each micro LED device 100 has a width of approximately 8 µm. In such an exemplary embodiment, the width of the top surface 321 (see FIG. 20) of a corresponding transfer head 300 is approximately 8 µm or smaller so as to avoid making inadvertent contact with an adjacent micro LED device. In another embodiment, the array of micro LED devices 100 may have a pitch of 5 µm, with each micro LED device having a spacing of 2 µm and a maximum width of 3 µm. In an exemplary embodiment, the top surface of the each micro LED device 100 has a width of approximately 3 µm. In such an exemplary embodiment, the width of the top surface 321 of a corresponding transfer head 300 is approximately 3 µm or smaller so as to avoid making inadvertent contact with an adjacent micro LED device 100. However, embodiments of the invention are not limited to these specific dimensions, and may be any suitable dimension. For example, the top surface 321 of the transfer head 300 may be slightly larger than the tops surface of the micro LED device 100, and smaller than the pitch (P) of the micro LED array described with regard to FIGS. 12A-12B.

FIG. 24 is a side view illustration of an array of micro device transfer heads in contact with an array of micro LED devices 100 in accordance with an embodiment of the invention. In the embodiment illustrated in FIG. 24, the pitch (P) of the transfer heads is an integer multiple of the pitch of the array of micro devices. In the particular embodiment illustrated, the pitch (P) of the transfer heads is 3 times the pitch of the array of micro LED devices. In such an embodiment, having a larger transfer head pitch may protect against arcing between transfer heads.

Figure 25:
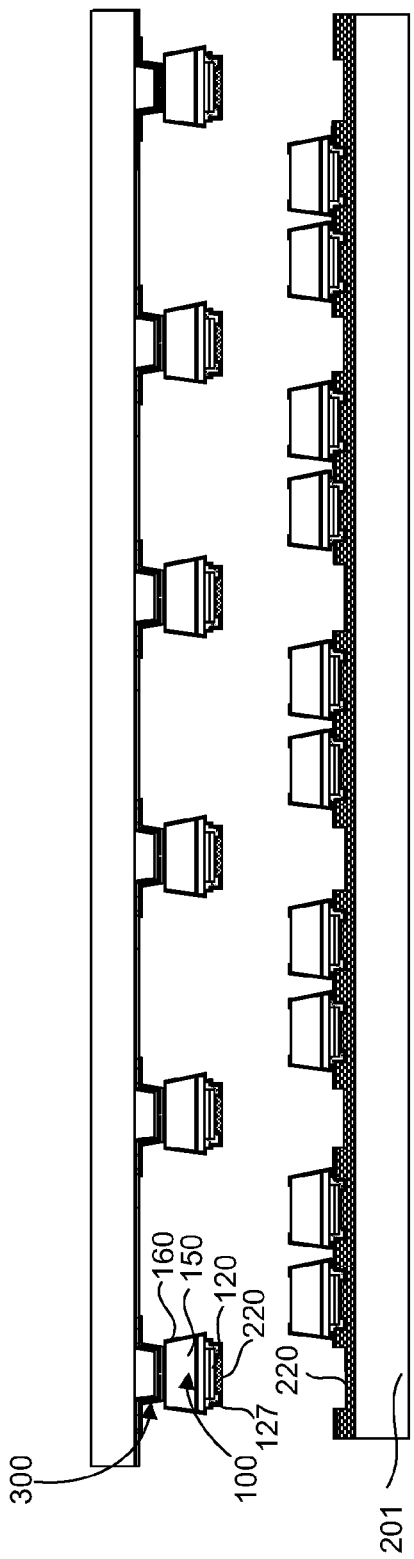
FIG. 25 is a cross-sectional side view illustration of an array of micro device transfer heads picking up an array of micro LED devices in accordance with an embodiment of the invention.
Figure 26:
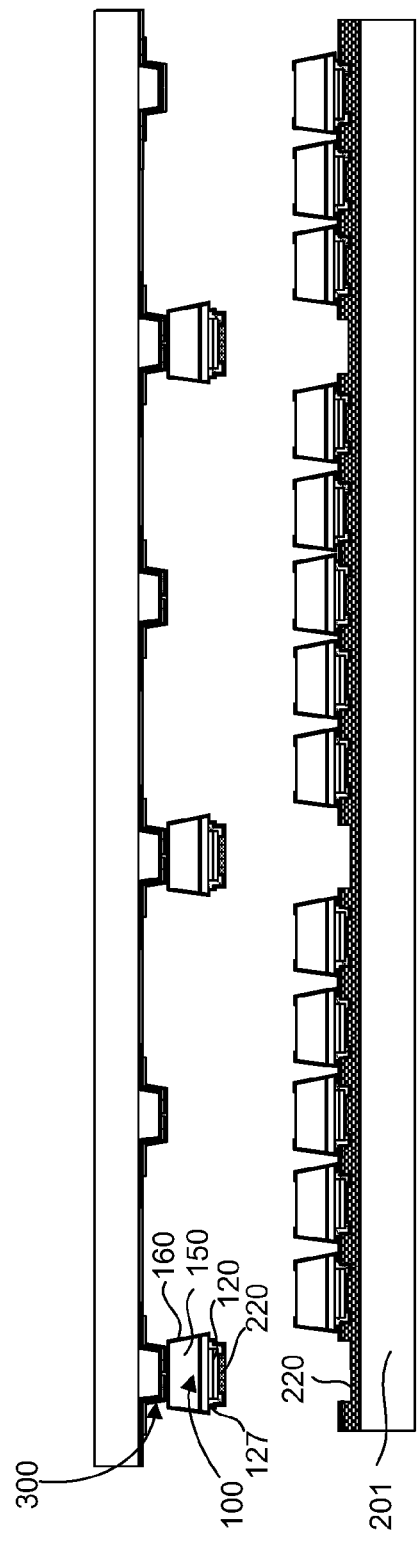
FIG. 26 is a cross-sectional side view illustration of an array of micro device transfer heads picking up a portion of an array of micro LED devices in accordance with an embodiment of the invention.

Referring again to FIG. 22, at operation 2230 a voltage is selectively applied to a portion of the array of transfer heads 100. Thus, each transfer head 300 may be independently operated. At operation 2240 a corresponding portion of the array of micro devices is picked up with the portion of the array of transfer heads to which the voltage was selectively applied. In one embodiment, selectively applying a voltage to a portion of the array of transfer heads means applying a voltage to every transfer head in the array of transfer heads. FIG. 25 is a side view illustration of every transfer head in an array of micro device transfer heads picking up an array of micro LED devices 100 in accordance with an embodiment of the invention. In another embodiment, selectively applying a voltage to a portion of the array of transfer heads means applying a voltage to less than every transfer head (e.g. a subset of transfer heads) in the array of transfer heads. FIG. 26 is a side view illustration of a subset of the array of micro device transfer heads picking up a portion of an array of micro LED devices 100 in accordance with an embodiment of the invention. In a particular embodiment illustrated in FIGS. 25-26, the pick up operation includes picking up the micro p-n diode 150, the reflective metallization stack 120, the electrically insulating spacer 127 and a portion of the conformal dielectric barrier layer 160 for the micro LED device 100. In a particular embodiment illustrated in FIGS. 25-26, the pick up operation includes picking up a substantial portion of the bonding layer 220. Accordingly, any of the embodiments described with regard to FIGS. 23-28 may also be accompanied by controlling the temperature of the portion of the bonding layer 220. For example, embodiments described with regard to FIGS. 23-28 may include performing an operation to create a phase change from solid to liquid state in a plurality of locations of the bonding layer connecting the array of micro devices to the carrier substrate 201 prior to picking up the array of micro devices. In an embodiment, the plurality of locations of the bonding layer can be regions of the same bonding layer. In an embodiment, the plurality of locations of the bonding layer can be laterally separate locations of the bonding layer.

At operation 2250 the portion of the array of micro devices is then released onto at least one receiving substrate. Thus, the array of micro LEDs can all be released onto a single receiving substrate, or selectively released onto multiple substrates. For example, the receiving substrate may be, but is not limited to, a display substrate, a lighting substrate, a substrate with functional devices such as transistors or ICs, or a substrate with metal redistribution lines. Release may be accomplished by affecting the applied voltage as previously described.

In accordance with some embodiments, release may also be accompanied by alloy bonding the bonding layer 220 with an electrically conductive receiving bonding layer to form a permanent alloy bonding layer, similarly as described with regard to FIGS. 16-18. In certain embodiments, a substantial portion of the bonding layer 220 is released onto the receiving substrate with a corresponding micro LED device. In such embodiments, a substantial portion may corresponding to a sufficient amount of bonding layer to alter the liquidus temperature of the electrically conductive receiving bonding layer when forming the permanent alloy bonding layer. In other embodiments, a substantial portion may correspond to a significant quantity which can affect bonding to the receiving substrate.

FIG. 27 is a side view illustration of an array of micro device transfer heads holding a corresponding array of micro LED devices 100 over a receiving substrate 400 including a plurality of driver contacts 410. The array of micro LED devices 100 may then be placed into contact with the receiving substrate and then selectively released. FIG. 28 is a side view illustration of a single micro LED device 100 selectively released onto the receiving substrate 400 over a driver contact 410 in accordance with an embodiment of the invention. In another embodiment, more than one micro LED device 100 is released, or the entire array of micro LED devices 100 are released.

Figure 29:
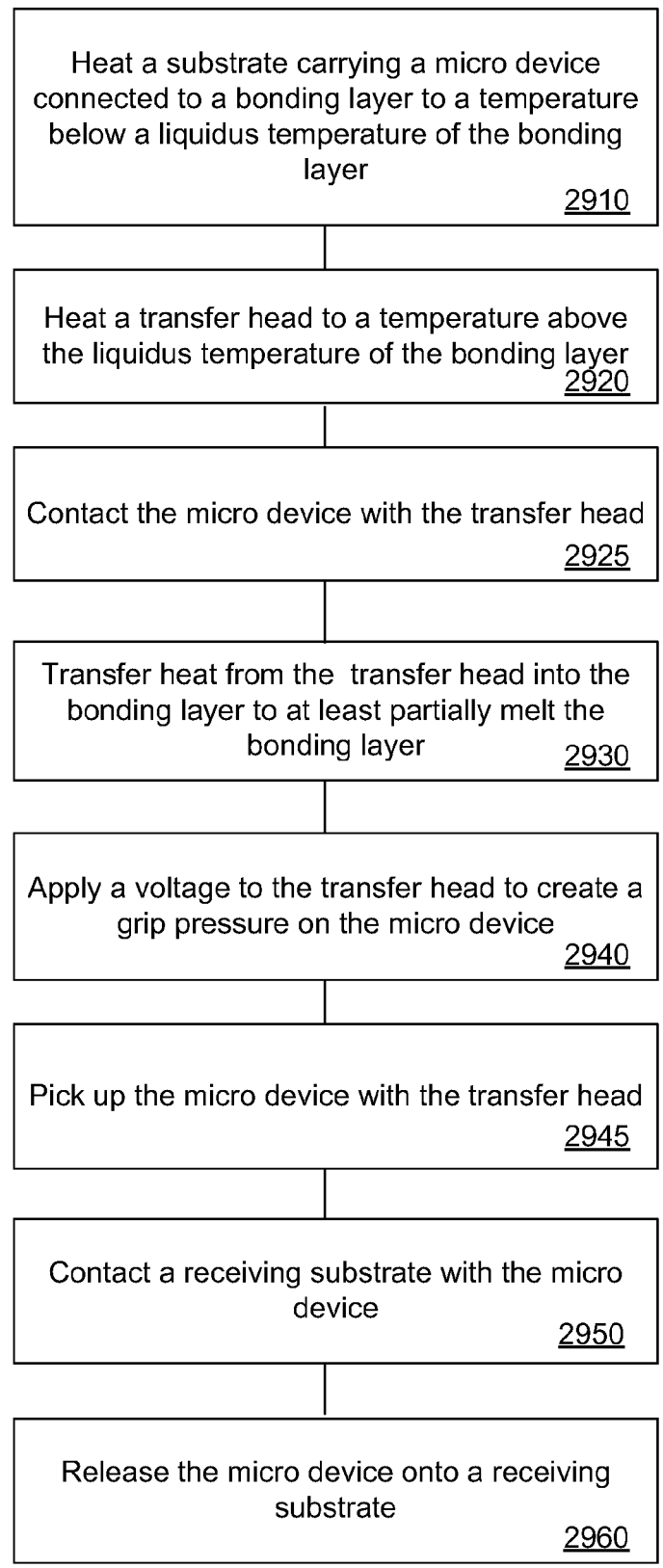
FIG. 29 is a flow chart illustrating a method of picking up and transferring a micro device from a carrier substrate to a receiving substrate in accordance with an embodiment of the invention.

FIG. 29 is a flow chart illustrating a method of picking up and transferring a micro device from a carrier substrate to a receiving substrate in accordance with an embodiment of the invention. For purpose of clarity, FIG. 29 is described in relation to various structural configurations illustrated in FIGS. 30A-32B, though embodiments of the invention are not so limited and may be practiced with other structural configurations referred to herein. At operation 2910 a carrier substrate carrying a micro device connected to a bonding layer is optionally heated to a temperature below a liquidus temperature of the bonding layer. In an embodiment, the carrier substrate is heated to a temperature of 1° C. to 10° C. below a liquidus temperature of the bonding layer, though lower or higher temperatures may be used. The heat from the carrier substrate may transfer from the carrier substrate to the bonding layer, to also maintain the bonding layer at approximately the same temperature. At operation 2920 a transfer head is heated to a temperature above the liquidus temperature of the bonding layer. For example, the transfer head may be heated to a temperature of 1° C. to 150° C., and more specifically 1° C. to 50° C., above the liquidus temperature of the bonding layer, though higher temperatures may be used. The micro device is then contacted with the transfer head at operation 2925, and heat is transferred from the transfer head 300 into the bonding layer 220 to at least partially melt the bonding layer at operation 2930. Alternatively, the micro device can be contacted with the transfer head at operation 2925, followed by heating the transfer head to the temperature above the liquidus temperature of the bonding layer at operation 2920 so that heat is transferred from the transfer head 300 into the bonding layer 220 to at least partially melt the bonding layer at operation 2930. Accordingly, it is to be understood that the order of operations in the flow charts illustrated in FIG. 29 and FIG. 33 can be performed in different orders than the sequentially numbered operations. In an embodiment, the transfer head and carrier substrate are heated to temperatures such that a sufficient portion of the bonding layer rapidly melts upon contacting the micro device with the transfer head which is heated above the liquidus temperature so that the micro device may be picked up by the transfer head upon creating a grip pressure which overcomes the surface tension forces holding the micro device to the carrier substrate. Size of the micro device, pick up speed, and thermal conductivity of the system are factors in determining the temperatures.

Figure 30A:
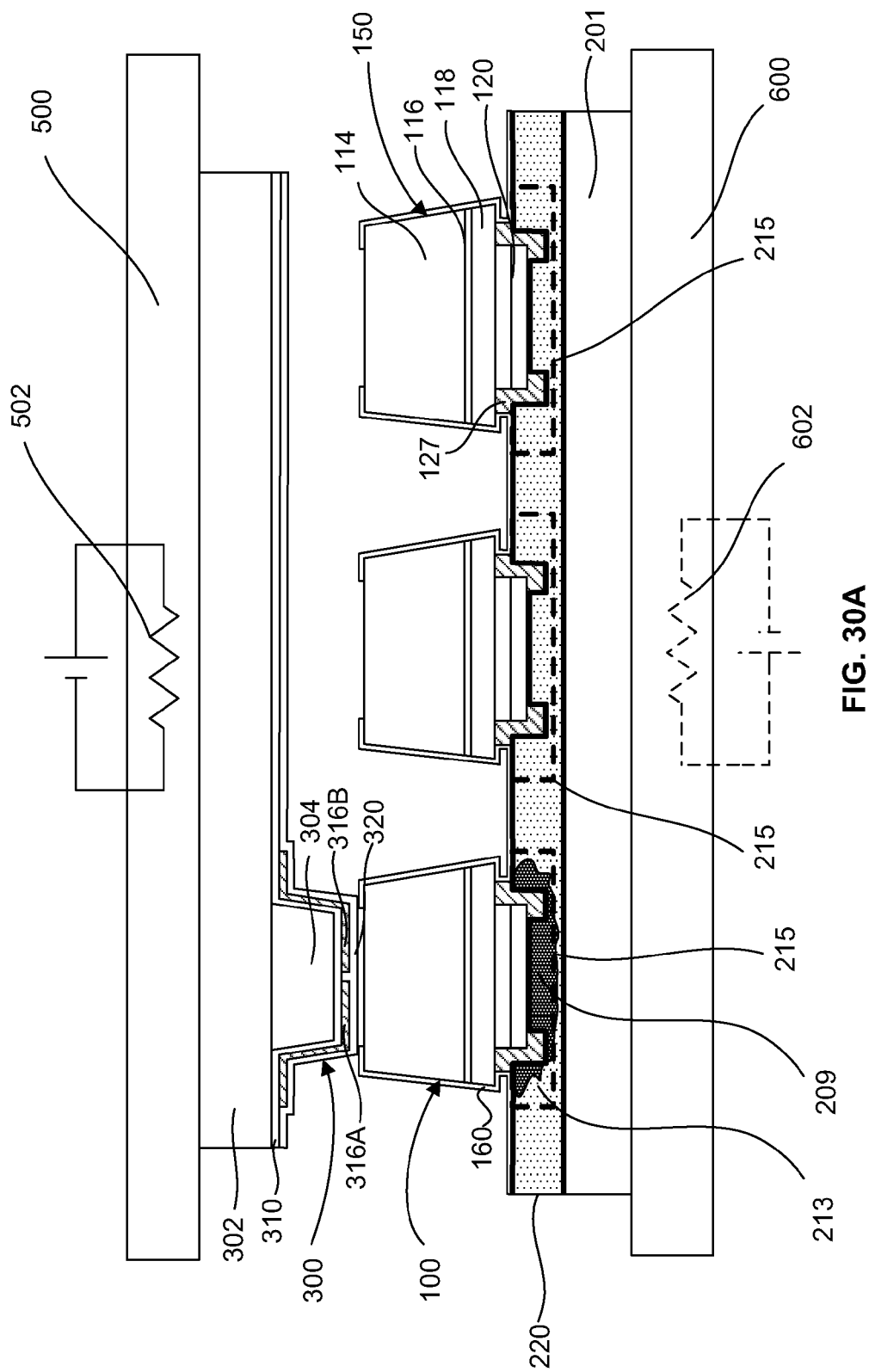
FIG. 30A is a cross-sectional side view illustration of an at least partially melted location of a laterally continuous bonding layer in accordance with an embodiment of the invention.

FIG. 30A is a side view illustration of an at least partially melted location 215 of a laterally continuous bonding layer directly below the micro LED device 100 in accordance with an embodiment of the invention. As illustrated, area 209 in location 215 of the bonding layer 220 located directly below the micro device 200 is illustrated with a darker shading indicating that the area 211 is in the liquid state, while the lighter shaded portions 213 of bonding layer 220 are in the solid state. In the particular embodiment illustrated in FIG. 33A, the localized melting of area 209 of the bonding layer 220 may be accomplished by separately heating the substrate 201 carrying the micro device 100, and the transfer head assembly carrying the transfer head 300. For example, the carrier substrate 201 can be globally heated with an optional heating element 602 (indicated by dotted lines) and heat distribution plate 600 to a temperature 1° C. to 10° C. below a liquidus temperature of the bonding layer, and the transfer head can be heated with a heating element 502 and heat distribution plate 500 to a temperature of 1° C. to 150° C., and more specifically 1° C. to 150° C., above the liquidus temperature of the bonding layer. Heat can be applied in other fashions, such as IR heat lamps, lasers, resistive heating elements, amongst others. Substrate 201 may also be locally heated.

Figure 30B:
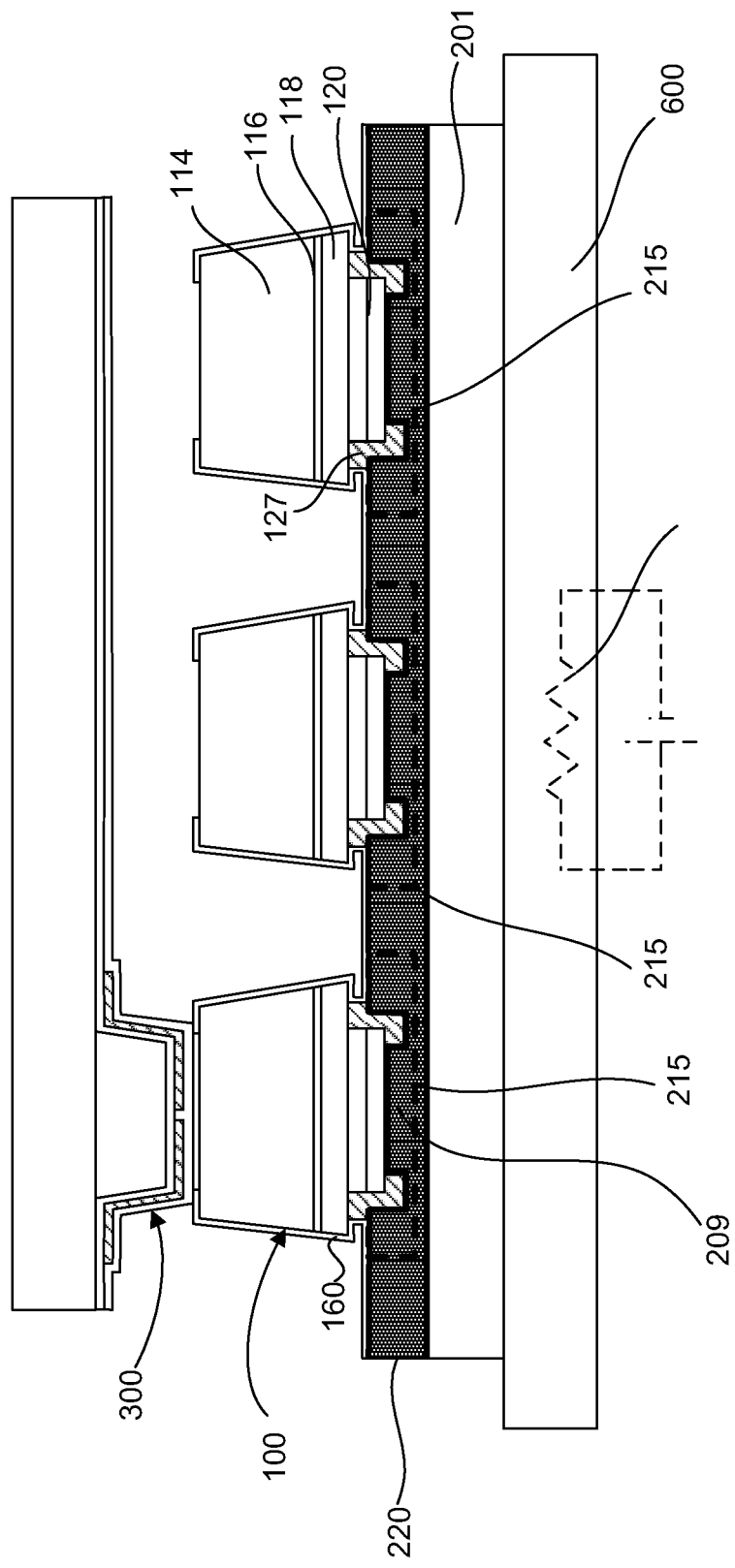
FIG. 30B is a cross-sectional side view illustration of at least partially melted locations of a laterally continuous bonding layer in accordance with an embodiment of the invention.

FIG. 30B is a side view illustration of at least partially melted locations of a laterally continuous bonding layer directly below the micro LED device 100 in accordance with an embodiment of the invention. As illustrated, the location of the bonding layer 220 located directly below the micro device 200 is illustrated with a darker shading indicating that the area 209 is in the liquid state. In the particular embodiment illustrated in FIG. 30B, substantially all of the laterally continuous bonding layer 220 is in the liquid state 209, which may be accomplished by globally heating the substrate 201 carrying the micro device 100 to or above the liquidus temperature of the bonding layer 220, for example with heating element 602 and heat distribution plate 600, without requiring separate heating of the transfer head 300.

Figure 31A:
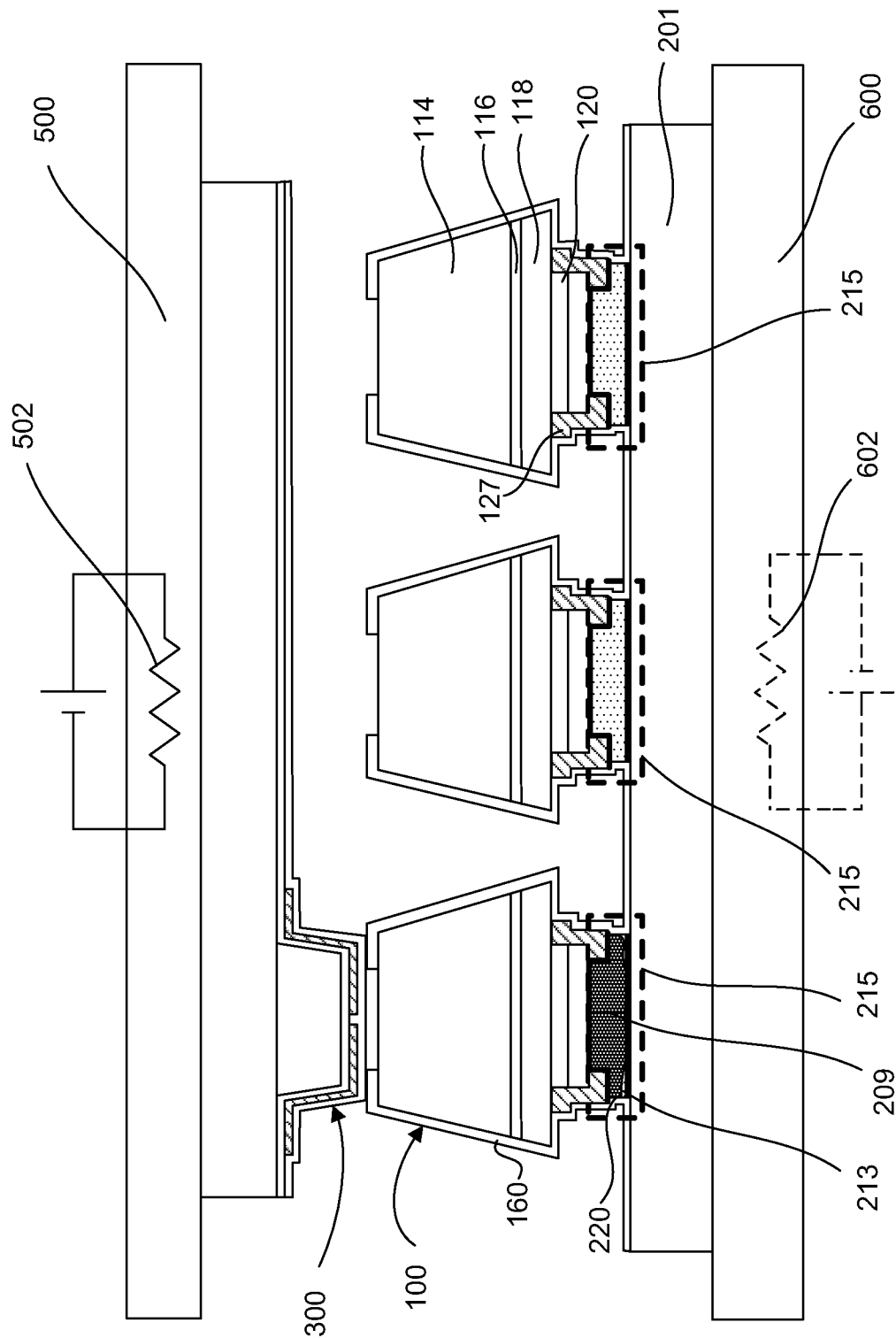
FIG. 31A is a cross-sectional side view illustration of an at least partially melted laterally separate location of a bonding layer in accordance with an embodiment of the invention.

FIG. 31A is a side view illustration of an at least partially melted laterally separate location 215 of a bonding layer directly below the micro LED device 100 in accordance with another embodiment of the invention. As illustrated, the locations 215 of the bonding layer 220 directly below the micro devices 100 are laterally separate locations, with the laterally separate location 215 of the bonding layer located directly below the micro device 100 which is in contact with the transfer head 300 at least partially melted, indicated by shading of area 209. Similar to FIG. 30A, localized melting of area 209 of the laterally separate location of bonding layer 220 may be accomplished by separately heating the substrate 201 carrying the micro device 100, and the transfer head assembly carrying the transfer head 300. Heating element 602 may be optional for localized heating, indicated by the dotted lines. Carrier substrate 201 may also be locally heated.

Figure 31B:
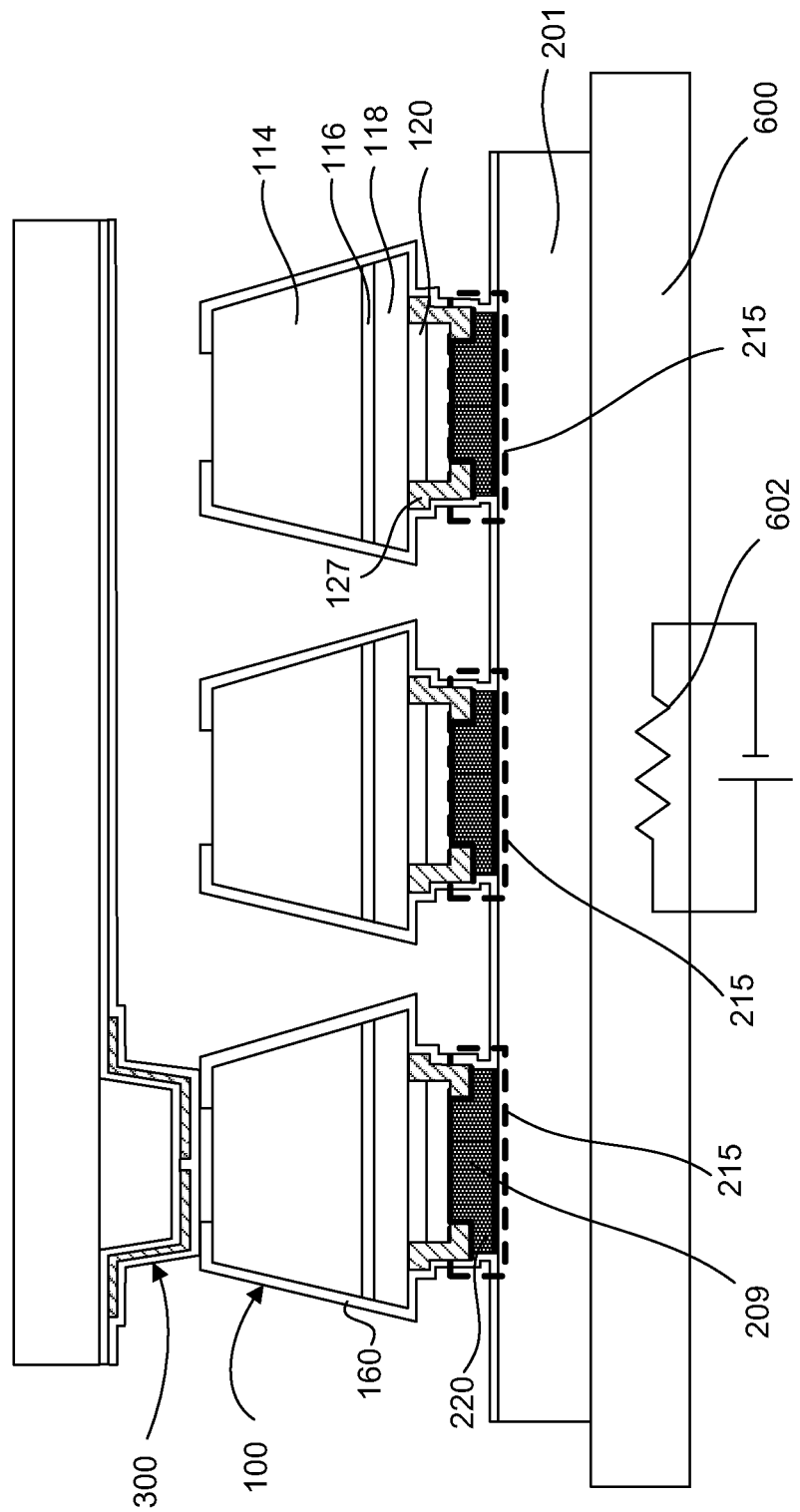
FIG. 31B is a cross-sectional side view illustration of at least partially melted laterally separate locations of a bonding layer in accordance with an embodiment of the invention.

FIG. 31B is a side view illustration of at least partially melted laterally separate locations of a bonding layer in accordance with an embodiment of the invention. As illustrated, the laterally separate locations 215 of the bonding layer 220 located below the micro devices 100 are illustrated with a darker shading indicating that areas 209 are in the liquid state. In the particular embodiment illustrated in FIG. 31B, substantially all of each laterally separate location 215 of the bonding layer 220 is molten, which may be accomplished by globally heating the substrate 201 carrying the micro devices 100 to or above the liquidus temperature of the bonding layer 220, for example with heating element 602 and heat distribution plate 600, without requiring separate heating of the transfer head 300.

Figure 32A:
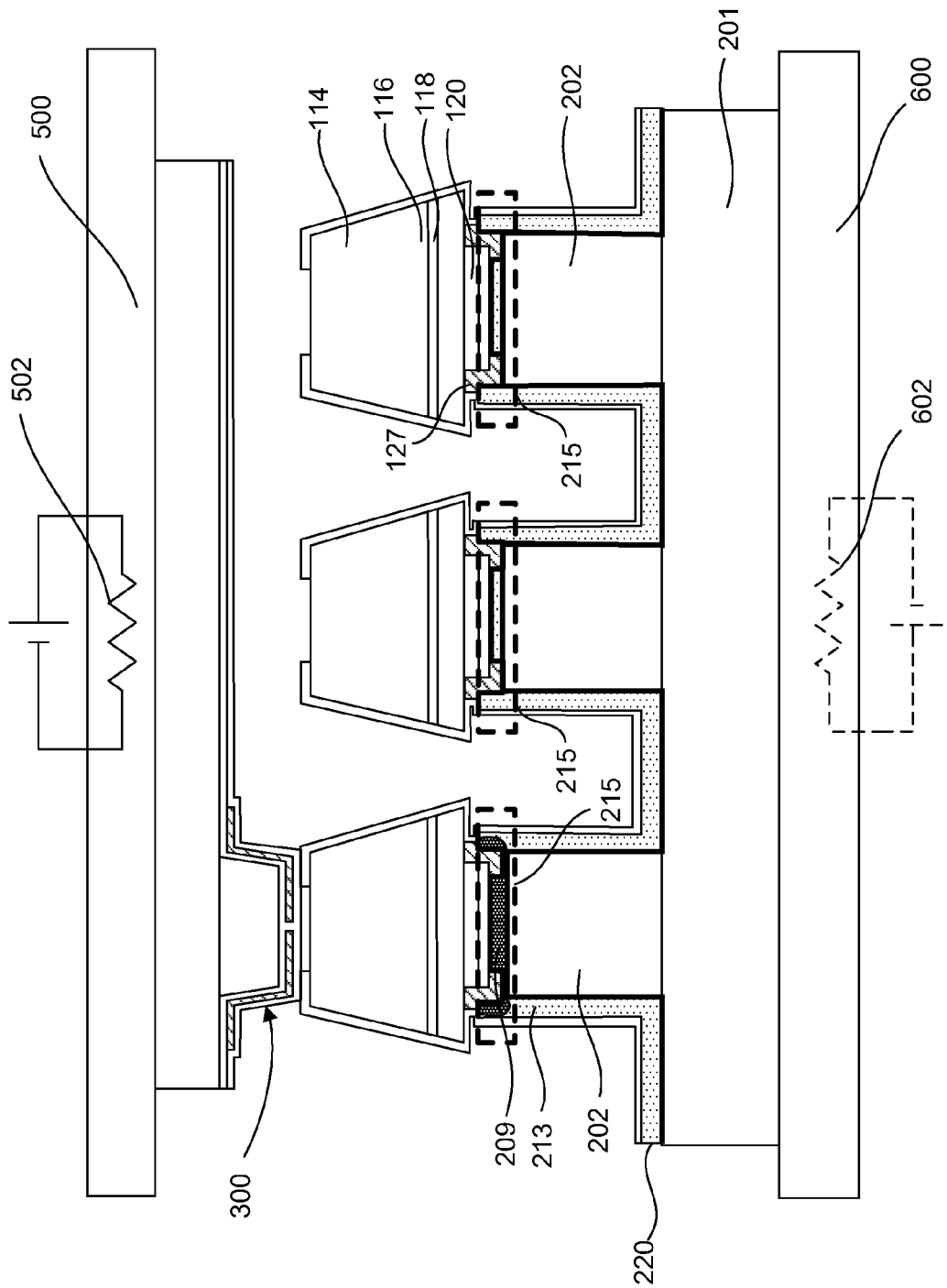
FIG. 32A is a cross-sectional side view illustration of an at least partially melted laterally separate location of a bonding layer on a post in accordance with an embodiment of the invention.

FIG. 32A is a side view illustration of an at least partially melted laterally separate location 215 of a bonding layer on a post 202 in accordance with an embodiment of the invention. As illustrated, the locations 215 of the bonding layer 220 located below the micro devices 100 are laterally separate locations, with the laterally separate location 215 of the bonding layer located below the micro device 100 in contact with the transfer head 300 at least partially melted, indicated by shading of area 209. Bonding layer 220 may also include regions of alloy bonding layer 211 and regions of bonding layer 210 similar to FIG. 10", Example, B. Similar to FIG. 30A, localized melting of area 209 of the laterally separate location 215 of bonding layer 220 may be accomplished by separately heating the substrate 201 carrying the micro device 100, and the transfer head assembly carrying the transfer head 300. Heating element 602 may be optional for localized heating, indicated by the dotted lines. Carrier substrate 201 may also be locally heated.

Figure 32B:
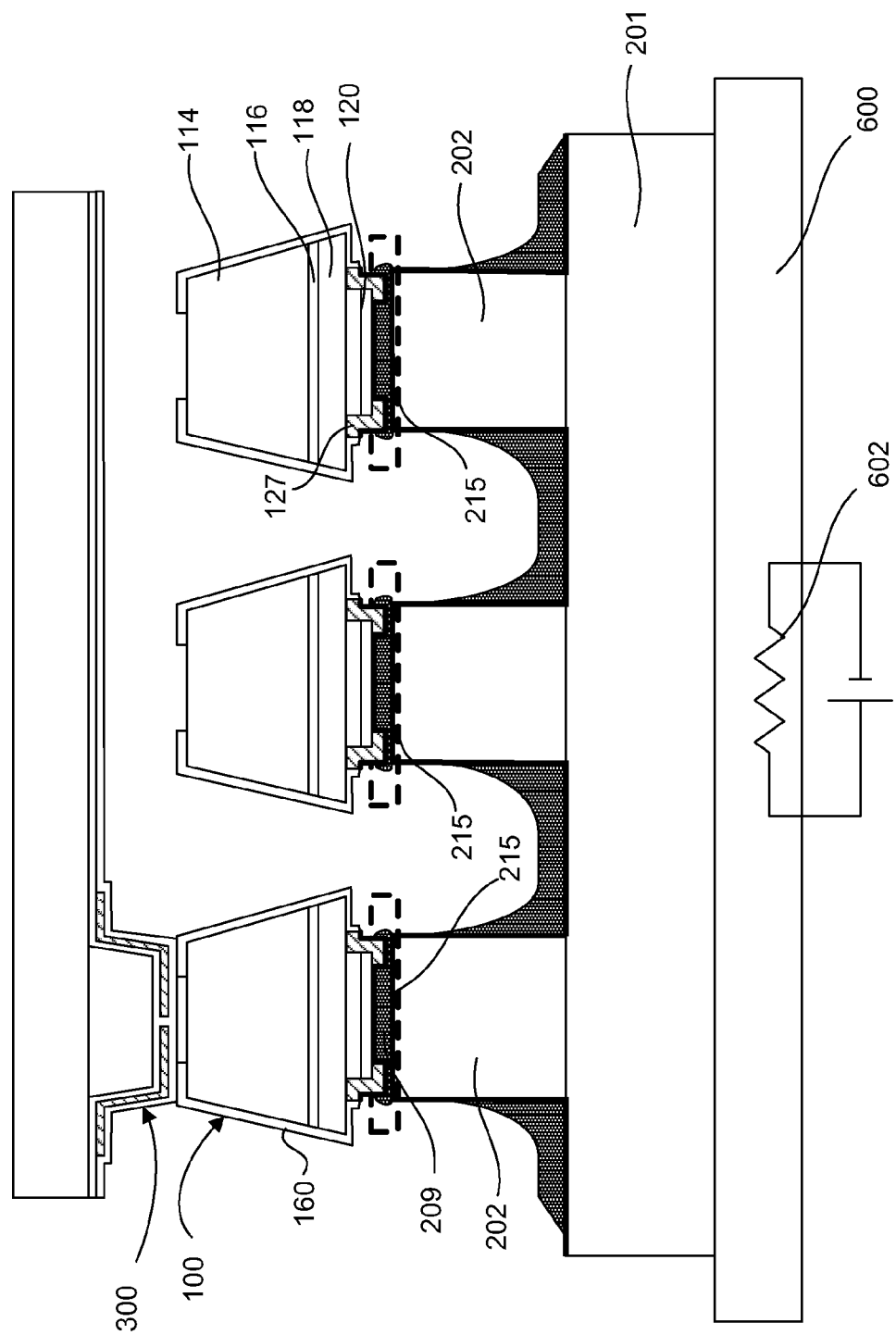
FIG. 32B is a cross-sectional side view illustration of at least partially melted laterally separate locations of a bonding layer on posts in accordance with an embodiment of the invention.

FIG. 32B is a side view illustration of at least partially melted laterally separate locations 215 of a bonding layer on posts 202 in accordance with an embodiment of the invention. As illustrated, the laterally separate locations of the bonding layer 220 located below the micro devices 100 are illustrated with a darker shading indicating that areas 209 are in the liquid state. In the particular embodiment illustrated in FIG. 32B, each laterally separate location 215 of the bonding layer 220 is molten, which may be accomplished by globally heating the substrate 201 carrying the micro devices 100 to or above the liquidus temperature of the bonding layer 220, for example with heating element 602 and heat distribution plate 600, without requiring separate heating of the transfer head 300.

Referring again to FIG. 29 a voltage is applied to the electrode(s) 316 in the transfer head 300 to create a grip pressure on the micro device 100 at operation 2940, and at operation 2950 the micro device is picked up with the transfer head. As described above, the order of operations in the flow charts illustrated in FIG. 29 and FIG. 33 can be performed in different orders than the sequentially numbered operations. For example, operation 2940 of applying a voltage to the transfer head to create a grip pressure on the micro device can be performed earlier in the sequence of operations. In an embodiment, a substantial portion of the bonding layer 220 is picked up with the transfer head 300 at operation 2945. For example, approximately half of the bonding layer 220 may be picked up with the micro device 100. In an alternative embodiment, none of the bonding layer 220 is picked up with the transfer head. At operation 2950 the micro device and optionally a portion of the bonding layer 220 are placed in contact with a receiving substrate. The micro device and optionally a portion of the bonding layer 220 and conformal dielectric barrier layer 160 are then released onto the receiving substrate at operation 2960.

A variety of operations can be performed to control the phase of the portion of the bonding layer when picking up, transferring, contacting the receiving substrate, and releasing the micro device and portion of the bonding layer 220 (or alloy bonding layer 211) on the receiving substrate. For example, the portion of the bonding layer which is picked up with the micro device can be maintained in the liquid state during the contacting operation 2950 and during the release operation 2960. In another embodiment, the portion of the bonding layer can be allowed to cool to a solid phase after being picked up. For example, the portion of the bonding layer can be in a solid phase during contacting operation 2950, and again melted to the liquid state prior to or during the release operation 2960. A variety of temperature and material phase cycles can be performed in accordance with embodiments of the invention.

Figure 33:
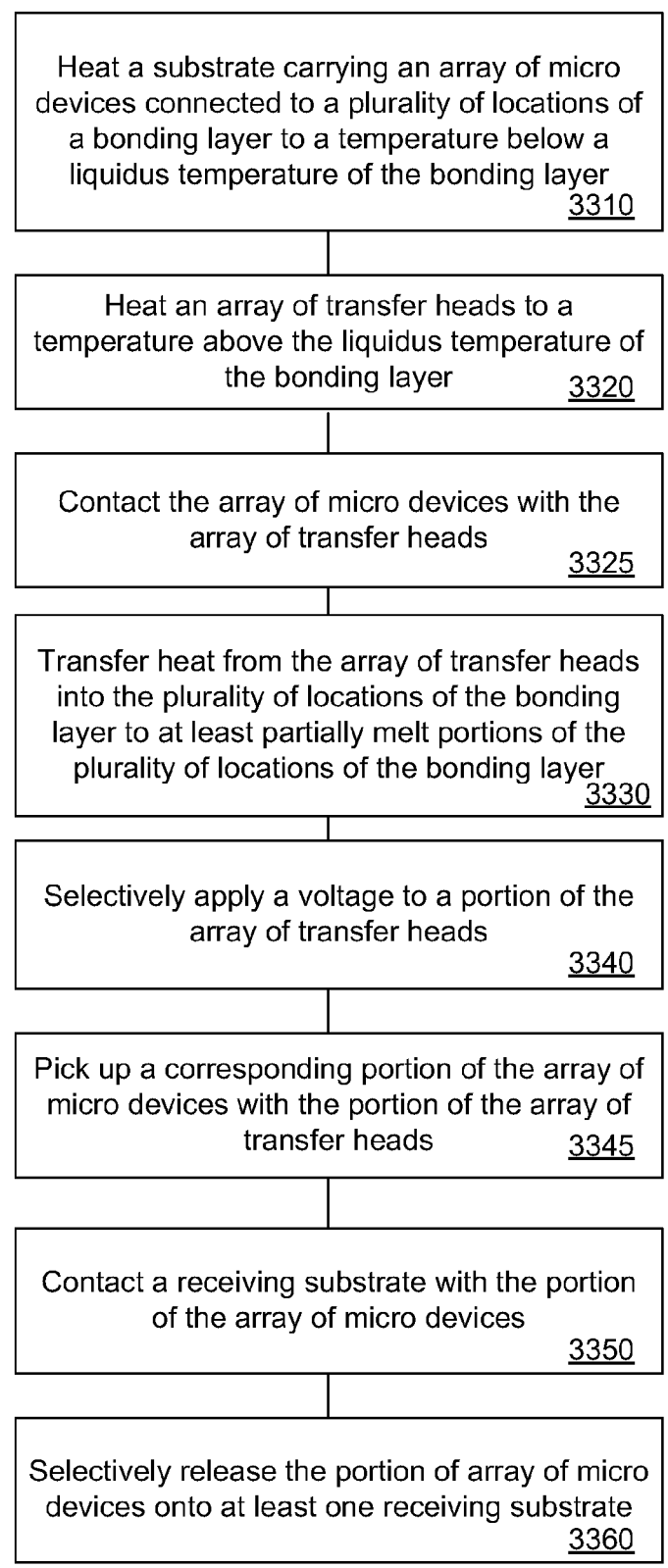
FIG. 33 is a flow chart illustrating a method of picking up and transferring an array of micro devices from a carrier substrate to at least one receiving substrate in accordance with an embodiment of the invention.

An exemplary embodiment which illustrates controlling the phase of the portion of the bonding layer (or alloy bonding layer) when picking up, transferring, contacting the receiving substrate, and releasing the micro device of FIG. 30A is described in additional detail in the following method illustrated in FIG. 33 and the structural configurations illustrated in FIGS. 34-37, though embodiments of the invention are not so limited an may be practiced with other structural configurations. At operation 3310 a substrate carrying an array of micro devices connected to a plurality of locations of a bonding layer is optionally heated to a temperature below a liquidus temperature of the bonding layer. The heat from the carrier substrate may transfer from the carrier substrate to the bonding layer, to also maintain the bonding layer at approximately the same temperature. At operation 3320 a transfer head is heated to a temperature above the liquidus temperature of the bonding layer. The array of micro devices are then contacted with the array of transfer heads at operation 3325, and heat is transferred from the array of transfer heads 300 into the plurality of locations of the bonding layer 220 to at least partially melt portions of the plurality of locations of the bonding layer at operation 3330. Alternatively, the array of micro devices can be contacted with the array of transfer heads at operation 3325, followed by heating the array of transfer heads to the temperature above the liquidus temperature of the bonding layer at operation 3320 so that heat is transferred from the array of transfer heads 300 into the plurality of locations of the bonding layer 220 to at least partially melt the portions of the plurality of locations of the bonding layer at operation 3330. Accordingly, it is to be understood that the order of operations in the flow charts illustrated in FIG. 29 and FIG. 33 can be performed in different orders than the sequentially numbered operations.

Figure 34:
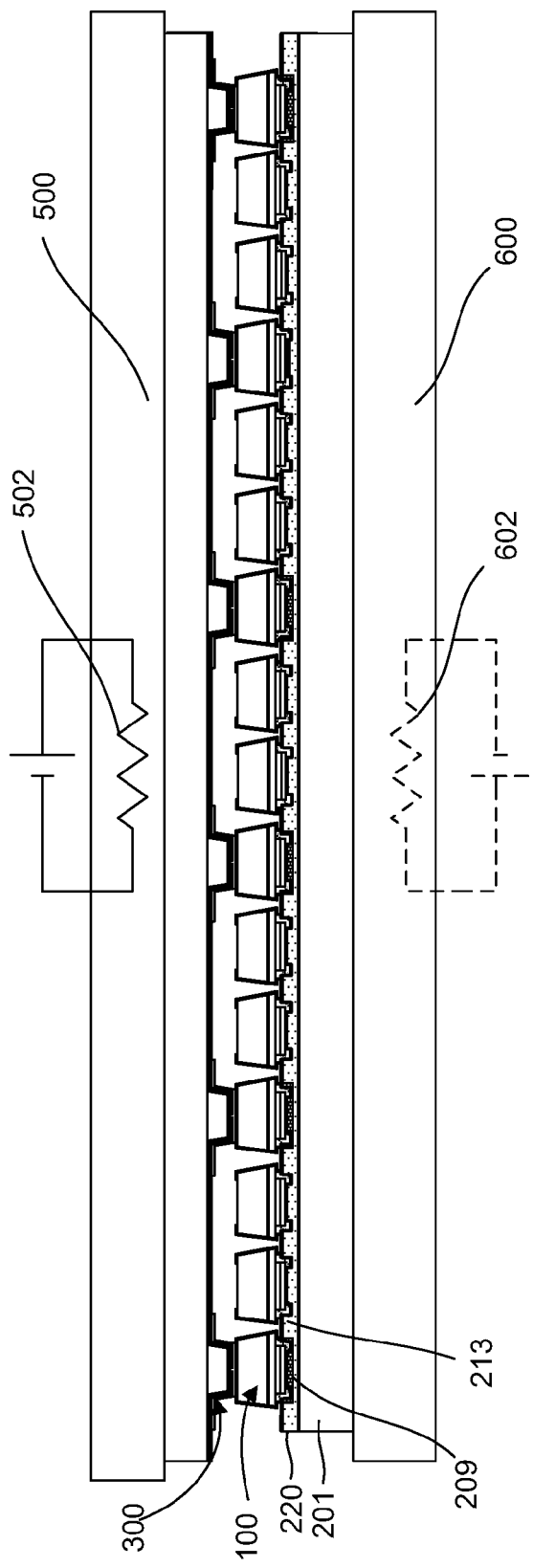
FIG. 34 is a cross-sectional side view illustration of an array of micro device transfer heads in contact with an array of micro LED devices in accordance with an embodiment of the invention.

FIG. 34 is a side view illustration of an array of micro device transfer heads in contact with an array of micro LED devices of FIG. 30A, in which the plurality of locations of the bonding layer 220 (or alloy bonding layer 211) are at least partially melted, indicated by the dark shaded areas 209, in accordance with an embodiment of the invention. In the particular embodiment illustrated in FIG. 34, the localized melting of areas 209 of the bonding layer 220 may be accomplished by separately heating the carrier substrate 201 carrying the micro devices 100, and the array of transfer heads 300. For example, the carrier substrate 201 can be heated with a heating element 602 and heat distribution plate 600 to a temperature 1° C. to 10° C. below a liquidus temperature of the bonding layer, and the base array of transfer heads 300 can be heated with a heating element 502 and heat distribution plate 500 to a temperature of 1° C. to 150° C., and more specifically 1° C. to 150° C., above the liquidus temperature of the bonding layer as described in relation to FIG. 30A. Heat can be applied in other fashions, such as IR heat lamps, lasers, resistive heating elements, amongst others. Carrier substrate 201 may also be locally heated.

Figure 35:
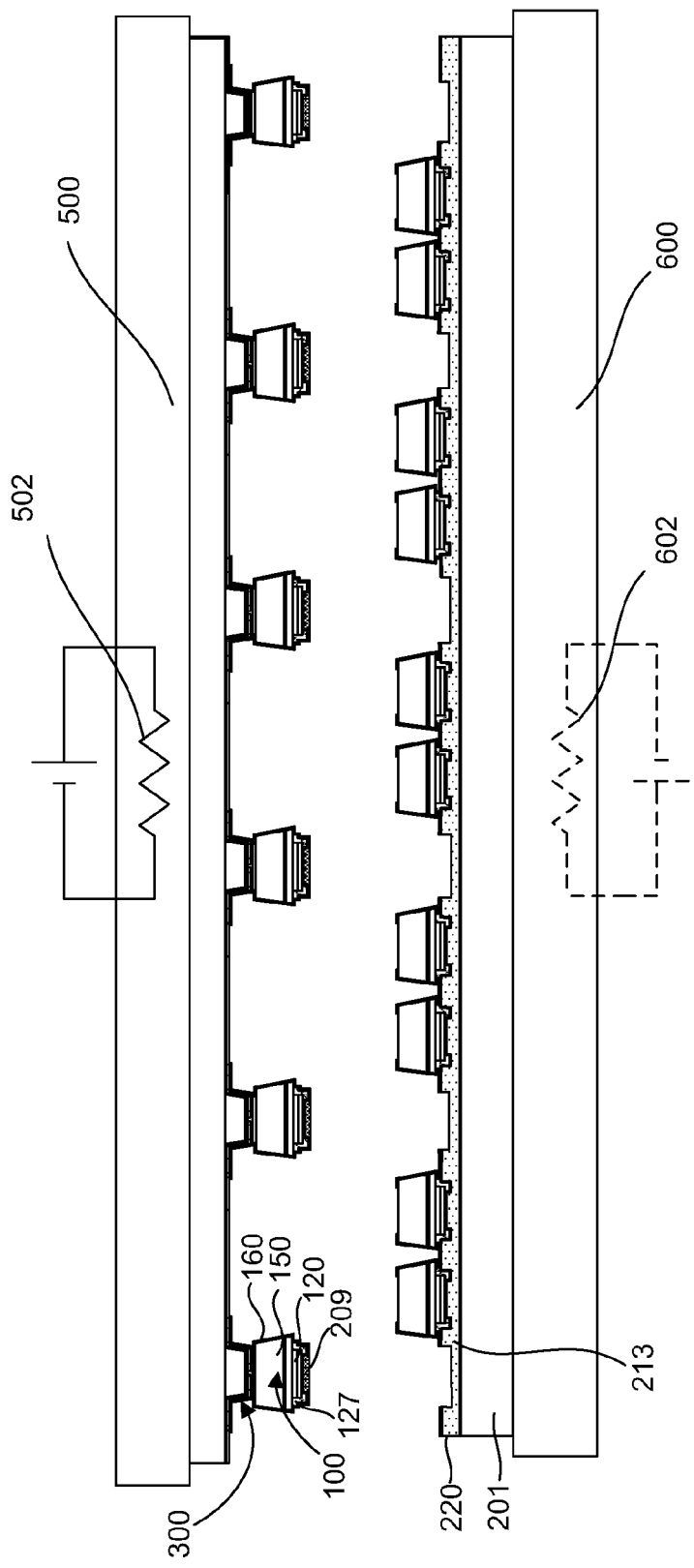
FIG. 35 is a cross-sectional side view illustration of an array of micro device transfer heads picking up an array of micro LED devices in accordance with an embodiment of the invention.

Referring again to FIG. 33 a voltage is then selectively applied to the electrode(s) 116 in a portion of the array of transfer heads 300 to create a grip pressure on the corresponding array of micro devices 100 at operation 3340, and at operation 3345 the corresponding portion of the array of micro devices 100 are picked up with the portion of the array of transfer heads 300. As described above, the order of operations in the flow charts illustrated in FIG. 29 and FIG. 33 can be performed in different orders than the sequentially numbered operations. For example, operation 3340 of applying a voltage to the transfer head to create a grip pressure on the micro device can be performed earlier in the sequence of operations. In an embodiment, a substantial portion of the plurality of locations of the bonding layer 220 is picked up with the array of micro devices 100 at operation 3345. For example, approximately half of the plurality of locations of the bonding layer 220 may be picked up with the array of micro devices 100. In an alternative embodiment, none of the bonding layer 220 is picked up with the array of micro devices 100. FIG. 35 is a side view illustration of an array of micro device transfer heads 300 picking up an array of micro LED devices 100 in accordance with an embodiment of the invention, in which a substantial portion of the plurality locations of bonding layer are picked up in the liquid state 209 along with the array of micro LED devices 100.

At operation 3350 the corresponding portion of the array of micro devices 100 and optionally the portion of the bonding layer 220 which have been picked up are placed in contact with a receiving substrate. The bonding layer 220 may be in either the solid state 213 or liquid state 209 when contacting the substrate. The portion of the array of micro devices and optionally the portion of the bonding layer 220 are then selectively released onto the at least one receiving substrate at operation 3360. Thus, the array of micro devices can all be released onto a single receiving substrate, or selectively released onto multiple substrates. The receiving substrate may be, but is not limited to, a display substrate, a lighting substrate, a substrate with functional devices such as transistors or ICs, or a substrate with metal redistribution lines. Release may be accomplished by turning off the voltage source, grounding the voltage source, or reversing the polarity of the constant voltage.

In accordance with some embodiments, release may also be accompanied by alloy bonding the bonding layer 220 with an electrically conductive receiving bonding layer to form a permanent alloy bonding layer, similarly as described with regard to FIGS. 16-18. In certain embodiments, a substantial portion of the bonding layer 220 is released onto the receiving substrate with a corresponding micro LED device. In such embodiments, a substantial portion may corresponding to a sufficient amount of bonding layer to alter the liquidus temperature of the electrically conductive receiving bonding layer when forming the permanent alloy bonding layer. In other embodiments, a substantial portion may correspond to a significant quantity which can affect bonding to the receiving substrate.

Figure 36:
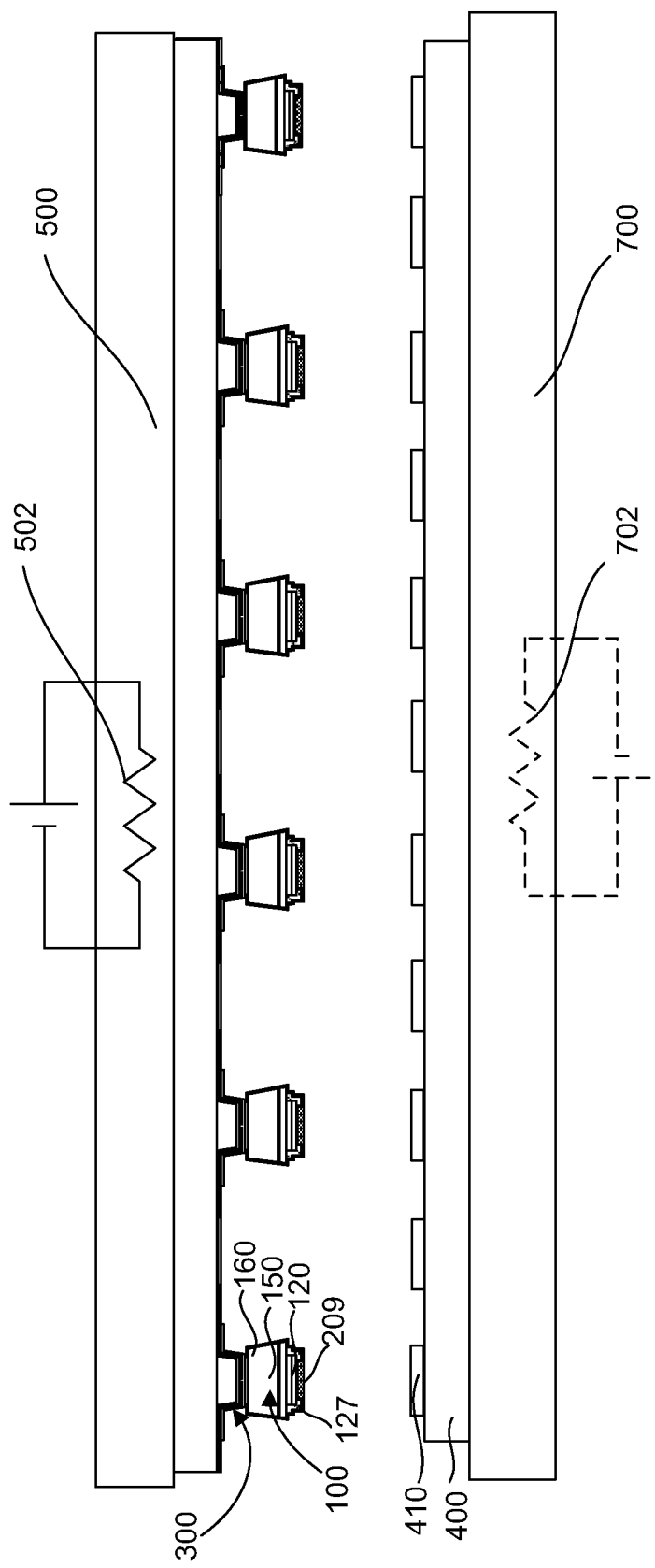
FIG. 36 is a side view illustration of an array of micro device transfer heads with an array of micro LED devices positioned over a receiving substrate in accordance with an embodiment of the invention.
Figure 37:
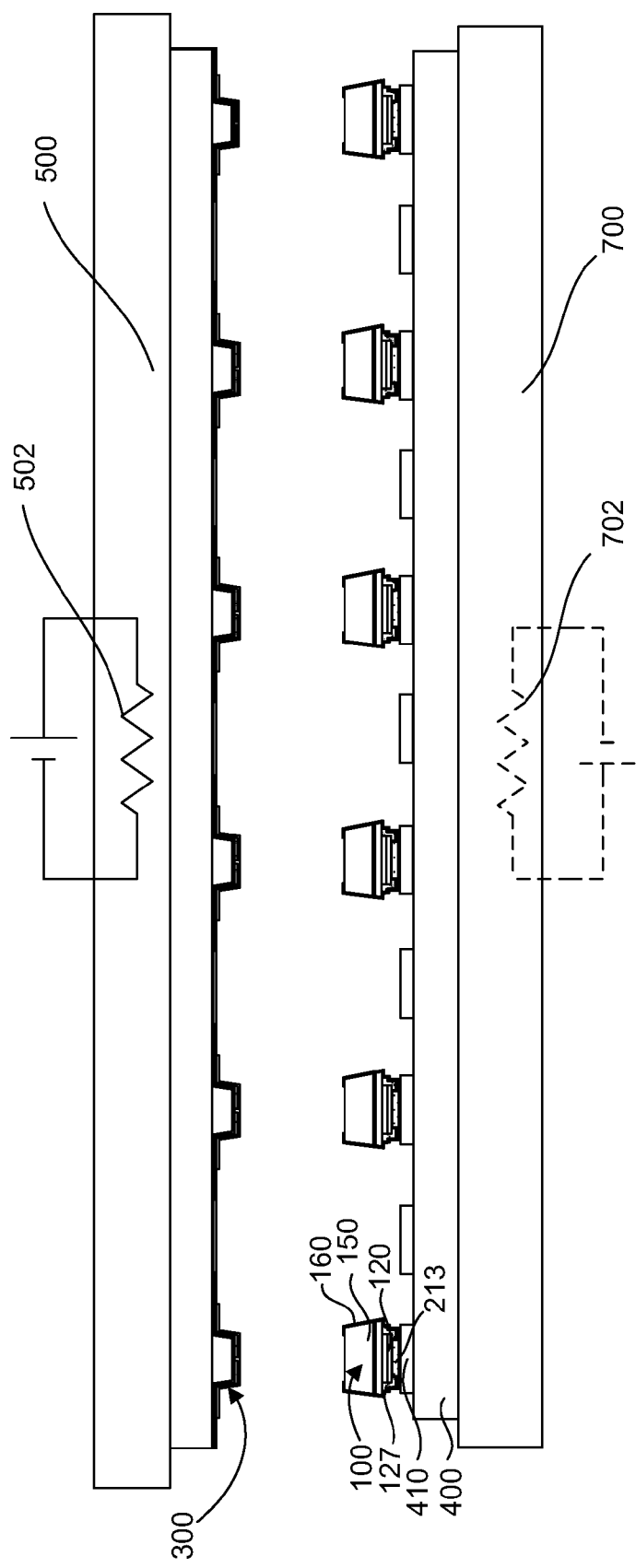
FIG. 37 is a side view illustration of an array of micro LED devices selectively released onto a receiving substrate in accordance with an embodiment of the invention.

FIG. 36 is a side view illustration of an array of micro device transfer heads with an array of micro LED devices positioned over a receiving substrate 400 including a plurality of driver contacts 410 in accordance with an embodiment of the invention, in which the portions of the bonding layer which have been picked up are in the liquid state 209. FIG. 37 is a side view illustration of an array of micro LED devices selectively released onto the receiving substrate 400 over the driver contacts 410 in accordance with an embodiment of the invention. In another embodiment, a single micro LED device 100 or a portion of the micro LED devices 100 are released.

Upon release of the micro devices 100 onto the receiving substrate 400 the corresponding portions of the bonding layer are allowed to cool to the solid state 213.

In an embodiment, the receiving substrate 400 can be heated to a temperature above or below the liquidus temperature of the bonding layer 220 to assist with the transfer process. The receiving substrate 400 can also be locally or globally heated. In one embodiment, the receiving substrate is globally heated with a heating element 702 and heat distribution plate 700 similar to the carrier substrate. Heat can be applied in other fashions, such as IR heat lamps, lasers, resistive heating elements, amongst others. In one embodiment, a localized laser can be provided above a top surface of the receiving substrate 400 to provide localized heating to the bonding layer or receiving substrate. In another embodiment, a localized laser can be provided below a bottom surface of the receiving substrate 400, so that the bonding layer or receiving substrate is locally heated from the backside. Where localized heating of the receiving substrate 400 is utilized, for example by laser, temperatures below or above the liquidus temperature of the bonding layer may be accomplished. For example, a local region of receiving substrate 400 adjacent contact 410 can be locally heated to or above the liquidus temperature of the bonding layer to facilitate bonding, followed by cooling to solidify the bond. Likewise, the receiving substrate 400 can be locally or globally maintained at an elevated temperature below the liquidus temperature of the bonding layer, or allowed to remain at room temperature.

A variety of operations can be performed to control the phase of the portion of the bonding layer when picking up, transferring, contacting the receiving substrate, and releasing the micro devices and portion of the bonding layer 220 on the receiving substrate. For example, the portion of the bonding layer which is picked up with the micro device can be maintained in the liquid state during the contacting operation 3350 and during the release operation 3360. In another embodiment, the portion of the bonding layer can be allowed to cool to a solid phase after being picked up. For example, the portion of the bonding layer can be in a solid phase during contacting operation 3350, and again melted to the liquid state prior to or during the release operation 3360. A variety of temperature and material phase cycles can be performed in accordance with embodiments of the invention.

In utilizing the various aspects of this invention, it would become apparent to one skilled in the art that combinations or variations of the above embodiments are possible for forming an array of micro LED structures which are poised for pick up and transfer to a receiving substrate. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method of forming a micro LED array in the following sequence comprising:
    bonding a first substrate stack to a second substrate stack with a bonding layer;
    wherein the first substrate stack comprises:
        a p-n diode layer formed on a first substrate;
        a plurality of separate reflective metallization stacks on the p-n diode layer;
        a patterned electrically insulating layer laterally between the plurality of separate reflective metallization stacks on the p-n diode layer;

removing the first substrate; and etching through the p-n diode layer to form a plurality of micro p-n diodes over the plurality of separate reflective metallization stacks, and exposing the patterned electrically insulating layer laterally between the plurality of micro p-n diodes, wherein the patterned electrically insulating layer acts as an etch stop layer during the etching.

2. The method of claim 1:

wherein the first substrate stack comprises a first electrically conductive bonding layer over the patterned electrically insulating layer and the plurality of separate reflective metallization stacks, and the second substrate stack comprises a second electrically conductive bonding layer; and wherein bonding the first substrate stack to the second substrate stack further comprises bonding the first electrically conductive bonding layer to the second electrically conductive bonding layer to form an alloy bonding layer.

3. The method of claim 2, wherein one of the first and second electrically conductive bonding layers has a liquidus temperature below 350° C., and the alloy bonding layer has a liquidus temperature below 350° C.

4. The method of claim 2, wherein one of the first and second electrically conductive bonding layers has a liquidus temperature below 200° C., and the alloy bonding layer has a liquidus temperature below 200° C.

5. The method of claim 3, wherein one of the first and second electrically conductive bonding layers comprises a material selected from the group consisting of indium and tin.

6. The method of claim 5, wherein one of the first and second electrically conductive bonding layers has a thickness which is 5% or less a thickness of the other one of the first and second electrically conductive bonding layers.

7. The method of claim 2, wherein the first electrically conductive bonding layer is completely consumed in the alloy bonding layer at locations where the first electrically conductive bonding layer makes contacts with the second electrically conductive bonding layer.

8. The method of claim 7, wherein bonding the first electrically conductive bonding layer to the second electrically conductive bonding layer comprises maintaining the first and second electrically conductive bonding layers at an elevated temperature above a liquidus temperature of one of the first and second electrically conductive bonding layers.

9. The method of claim 1, further comprising patterning a reflective metallization stack layer on the p-n diode layer to form the plurality of separate reflective metallization stacks on the p-n diode layer.

10. The method of claim 9, further comprising depositing an electrically insulating layer over the plurality of separate reflective metallization stacks.

11. The method of claim 10, further comprising patterning the electrically insulating layer to form the patterned electrically insulating layer including a plurality of openings exposing the plurality of separate reflective metallization stacks.

12. The method of claim 11, further comprising depositing a first electrically conductive bonding layer over the patterned electrically insulating layer and the plurality of separate reflective metallization stacks.

13. The method of claim 1, further comprising etching the patterned electrically insulating layer after stopping the etching of the p-n diode layer to expose a bottom surface of each of the plurality of micro p-n diodes.

14. The method of claim 13, further comprising depositing a conformal dielectric barrier layer on side surfaces and the bottom surface of each of the plurality of micro p-n diodes.

15. The method of claim 14, wherein the conformal dielectric barrier layer covers a side surface of a quantum well layer in the micro p-n diode.

16. The method of claim 1, wherein etching the p-n diode layer to form the plurality of micro p-n diodes comprises plasma etching.

17. The method of claim 16, wherein each of the plurality of micro p-n diodes includes a top surface, a bottom surface and tapered sidewalls, wherein the bottom surface is wider than the top surface.

18. The method of claim 1, further comprising depositing an electrically insulating layer over the plurality of separate reflective metallization stacks.

19. The method of claim 18, further comprising patterning the electrically insulating layer to form the patterned electrically insulating layer including a plurality of openings exposing the plurality of separate reflective metallization stacks.

20. The method of claim 19, wherein the plurality of separate reflective metallization stacks are wider than the plurality of openings exposing the plurality of separate reflective metallization stacks.

21. The method of claim 20, wherein the bonding layer comprises an electrically conductive material.

22. The method of claim 21, wherein the bonding layer comprises a metal or metal alloy.

23. The method of claim 20, wherein the bonding layer comprises a polymer.

24. The method of claim 20, further comprising etching the patterned electrically insulating layer after etching of the p-n diode layer to remove the patterned electrically insulating layer from underneath a bottom surface of each of the plurality of micro p-n diodes.

25. The method of claim 20, further comprising embedding a topography of the patterned electrically insulating layer into the bonding layer during the bonding the first substrate stack to the second substrate stack.

26. The method of claim 1, wherein the patterned electrically insulating layer of the first substrate stack includes a plurality of openings exposing the plurality of separate reflective metallization stacks, the plurality of separate reflective metallization stacks are wider than the plurality of openings exposing the plurality of separate reflective metallization stacks, and a portion of the electrically insulating layer is formed on top of each of the separate reflective metallization stacks opposite the p-n diode layer.

27. The method of claim 26, further comprising embedding a topography of the patterned electrically insulating layer into the bonding layer during the bonding the first substrate stack to the second substrate stack.

28. The method of claim 27, wherein the bonding layer comprises a metal or metal alloy.

29. The method of claim 27, wherein the bonding layer comprises a polymer.

30. The method of claim 27, further comprising etching the patterned electrically insulating layer after etching of the p-n diode layer to remove the patterned electrically insulating layer from underneath a bottom surface of each of the plurality of micro p-n diodes.

* * * * *